(12) United States Patent
Goto

(10) Patent No.: US 10,694,133 B2
(45) Date of Patent: Jun. 23, 2020

(54) SOLID-STATE IMAGING DEVICE, METHOD FOR DRIVING SOLID-STATE IMAGING DEVICE, AND ELECTRONIC APPARATUS

(71) Applicant: Brillnics, Inc., Grand Cayman (KY)

(72) Inventor: Miku Goto, Tokyo (JP)

(73) Assignee: BRILLNICS, INC., Grand Cayman (KY)

( * ) Notice: Subject to any disclaimer, the term of this patent is extended or adjusted under 35 U.S.C. 154(b) by 0 days.

(21) Appl. No.: 16/526,839

(22) Filed: Jul. 30, 2019

(65) Prior Publication Data
US 2020/0036923 A1 Jan. 30, 2020

(30) Foreign Application Priority Data

Jul. 30, 2018 (JP) ................................ 2018-142377
Jun. 24, 2019 (JP) ................................ 2019-116368

(51) Int. Cl.
*H04N 5/374* (2011.01)
*H01L 27/146* (2006.01)
*H04N 5/353* (2011.01)

(52) U.S. Cl.
CPC ....... *H04N 5/374* (2013.01); *H01L 27/14609* (2013.01); *H01L 27/14643* (2013.01); *H04N 5/3532* (2013.01)

(58) Field of Classification Search
CPC .................................................... H04N 5/374
USPC .......................................................... 348/294
See application file for complete search history.

(56) References Cited

U.S. PATENT DOCUMENTS

2008/0036887 A1* 2/2008 Mizuno ............ H01L 27/14609
348/294
2012/0147231 A1* 6/2012 Inoue ................. H04N 5/23212
348/294

FOREIGN PATENT DOCUMENTS

| CN | 1798272 A | 7/2006 |
| CN | 108306502 A | 7/2018 |
| EP | 0862260 A2 | 9/1998 |
| JP | 2006319684 A | 11/2006 |

OTHER PUBLICATIONS

Aoki, et al., "A Rolling-Shutter Distortion-Free 3D Stacked Image Sensor with—160dB Parasitic Light Sensitivity In-Pixel Storage Node", IEEE International Solid-State Circuits Conference, 2013, Session 27, 27.3, pp. 482-484.
European Patent Office, Extended European Search Report issued in EP Patent Application No. 19189029.2, Apr. 17, 2020, pp. 1-20.

* cited by examiner

*Primary Examiner* — Joel W Fosselman

(57) ABSTRACT

Provided are a solid-state imaging device, a method for driving a solid-state imaging device, and an electronic apparatus capable of achieving low power consumption with a simpler circuit and a smaller area, and capable of realizing high-speed charging. A voltage supply part includes an external capacitor in which a first electrode is connected to a first node and a second electrode is connected to a second node, a first switch connected between a first power-source potential vaa and the first node, a second switch connected between a second power-source potential vgnd and the second node, and a third switch connected between the first power-source potential vaa and the second node, and the first node is connected to a first power-source voltage terminal of a row driver.

21 Claims, 37 Drawing Sheets

SOLID-STATE IMAGING DEVICE, METHOD FOR DRIVING SOLID-STATE IMAGING DEVICE, AND ELECTRONIC APPARATUS

CROSS-REFERENCE TO RELATED APPLICATIONS

This application is based on and claims the benefit of priority from Japanese Patent Application Serial Nos. 2018-142377 (filed on Jul. 30, 2018) and 2019-116368 (filed on Jun. 24, 2019), the contents of which are hereby incorporated by reference in their entirety.

TECHNICAL FIELD

The present invention relates to a solid-state imaging device, a method for driving a solid-state imaging device, and an electronic apparatus.

BACKGROUND

As a solid-state imaging device (image sensor) using a photoelectric conversion element that detects light and generates electric charge, a complementary metal oxide semiconductor (CMOS) image sensor has been put to practical use. The CMOS image sensor has been widely applied as a part of various electronic apparatuses such as a digital camera, a video camera, a surveillance camera, a medical endoscope, a personal computer (PC), a portable terminal device (mobile device) such as a mobile phone, etc.

The CMOS image sensor has a floating diffusion (FD) amplifier including a photodiode (photoelectric conversion element) and an FD for each pixel. In the readout, a column parallel output type in which one row in a pixel array is selected and simultaneously read in a column output direction is the mainstream.

FIG. 1 is a diagram illustrating a configuration example of a pixel part and a vertical scanning circuit of a general column parallel output type solid-state imaging device (CMOS image sensor).

In a solid-state imaging device 1 of FIG. 1, a pixel part 2 in which pixels PXL are arranged in a matrix, and a vertical scanning circuit (row scanning circuit) 3 for driving the pixels through a row scanning control line in a shutter row and a reading row are illustrated. FIG. 1 illustrates a pixel array of one row.

Basically, for example, for one photodiode PD, each of the pixels PXL of the pixel part 2 includes, as active elements, four elements corresponding to a transfer transistor TG-Tr as a transfer element, a reset transistor RST-Tr as a reset element, a source follower transistor SF-Tr as a source follower element (amplifying element), and a selection transistor SEL-Tr as a selection element.

The transfer transistor TG-Tr is held in a non-conductive state during a charge storage period of the photodiode PD, and is held in a conductive state by a drive control signal DTG applied to a gate through a control signal line LTG to transfer electric charge photo-electrically converted by the photodiode PD to a floating diffusion FD in a transfer duration in which stored electric charge of the photodiode PD are transferred to the floating diffusion FD.

The reset transistor RST-Tr resets a potential of the floating diffusion FD to a potential VDD of a power supply line when a drive control signal (reset signal) DRST is applied to a gate thereof through a control signal line LRST.

A gate of the source follower transistor SF-Tr is connected to the floating diffusion FD. The source follower transistor SF-Tr is connected to a vertical signal line LSGN through the select transistor SEL-Tr, and is included in a source follower and a constant current source of a load circuit outside the pixel part. Further, a drive control signal (address signal or select signal) DSEL is applied to a gate of the selection transistor SEL-Tr through the control signal line LSEL to turn on the selection transistor SEL-Tr. When the select transistor SEL-Tr is turned on, the source follower transistor SF-Tr amplifies the potential of the floating diffusion FD and outputs a voltage corresponding to the potential to the vertical signal line LSGN. A voltage output from each of the pixels PXL is output to a column parallel processing part as a pixel signal reading circuit through the vertical signal line LSGN. In column parallel processing, image data is converted, for example, from an analog signal to a digital signal and transferred to a signal processing part in a subsequent stage, where predetermined image signal processing is performed to obtain a desired image.

As illustrated in FIG. 1, a vertical scanning circuit 3 includes a row driver 31 that applies a drive control signal DTG (DRST, DSEL) at a level of a positive power-source voltage to a corresponding control signal line LTG (LRST, LSEL) upon reception of a control signal TG (RST, SEL), and a voltage supply part 32 that supplies a voltage different from a positive power-source voltage vaa, for example, a voltage higher than or equal to the positive power-source voltage vaa to a driver. The voltage supply part 32 includes an operational amplifier (Op Amp) OPA32, a capacitor bridge circuit CB32 including an internal capacitor Cbst having an internal capacitance of about 100 pF, switches SW (1 to 4), etc., and an external capacitor Cext having a capacitance of about 10 nF.

Incidentally, in the CMOS image sensor as a solid-state imaging device 10, an operation of successively scanning and reading photocharge generated and stored by the photodiode for each pixel or for each row is performed. In the case of this successive scanning, that is, when a rolling shutter is employed as an electronic shutter, it is impossible to set the same start time and end time of exposure for storing the photocharge for all pixels. For this reason, in the case of successive scanning, there is a problem that distortion occurs in a captured image when capturing a moving subject.

Therefore, in use for imaging of a subject moving at high speed which may not tolerate image distortion, or sensing that requires simultaneousness of captured images, a global shutter that executes exposure start and exposure end at the same timing for all pixels in a pixel array part is employed as the electronic shutter.

In a CMOS image sensor adopting the global shutter as the electronic shutter, for example, a signal holding part that holds a signal read from a photoelectric conversion reading part in a signal holding capacitor is provided in a pixel. In the CMOS image sensor adopting the global shutter, electric charges are stored as voltage signals from the photodiode all at once in the signal holding capacitor of the signal holding part, and then successively read to ensure simultaneousness of the entire image (for example, see J. Aoki, et al., "A Rolling-Shutter Distortion-Free 3D Stacked Image Sensor with −160 dB Parasitic Light Sensitivity In-Pixel Storage Node" ISSCC 2013/SESSION 27/IMAGE SENSORS/ 27.3.).

The vertical scanning circuit 3 including the voltage supply part 32 and the row driver 31 of the CMOS image sensor with a rolling shutter operation needs to drive only one row of a pixel array. In the conventional voltage supply part 32, the operational amplifier OPA32 is used to charge the capacitor Cbst in a chip with a desired reference voltage vref, and generate a power-source voltage corresponding to an overvoltage or undervoltage by pumping up using the power-source voltage vaa. Then, subsequently, electric charge is transferred to the external capacitor Cext a plurality of times.

However, in order to charge the internal capacitor Cbst and the external capacitor Cext within a required time, it is necessary to increase the area and power of the operational amplifier OPA32 since a large slew rate and high-speed response are required.

In addition, a booster of the vertical scanning circuit 3 of the CMOS image sensor with the global shutter operation needs to drive the entire pixel array of the pixel part 2, and thus the load capacity is significantly large. For example, the load capacity is about 1,000 times the load capacity of the rolling shutter operation. In the case of using a booster having the same configuration as that of a CMOS image sensor having a rolling shutter function, a charge up time needs to be multiplied by 1,000 times. Alternatively, the capacitance of the internal capacitor Cbst needs to be under 1,000×. Alternatively, the operating speed (charge and transfer cycle) needs to be under 1,000×.

Of these conditions, in order to satisfy the conditions of the capacity and the operating speed of the internal capacitor Cbst, the operational amplifier OPA32 needs to have a significantly large slew rate. Therefore, at present, it is significantly difficult to design a voltage supply part (booster) of the CMOS image sensor having the global shutter function on a silicon substrate.

SUMMARY

The invention provides a solid-state imaging device, a method for driving a solid-state imaging device, and an electronic apparatus capable of achieving low power consumption with a simpler circuit and a smaller area, and capable of realizing high-speed charging.

A solid-state imaging device according to a first aspect of the present invention includes: a pixel part in which a plurality of pixels are disposed in a matrix; and a reading part configured to read pixel signals from the pixel part in units of one or more rows by applying, to a control signal line, a drive control signal at a predetermined level in accordance with a control signal. The reading part includes: a driver configured to apply the drive control signal at a voltage level supplied upon reception of the control signal to the control signal line corresponding to the driver; and a voltage supply part configured to supply a voltage different from a first power-source voltage or a voltage different from a second power-source voltage to the driver. The voltage supply part includes: a first node; a second node; a capacitor including a first electrode and a second electrode, the first electrode being connected with the first node, the second electrode being connected with the second node; a first power-source potential; a second power-source potential; a first switch configured to selectively connect between the first power-source potential and the first node or the second node in accordance with a first signal; a second switch configured to selectively connect between the second power-source potential and the second node or the first node in accordance with a second signal; and at least one of a third switch and a fourth switch, the third switch being configured to selectively connect between the first power-source potential and the second node in accordance with a third signal, the fourth switch being configured to selectively connect between the second power-source potential and the first node in accordance with a fourth signal. The first node is connected with a first power-source voltage terminal of the driver when the voltage supply part includes the third switch. The second node is connected with a second power-source voltage terminal of the driver when the voltage supply part includes the fourth switch.

A method according to a second aspect of the present invention is a method for driving a solid-state imaging device including: a pixel part in which a plurality of pixels are disposed in a matrix; and a reading part configured to read pixel signals from the pixel part in units of one or more rows by applying, to a control signal line, a drive control signal at a predetermined level in accordance with a control signal. The reading part includes: a driver configured to apply the drive control signal at a voltage level supplied upon reception of the control signal to the control signal line corresponding to the driver; and a voltage supply part configured to supply a voltage different from a first power-source voltage or a voltage different from a second power-source voltage to the driver. The voltage supply part includes: a first node; a second node; a capacitor including a first electrode and a second electrode, the first electrode being connected with the first node, the second electrode being connected with the second node; a first power-source potential; a second power-source potential; a first switch configured to selectively connect between the first power-source potential and the first node or the second node in accordance with a first signal; a second switch configured to selectively connect between the second power-source potential and the second node or the first node in accordance with a second signal; and a third switch configured to selectively connect between the first power-source potential and the second node in accordance with a third signal. The first node is connected with a first power-source voltage terminal of the driver. The method includes: in a first duration, setting the potential of the first node to be the first power-source potential and setting the potential of the second node to be the second power-source potential as a reference potential, or setting the potential of the first node to be the second power-source potential as a reference potential and setting the potential of the second node to be the first power-source potential, by turning on the first and second switches through the first and second signals that are active and turning off the third switch through the third signal that is inactive; in a second duration, setting the potential of the first node to be a potential up to a potential higher than the first power-source potential and twice as high as the first power-source potential, or setting the potential of the first node to be a potential up to a potential lower than the first power-source potential by a predetermined potential, by setting the first and second signals to be inactive to turn off the first and second switches and setting the third signal to be active to turn on the third switch; and receiving, by the driver, the control signal while receiving supply of a voltage higher than the first power-source voltage generated in the second duration and applies the drive control signal at a voltage level higher than the first power-source voltage to the control signal line corresponding to the driver, or receiving, by the driver, the control signal while receiving supply of a voltage lower than the first power-source voltage generated in the second duration and applies the drive control signal at a voltage level lower than the first power-source voltage to the control signal line corresponding to the driver.

Alternatively, the method according to the second aspect of the present invention is a method for driving a solid-state imaging device including: a pixel part in which a plurality of pixels are disposed in a matrix; and a reading part configured to read pixel signals from the pixel part in units of one or more rows by applying, to a control signal line, a drive control signal at a predetermined level in accordance with a control signal. The reading part includes: a driver configured to apply the drive control signal at a voltage level supplied upon reception of the control signal to the control signal line corresponding to the driver; and a voltage supply part configured to supply a voltage different from a first power-source voltage or a voltage different from a second power-source voltage to the driver. The voltage supply part includes: a first node; a second node; a capacitor including a first electrode and a second electrode, the first electrode being connected with the first node, the second electrode being connected with the second node; a first power-source potential; a second power-source potential; a first switch configured to selectively connect between the first power-source potential and the first node or the second node in accordance with a first signal; a second switch configured to selectively connect between the second power-source potential and the second node or the first node in accordance with a second signal; and a fourth switch configured to selectively connect between the second power-source potential and the first node in accordance with a fourth signal. The second node is connected with a second power-source voltage terminal of the driver. The method includes: in a first duration, setting the potential of the first node to be the first power-source potential and setting the potential of the second node to be the second power-source potential as a reference potential, or setting the potential of the first node to be the second power-source potential as a reference potential and setting the potential of the second node to be the first power-source potential, by turning on the first and second switches through the first and second signals that are active and turning off the fourth switch through the fourth signal that is inactive; in a second duration, setting the potential of the second node to be a potential lower than the second power-source potential and up to the first power-source potential level on the negative side, or setting the potential of the second node to be a potential higher than the second power-source potential and up to a predetermined potential on the positive side, by setting the first and second signals to be inactive to turn off the first and second switches and setting the fourth signal to be active to turn on the fourth switch; receiving, by the driver, the control signal while receiving supply of a voltage lower than the second power-source voltage generated in the second duration and applies the drive control signal at a voltage level lower than the second power-source voltage to the control signal line corresponding to the driver, or receiving, by the driver, the control signal while receiving supply of a voltage higher than the second power-source voltage generated in the second duration and applies the drive control signal at a voltage level higher than the second power-source voltage to the control signal line corresponding to the driver.

An electronic apparatus according to a third aspect of the present invention includes: a solid-state imaging device; and an optical system through which an object image is formed on the solid-state imaging device. The solid-state imaging device includes: a pixel part in which a plurality of pixels are disposed in a matrix; and a reading part configured to read pixel signals from the pixel part in units of one or more rows by applying, to a control signal line, a drive control signal at a predetermined level in accordance with a control signal. The reading part includes: a driver configured to apply the drive control signal at a voltage level supplied upon reception of the control signal to the control signal line corresponding to the driver; and a voltage supply part configured to supply a voltage different from a first power-source voltage or a voltage different from a second power-source voltage to the driver. The voltage supply part includes: a first node; a second node; a capacitor including a first electrode and a second electrode, the first electrode being connected with the first node, the second electrode being connected with the second node; a first power-source potential; a second power-source potential; a first switch configured to selectively connect between the first power-source potential and the first node or the second node in accordance with a first signal; a second switch configured to selectively connect between the second power-source potential and the second node or the first node in accordance with a second signal; and at least one of a third switch and a fourth switch, the third switch being configured to selectively connect between the first power-source potential and the second node in accordance with a third signal, the fourth switch being configured to selectively connect between the second power-source potential and the first node in accordance with a fourth signal. The first node is connected with a first power-source voltage terminal of the driver when the voltage supply part includes the third switch. The second node is connected with a second power-source voltage terminal of the driver when the voltage supply part includes the fourth switch.

According to the invention, it is possible to achieve low power consumption with a simpler circuit and a smaller area, and realize high-speed charging.

DETAILED DESCRIPTION OF THE PREFERRED EMBODIMENTS

Hereinafter, embodiments of the invention will be described in association with drawings.

First Embodiment

Figure 1:
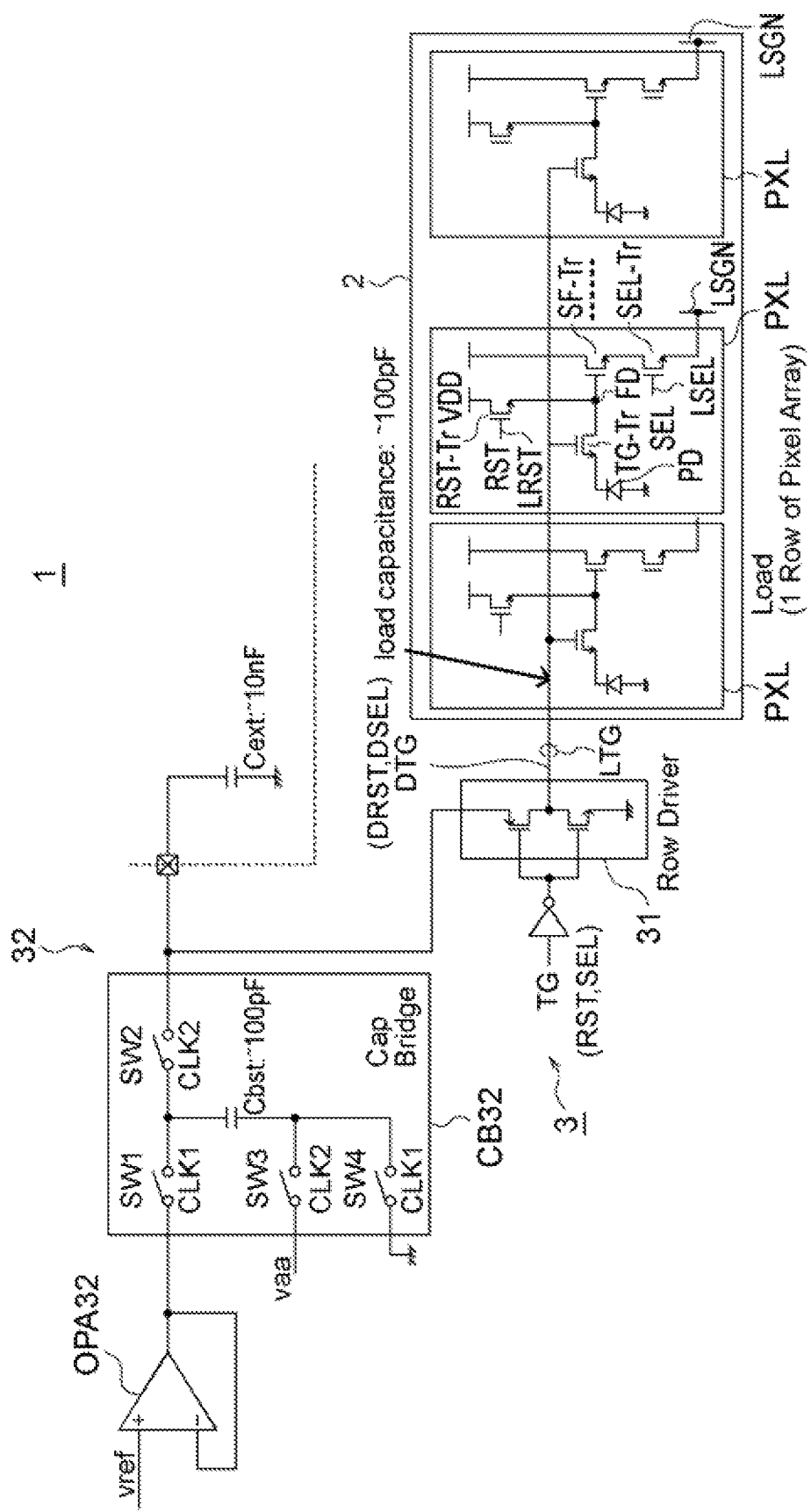
FIG. 1 is a diagram illustrating a configuration example of a pixel part and a vertical scanning circuit of a general column parallel output type solid-state imaging device (CMOS image sensor)
Figure 2:
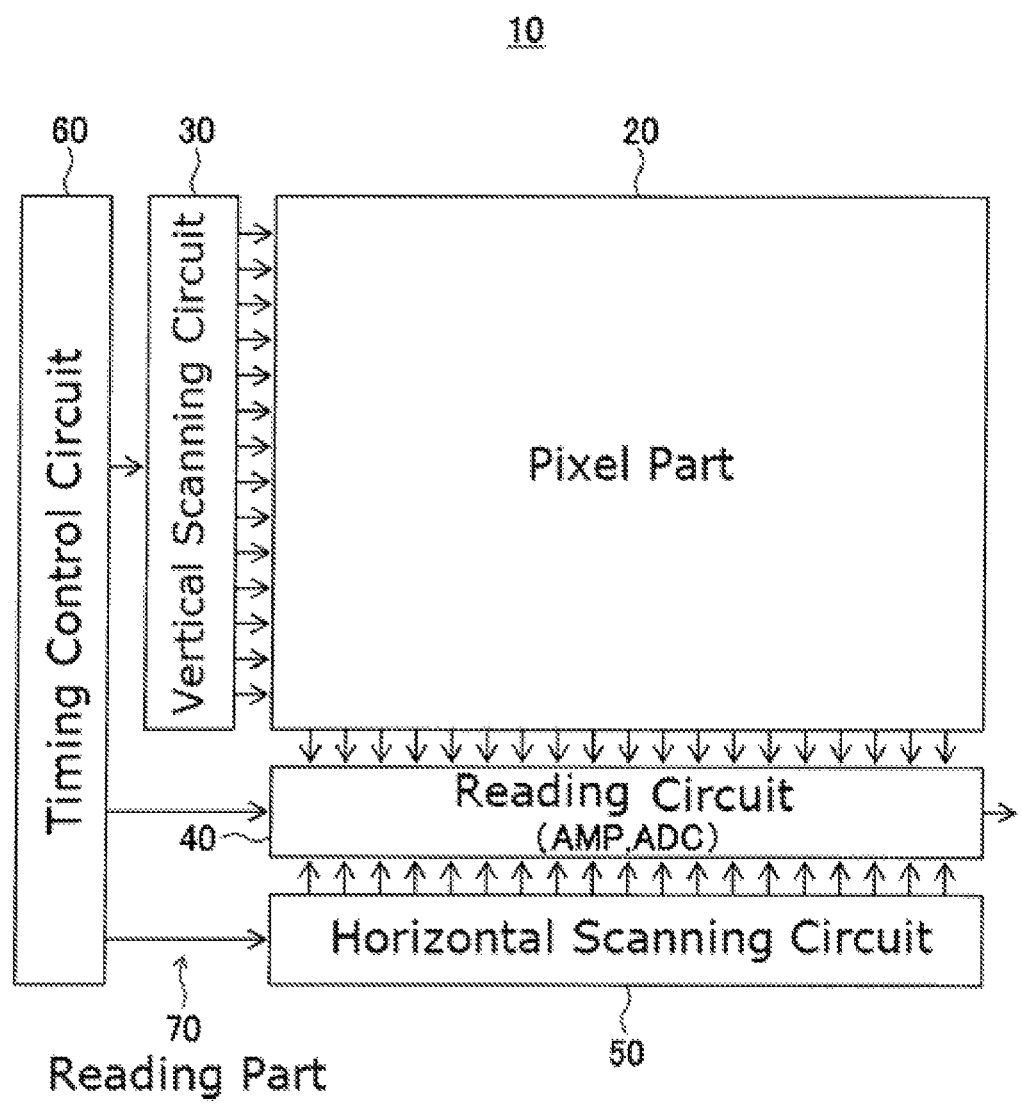
FIG. 2 is a block diagram illustrating a configuration example of a solid-state imaging device according to a first embodiment of the invention.

FIG. 2 is a block diagram illustrating a configuration example of a solid-state imaging device according to a first embodiment of the invention. In the present embodiment, for example, the solid-state imaging device 10 includes a CMOS image sensor.

As illustrated in FIG. 2, the solid-state imaging device 10 includes, as main components, a pixel part 20 as an imaging part, a vertical scanning circuit (row scanning circuit) 30, a reading circuit (column reading circuit) 40, a horizontal scanning circuit (column scanning circuit) 50, and a timing control circuit 60. Among these components, for example, the vertical scanning circuit 30, the reading circuit 40, the horizontal scanning circuit 50, and the timing control circuit 60 constitute a reading part 70 of a pixel signal.

In the first embodiment, in the solid-state imaging device 10, as described below, a voltage supply part that supplies a voltage different from a positive power-source voltage, for example, a voltage higher or lower than the positive power-source voltage (or a voltage different from a negative power-source voltage, for example, a voltage lower or higher than the negative power-source voltage) to a row driver in the vertical scanning circuit 30 basically includes a first power-source potential vaa, a second power-source potential vgnd, three switches SW, and an external capacitor Cext31 in a semiconductor substrate (chip), and is configured to be able to achieve low power consumption with a simpler circuit and a smaller area, realize high-speed charging, and be applied to a CMOS image sensor having a rolling shutter function and a global shutter function. The voltage supply part of the present embodiment basically requires only a switch of silicon and one external capacitor, does not require an internal operational amplifier for charging and discharging a capacitor, and does not require an internal capacitor that consumes area and power. A high-speed operation as an external capacitor is charged by an external power supply having significantly small output impedance, and an output voltage of the voltage supply part can be adjusted when a level determination part (voltage detection circuit) is used or when a charging time is controlled.

Hereinafter, detailed description will be given of an outline of a configuration and a function of each part of the solid-state imaging device 10, in particular, a configuration and a function of the pixel part 20 and the reading part 70 associated therewith, in particular, a configuration, a function, etc. of the row driver and the voltage supply part as a booster in the vertical scanning circuit 30, etc.

(Configuration of Pixel and Pixel Part 20)

Figure 3:
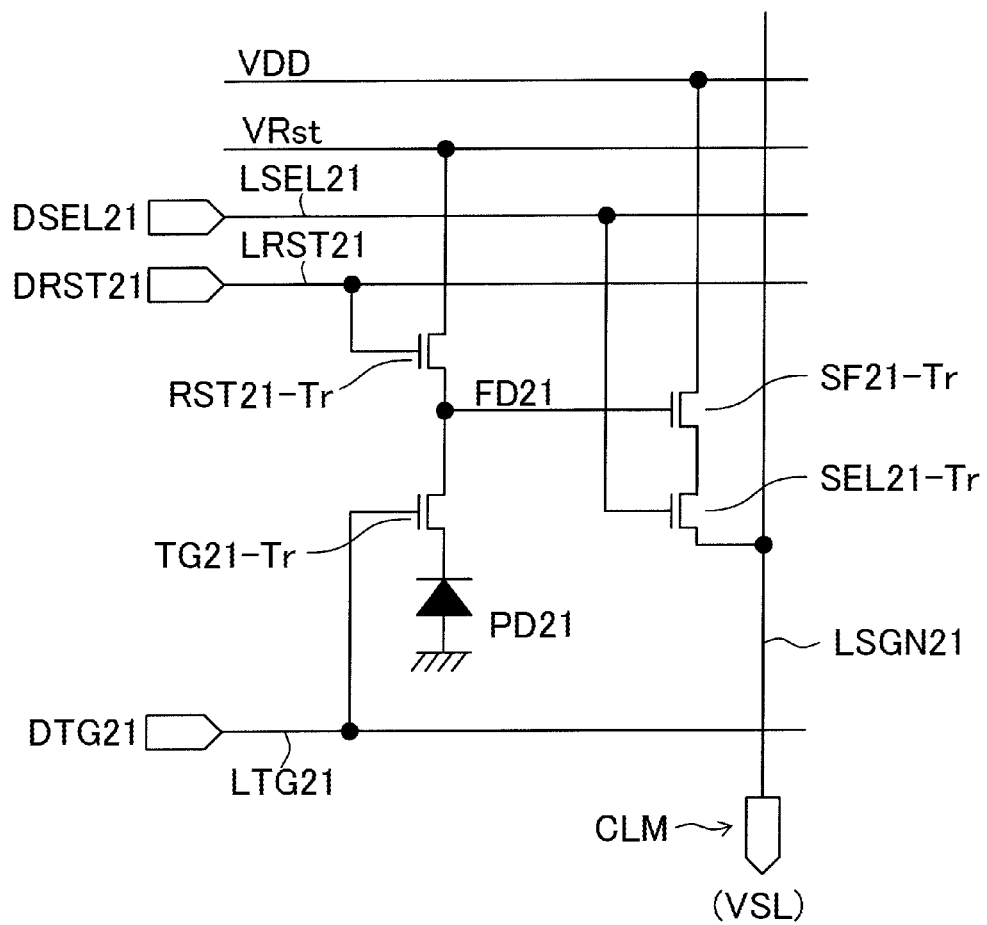
FIG. 3 is a circuit diagram illustrating a configuration example of a pixel of the solid-state imaging device according to the first embodiment of the invention.

FIG. 3 is a circuit diagram illustrating a configuration example of a pixel of the solid-state imaging device 10 according to the first embodiment of the invention.

This pixel PXL20 includes, for example, a photodiode (PD) which is a photoelectric conversion element. Further, for this photodiode PD21, one transfer transistor TG21-Tr, one reset transistor RST21-Tr, one source follower transistor SF21-Tr, and one selection transistor SEL21-Tr are included.

The photodiode PD21 generates and stores signal charges (here, electrons) whose amount corresponds to the amount of incident light. Hereinafter, a description will be given of a case in which the signal charges correspond to electrons and each transistor corresponds to an n-type transistor. However, the signal charges may correspond to holes and each transistor may correspond to a p-type transistor. In addition, the present embodiment is effective in a case in which each transistor is shared among a plurality of photodiodes, or in a case in which a three-transistor (3Tr) pixel not having a selection transistor is employed.

The transfer transistor TG21-Tr is connected between the photodiode PD21 and a floating diffusion FD21 and is controlled by a drive control signal DTG21 supplied to a gate through a drive control line LTG21. The transfer transistor TG21-Tr is selected during a period in which the drive control signal DTG21 applied to the drive control line LTG21 is at a high level (H) to become conductive, and transfers the electrons photo-electrically converted by the photodiode PD21 to the floating diffusion FD21.

The reset transistor RST21-Tr is connected between a power line VRst and the floating diffusion FD21, and is controlled by a drive control signal DRST21 supplied to a gate through the drive control line LRST21. The reset transistor RST21-Tr may be configured to be connected between a power line VDD and the floating diffusion FD21, and controlled through the drive control line LRST21. The reset transistor RST21-Tr is selected during a period in which the drive control signal DRST21 applied to the drive control line LRST21 is at the H level to become conductive, and resets the floating diffusion FD21 to a potential of the power line VRst (or VDD).

The source follower transistor SF21-Tr and the selection transistor SEL21-Tr are connected in series between the power line VDD and the vertical signal line LSGN21. The floating diffusion FD21 is connected to a gate of the source follower transistor SF21-Tr. The selection transistor SEL21-Tr is controlled by a drive control signal DSEL21 supplied to the gate through the drive control line LSEL21. The selection transistor SEL21-Tr is selected during a period in which the drive control signal DSEL21 applied to the drive control line LSEL21 is at H to become conductive. In this way, the source follower transistor SF21-Tr outputs a column output analog signal VSL according to the potential of the floating diffusion FD21 to the vertical signal line LSGN21. For example, since the respective gates of the transfer transistor TG21-Tr, the reset transistor RST21-Tr, and the selection transistor SEL21-Tr are connected row by row, these operations are simultaneously performed in parallel for each pixel of one row.

For example, since n rows×m columns of pixels PXL21 are arranged in the pixel part 20, n drive control lines LTG21, n drive control lines LRST21, n drive control lines LSEL21, and m vertical signal lines LSGN21 are present. In FIG. 2, each of the drive control lines LTG21, LRST21, and LSEL21 is indicated as one row scanning drive control line.

The vertical scanning circuit 30 drives the pixels through the row scanning drive control line in the shutter row and the reading row in accordance with control of the timing control circuit 60. In addition, according to an address signal, the vertical scanning circuit 30 outputs row selection signals of row addresses of a read row for reading a signal and a shutter row for resetting the electric charges stored in the photodiode PD21. Specific configurations and functions of the row driver and the voltage supply part of the vertical scanning circuit 30 will be described later.

The reading circuit 40 includes a plurality of column signal processing circuits (not illustrated) arranged corresponding to respective column outputs of the pixel part 20, and is configured such that column parallel processing can be performed by the plurality of column signal processing circuits.

The reading circuit 40 can include a correlated double sampling (CDS) circuit, an analog digital (AD) converter (ADC), an amplifier (AMP), a sample/hold (S/H) circuit, etc.

Figure 4A:
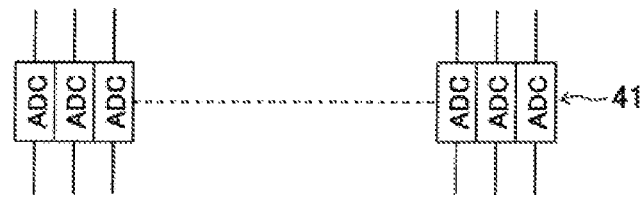
FIG. 4A to FIG. 4C are diagrams for description of a configuration example of a reading system of a column output of the pixel part in the solid-state imaging device according to the embodiment of the invention.
Figure 4B:
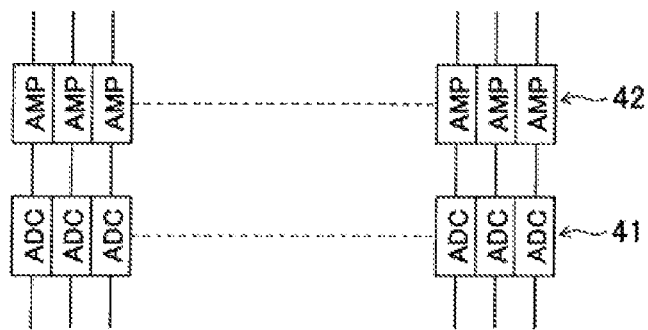
Figure 4C:
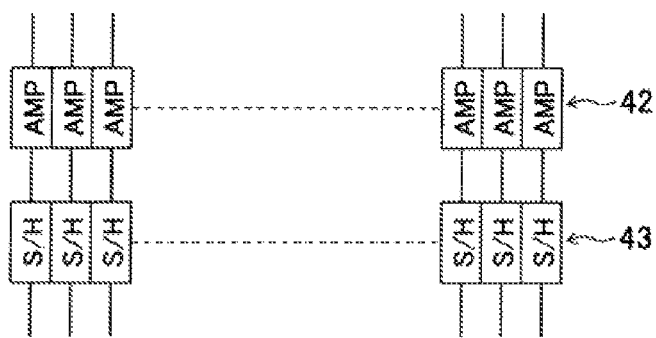

As described above, for example, as illustrated in FIG. 4A, the reading circuit 40 may include an ADC 41 that converts each column output analog signal VSL of the pixel part 20 into a digital signal. Alternatively, in the reading circuit 40, for example, as illustrated in FIG. 4B, an amplifier (AMP) 42 for amplifying each column output analog signal VSL of the pixel part 20 may be disposed. In addition, in the reading circuit 40, for example, as illustrated in FIG. 4C, a sample/hold (S/H) circuit 43 that samples and holds each column output analog signal VSL of the pixel part 20 may be disposed. In addition, in the reading circuit 40, a static random access memory (SRAM) as a column memory that stores a signal obtained by performing predetermined processing on a pixel signal output from each column of the pixel part 20 may be disposed.

The horizontal scanning circuit 50 scans signals processed by the plurality of column signal processing circuits such as the ADC of the reading circuit 40, etc., transfers the signals in a horizontal direction, and outputs the signals to the reading part 70.

The timing control circuit 60 generates timing signals necessary for signal processing of the pixel part 20, the vertical scanning circuit 30, the reading circuit 40, the horizontal scanning circuit 50, etc.

In the first embodiment, the reading part 70 controls the vertical scanning circuit 30, etc. in a rolling shutter mode or a global shutter mode to apply the drive control signal DTG21 (DRST21, DSEL21) at a predetermined level in accordance with a control signal TG21 (RST21, SEL21) to a predetermined drive control line LTG21 (LRST21, LSEL21), thereby reading pixel signals from the pixel part 20 in units of one or more rows (all rows in the global shutter mode).

(Specific Configurations and Functions of Row Driver and Voltage Supply Part of Vertical Scanning Circuit 30)

Hereinafter, a specific description will be given of characteristic configurations and functions of the driver and the voltage supply part of the vertical scanning circuit 30 in the solid-state imaging device 10 of the first embodiment.

Figure 5:
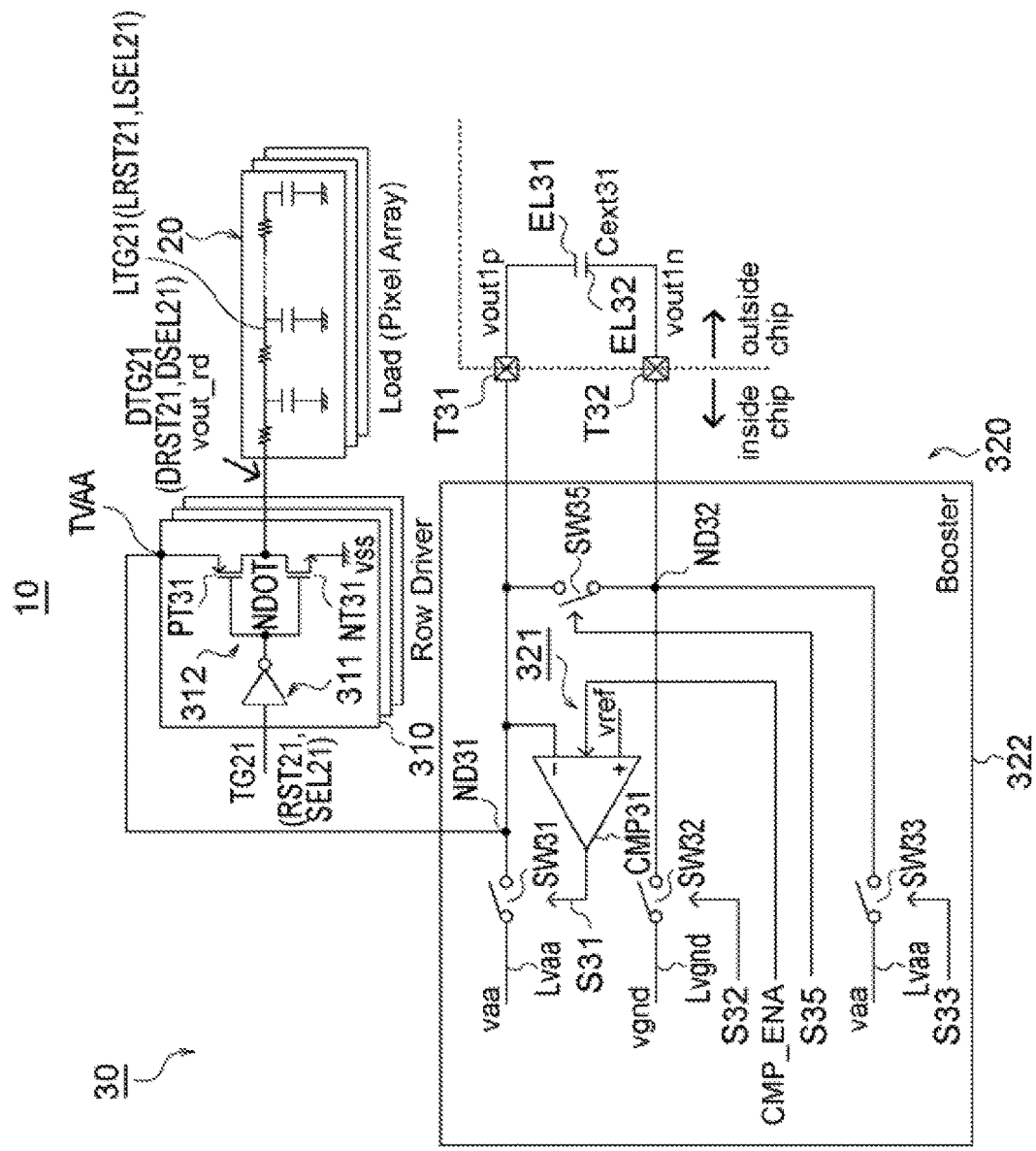
FIG. 5 is a circuit diagram illustrating a specific configuration example of a driver and a voltage supply part of the vertical scanning circuit in the solid-state imaging device according to the first embodiment of the invention.

FIG. 5 is a circuit diagram illustrating a specific configuration example of the driver and the voltage supply part of the vertical scanning circuit 30 in the solid-state imaging device 10 according to the first embodiment of the invention.

As illustrated in FIG. 5, the vertical scanning circuit 30 includes a plurality of row drivers 310 and a voltage supply part 320.

Each of the row drivers 310 applies a voltage different from the first power-source voltage (positive power-source voltage) vaa supplied from the voltage supply part 320, for example, a voltage higher than the positive power-source voltage vaa, for example, the drive control signal DTG21 (DRST21, DSEL21) at a level of (vaa+vref) to the corresponding drive control line LTG21 (LRST21, LSEL21) upon reception of the control signal TG21 (RST21, SEL21).

In the row driver 310 of FIG. 5, two inverters 311 and 312 are connected in series to an input line of the control signal TG21 (RST21, SEL21), and a first power-source voltage terminal TVAA is connected to a voltage supply line of the voltage supply part 320 (first node ND31). For example, the two inverters 311 and 312 are configured by CMOS inverters (in FIG. 5, a latter stage side is illustrated by a specific circuit).

In the CMOS inverter 312, a p-channel MOS (PMOS) transistor PT31 and an n-channel MOS (NMOS) transistor NT31 are connected in series between the first power-source voltage terminal TVAA and a reference potential VSS (for example, a ground potential GND). Specifically, a source of the PMOS transistor PT31 is connected to the first power-source voltage terminal TVAA, and a source of the NMOS transistor NT31 is connected to the reference potential VSS. Further, a drain of the PMOS transistor PT31 and a drain of the NMOS transistor NT31 are connected to form an output node NDOT, and the output node NDOT is connected to the corresponding drive control line LTG21 (LRST21, LSEL21). An input node is formed by a gate of the PMOS transistor PT31 and a gate of the NMOS transistor NT31, and is connected to an output terminal of the inverter 311 in a former stage element.

The voltage supply part 320 generates a voltage higher than the first power-source voltage (positive power-source voltage) vaa, for example, (vaa+vref), and supplies the voltage to the row driver 310.

The voltage supply part 320 includes the first node ND31, a second node ND32, and the external capacitor Cext31 in which a first electrode EL31 is connected to the first node ND31 via a first connection terminal T31 and a second electrode EL32 is connected to the second node ND32 via a second connection terminal T32. The voltage supply part 320 includes a first power-source potential line Lvaa of the first power-source potential (positive power-source potential) vaa, a second power-source potential line Lvgnd of the second power-source potential (negative power-source potential) vgnd, a first switch SW31, a second switch SW32, a third switch SW33, a fifth switch SW35, and a level determination part 321.

The first switch SW31 is formed of, for example, an NMOS transistor, and selectively connects between the first power-source potential line Lvaa and the first node ND31 in accordance with a first signal S31. The second switch SW32 is formed of, for example, an NMOS transistor, and selectively connects between the second power-source potential line Lvgnd and the second node ND32 in accordance with a second signal S32. The third switch SW33 is formed of, for example, an NMOS transistor, and selectively connects between the first power-source potential line Lvaa and the second node ND32 in accordance with a third signal S33. As described above, in the voltage supply part 320 including the third switch SW33, the first node ND31 is connected to the first power-source voltage terminal TVAA of the row driver 310. Further, the fifth switch SW35 is formed of, for example, an NMOS transistor, and selectively connects between the first node ND31 and the second node ND32 in accordance with a fifth signal S35.

In the case of determining that a potential level VND31 of the first node ND31 is lower than a reference voltage vref set arbitrarily, the level determination part 321 outputs the first signal S31 that is active, for example, at the high (H) level to the first switch SW31 to turn on the first switch SW31. In the case of determining that the potential level VND31 of the first node ND31 has reached the reference voltage vref, the level determination part 321 outputs the first signal S31 that is inactive, in this example, at the low level to the first switch SW31 to turn off the first switch SW31.

The level determination part 321 of the first embodiment includes a comparator CMP31 whose non-inverted input (+) is connected to a supply line of the reference voltage vref and whose inverted input terminal (−) is connected to the first node ND31.

The comparator CMP31 compares the potential level VND31 of the first node ND31 with the reference voltage vref, and outputs the first signal S31 at the active H level to the first switch SW31 to turn on the first switch SW31 when the potential level VND31 of the first node ND31 is lower than the reference voltage vref. In a case in which the potential level VND31 of the first node ND31 has reached the reference voltage vref, the comparator CMP31 outputs the first signal S31 at the inactive L level to the first switch SW31 to turn off the first switch SW31.

Further, in the first embodiment, when an enable signal CMP_ENA is at the active H level, the comparator CMP31 as the level determination part 321 is in an operational state and performs level determination processing.

In the voltage supply part 320 having the above-mentioned configuration, a booster 322 includes the first node ND31, the second node ND32, the first power-source potential line Lvaa of the first power-source potential (positive power-source potential) vaa, the second power-source potential line Lvgnd of the second power-source potential (negative power-source potential) vgnd, the first switch SW31, the second switch SW32, the third switch SW33, the fifth switch SW35, and the comparator CMP31 as the level determination part 321 except for the external capacitor Cext31.

At the time of generating a voltage (vaa+vref) higher than the positive power-source voltage supplied to the row driver 310, the voltage supply part 320 in the first embodiment generates the voltage (vaa+vref) higher than the positive power-source voltage vaa at a desired level and supplies the generated voltage to the row driver 310 through the reset duration PRST, the first duration PFST, and the second duration PSCD.

When the reference voltage vref changes, the potential level VND31 (vaa+vref) of the first node ND31 can be adjusted.

(Operation such as Voltage Generation of Vertical Scanning Circuit 30)

The characteristic configurations and functions of the row driver 310 and the voltage supply part 320 of the vertical scanning circuit 30 of the solid-state imaging device 10 have been described above. Next, a description will be given of a voltage generation operation, etc. of the voltage supply part 320 and the row driver 310 in the vertical scanning circuit 30 of the solid-state imaging device 10 according to the first embodiment. Here, to facilitate understanding, a case in which the transfer transistor TG21-Tr of the pixel PXL20 is driven to read the pixel will be described as an example.

Figure 6:
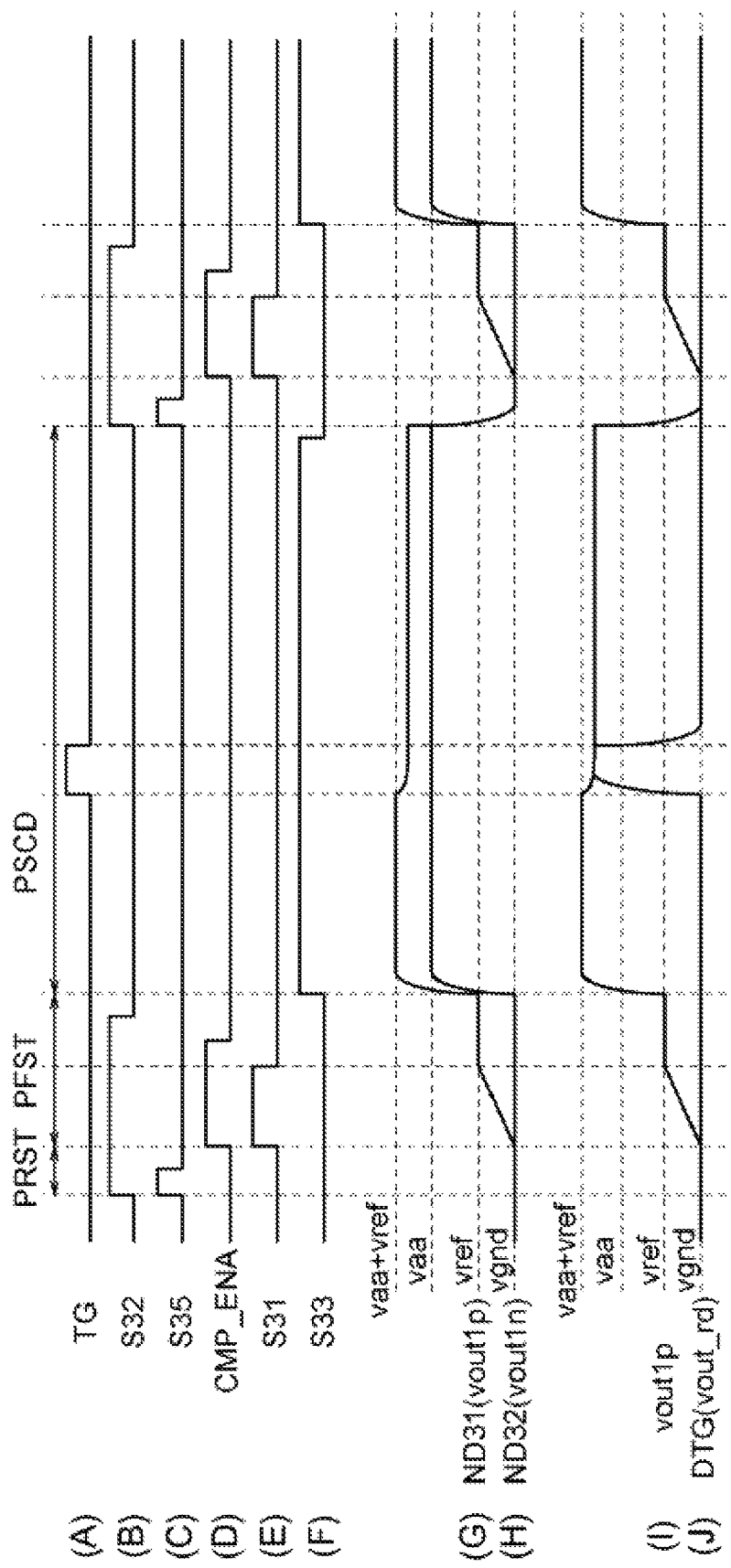
FIG. 6 is a timing chart of a voltage generation operation, etc. of the voltage supply part and the row driver in the vertical scanning circuit of the solid-state imaging device according to the first embodiment.

FIG. 6 is a timing chart of the voltage generation operation, etc. of the voltage supply part 320 and the row driver 310 in the vertical scanning circuit 30 of the solid-state imaging device 10 according to the first embodiment.

Line (A) of FIG. 6 illustrates a control signal TG of the transfer transistor TG21-Tr of the pixel PXL20. Line (B) of FIG. 6 illustrates the second signal S32 for turning on and off the second switch SW32 of the voltage supply part 320. Line (C) of FIG. 6 illustrates the fifth signal S35 for turning on and off the fifth switch SW35 of the voltage supply part 320. Line (D) of FIG. 6 illustrates the enable signal CMP_ENA for the comparator CMP31 of the voltage supply part 320. Line (E) of FIG. 6 illustrates the first signal S31 for turning on and off the first switch SW31 of the voltage supply part 320. Line (F) of FIG. 6 illustrates the third signal S33 for turning on and off the third switch SW33 of the voltage supply part 320. Line (G) of FIG. 6 illustrates level transition of the first node ND31 of the voltage supply part 320. Line (H) of FIG. 6 illustrates level transition of the second node ND32 of the voltage supply part 320. Line (I) of FIG. 6 illustrates level transition of the first node ND31 of the voltage supply part 320. Line (J) of FIG. 6 illustrates a drive control signal DTG applied from the row driver 310 of the voltage supply part 320 to the drive control line LTG21.

(Operation in Reset Duration PRST)

In the voltage supply part 320, the reset duration PRST is set before the first duration PFST for generating a voltage. In the reset duration PRST, the enable signal CMP_ENA is set to the inactive L level and the comparator CMP31 is held in the non-operational state. Since the comparator CMP31 is in the non-operational state, the first signal S31 corresponding to an output thereof is held at the inactive L level, and the first switch SW31 is held in the off state accordingly. In addition, in the reset duration PRST, the third signal S33 is set to the inactive L level, and the third switch SW33 is held in the off state.

In this way, in the reset duration PRST, in a state in which the first switch SW31 and the third switch SW33 are turned off, the second signal S32 is set to the active H level, the second switch SW32 is held in the on state, and the second node ND32 is connected to the power-source potential line Lvgnd. At the same time, the fifth signal S35 is set to the active H level, the fifth switch SW35 is held in the on state, and the first node ND31 and the second node ND32 are connected. In this way, the first node ND31 and the second node ND32 are set to the second power-source potential vgnd and reset (discharged).

In the reset duration PRST, when the first node ND31 and the second node ND32 are reset to the second power-source potential vgnd, the fifth signal S35 is set to the inactive L level, the fifth switch SW35 is switched to the off state, and the first node ND31 and the second node ND32 are disconnected Even when the reset duration PRST ends, the second signal S32 is held at the active H level until immediately before the end of the subsequent first duration PFST. Accordingly, the second switch SW32 is held in the on state immediately before the start of the second duration PSCD, and is held in a state where the second node ND32 is connected to the second power-source potential line Lvgnd Therefore, the second node ND32 is held at the second power-source potential vgnd until immediately before the second duration PSCD is started.

(Operation in First Duration PFST)

When processing of the reset duration PRST ends, processing in the first duration PFST is subsequently performed. In the first duration PFST, the enable signal CMP_ENA is switched to the active H level, and the comparator CMP31 is switched to the operational state. When the comparator CMP31 is switched to the operational state, comparison processing of the potential level VND31 of the first node ND31 and the reference voltage vref is started. At the start of comparison, since the potential level VND31 of the first node ND31 is lower than the reference voltage vref, the first signal S31 at the active H level is output to the first switch SW31 to turn on the first switch SW31.

As the first switch SW31 is switched to the on state, the first node ND31 is connected to the first power-source potential line Lvaa, the first node ND31 is charged, and the potential level VND31 thereof rises from the second power-source potential vgnd to the reference voltage vref. When the potential level VND31 of the first node ND31 rises and reaches the reference voltage vref, the comparator CMP31 detects that the potential level VND31 of the first node ND31 has reached the reference voltage vref, the first signal S31 is switched to the inactive L level and output to the first switch SW31, and the first switch SW31 is turned off. In this way, the first node ND31 is disconnected from the first power-source potential line Lvaa.

Subsequently, in the first duration PFST, the enable signal CMP_ENA is set to the inactive L level, and the comparator CMP31 is switched to the non-operational state. Subsequently, the second signal S32 is switched to the L level, the second switch SW32 is switched to the off state, and the second node ND32 is disconnected from the second power-source potential line Lvgnd.

(Operation in Second Duration PSCD)

When processing in the first duration PFST ends, processing in the second duration PSCD is subsequently performed. In the second duration PSCD, while the first signal S31 and the second signal S32 are set to the inactive L level to turn off the first switch SW31 and the second switch SW32, the third signal S33 is switched to the active H level. In this way, the third switch SW33 is turned on, the second node ND32 is connected to the first power-source potential line Lvaa, and the first node ND31 is boosted to a potential (vaa+vref) by capacitive coupling of the external capacitor Cext31. The boosted voltage (vaa+vref) is supplied from the first node ND31 to the first power-source voltage terminal TVAA of the row driver 310 as a voltage to be supplied higher than the positive power-source voltage (first power-source voltage).

In the row driver 310, upon reception of the control signal TG21, the drive control signal DTG21 at a level of the voltage (vaa+vref) higher than the first power-source voltage (positive power-source voltage) vaa supplied from the voltage supply part 320 is applied to the corresponding drive control line LTG21.

Electric charges of the external capacitor Cext31 are divided by the capacitor Cext31 and the load capacity of the pixel array of the pixel part 20, and a voltage of the drive control signal DTG21 (vout1$p$) becomes slightly lower than the boosted voltage (vaa+vref).

As described above, according to the first embodiment, the vertical scanning circuit 30 includes the voltage supply part 320 that generates the voltage different from the first power-source voltage (positive power-source voltage) vaa, for example, the voltage higher than the positive power-source voltage vaa (for example, vaa+vref) and supplies the generated voltage to the row driver 310. Further, the voltage supply part 320 includes the external capacitor Cext31 in which the first node ND31, the second node ND32, and the first electrode EL31 are connected to the first node ND31 via the first connection terminal T31, and the second electrode EL32 is connected to the second node ND32 via the second connection terminal T32. Furthermore, the voltage supply part 320 includes the first power-source potential line Lvaa of the first power-source potential (positive power-source potential) vaa, the second power-source potential line Lvgnd of the second power-source potential (negative power-source potential) vgnd, the first switch SW31, the second switch SW32, the third switch SW33, the fifth switch SW35, and the comparator CMP31 as the level determination part 321. The comparator CMP31 compares the potential level VND31 of the first node ND31 with the reference voltage vref, outputs the first signal S31 at the active H level to the first switch SW31 to turn on the first switch SW31 when the potential level VND31 of the first node ND31 is lower than the reference voltage vref, and outputs the first signal S31 at the inactive L level to the first switch SW31 to turn off the first switch SW31 when the potential level VND31 of the first node ND31 reaches the reference voltage vref.

That is, the voltage supply part 320 that supplies a voltage higher or lower than the positive power-source voltage (or a voltage lower than the negative power-source voltage) to the row driver in the vertical scanning circuit 30 of the first embodiment basically includes the first power-source potential vaa, the second power-source potential vgnd, the three switches SW31, SW32, and SW33, and the external capacitor Cext31 in the semiconductor substrate (chip), can achieve low power consumption with a simpler circuit and a smaller area, can realize high-speed charging, and can be applied to the CMOS image sensor having the rolling shutter function and the global shutter function. The voltage supply part of the first embodiment basically requires only a switch of silicon and one external capacitor, does not require an internal operational amplifier for charging and discharging a capacitor, and does not require an internal capacitor that consumes area and power. A high-speed operation as an external capacitor is charged by an external power supply having significantly small output impedance, and an output voltage of the voltage supply part can be adjusted when the comparator CMP31 corresponding to the level determination part (voltage detection circuit) is used or when a charging time is controlled.

Second Embodiment

Figure 7:
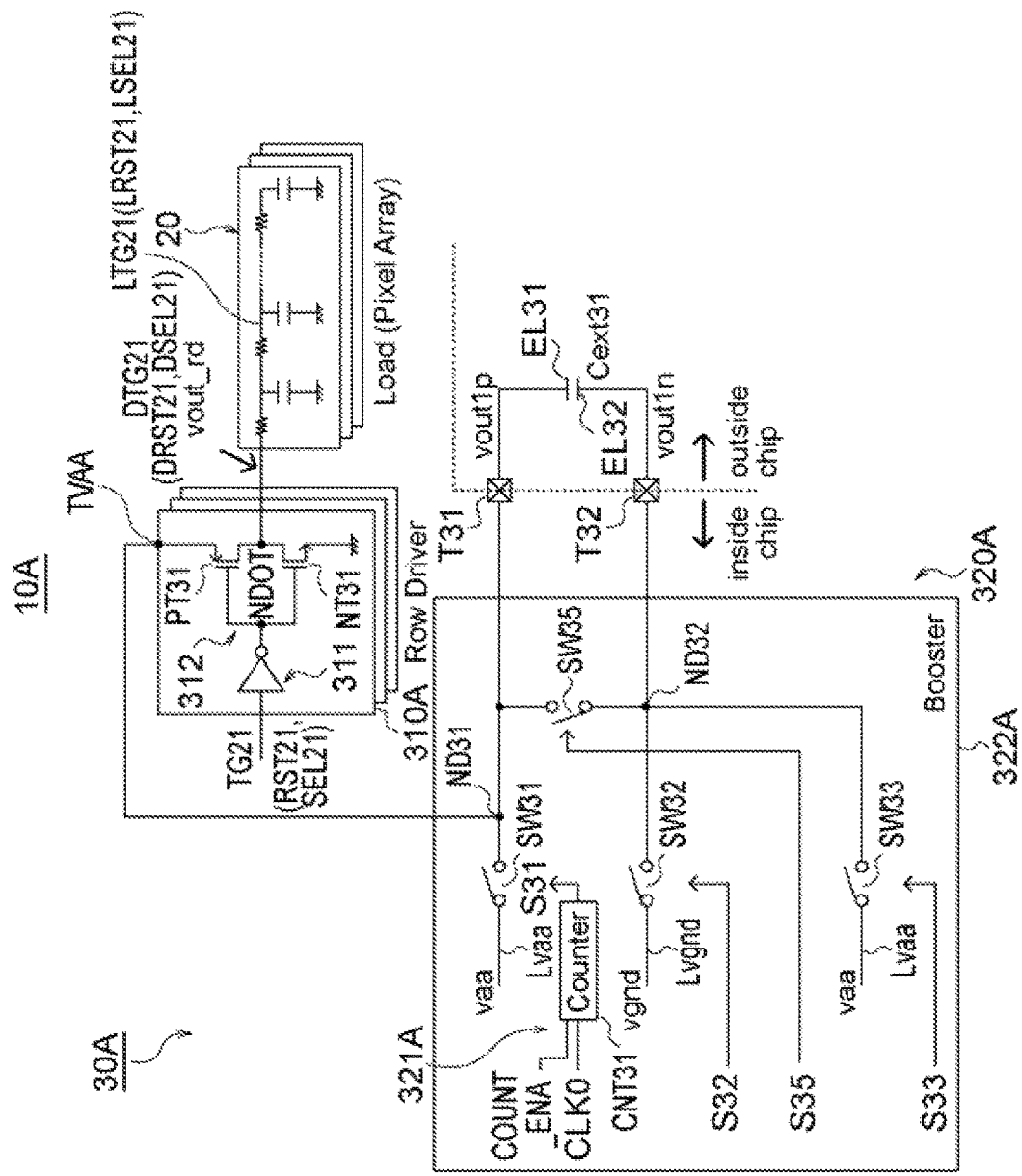
FIG. 7 is a diagram illustrating a configuration example of a pixel part and a vertical scanning circuit of a solid-state imaging device according to a second embodiment of the invention.
Figure 8:
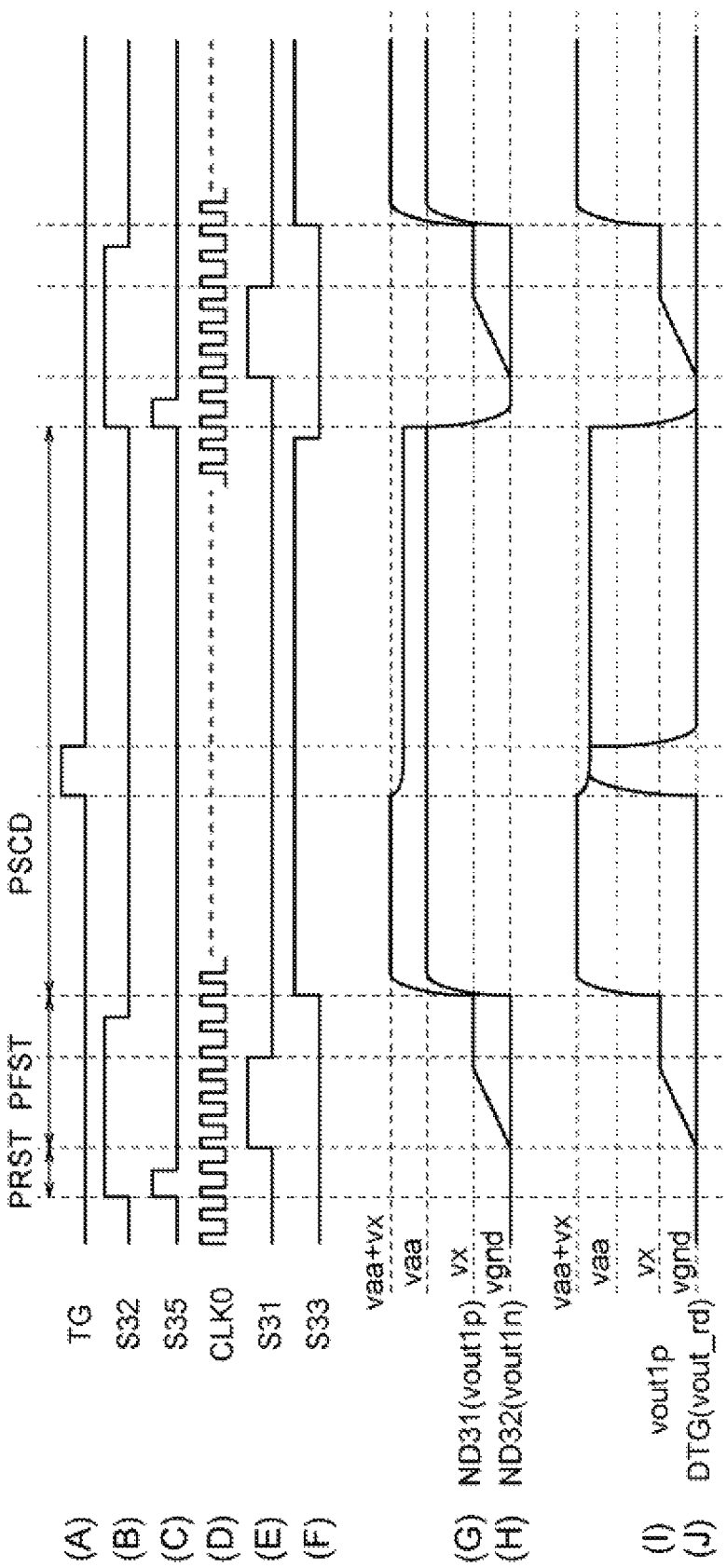
FIG. 8 is a timing chart of a voltage generation operation, etc. of a voltage supply part and a row driver in the vertical scanning circuit of the solid-state imaging device according to the second embodiment.

FIG. 7 is a diagram illustrating a configuration example of a pixel part and a vertical scanning circuit of a solid-state imaging device according to a second embodiment of the invention. FIG. 8 is a timing chart of a voltage generation operation, etc. of a voltage supply part 320A and a row driver 310A in the vertical scanning circuit 30A of the solid-state imaging device 10A according to the second embodiment.

A difference between the solid-state imaging device 10A according to the second embodiment and the solid-state imaging device 10 according to the first embodiment described above is as follows. In the solid-state imaging device 10A according to the second embodiment, a level determination part 321A includes a counter CNT31 instead of the comparator.

Upon reception of an enable signal COUN_TENA at the active H level, the counter CNT31 counts a clock CLK0 in an operational state (enabled state), and outputs the first signal S31 at the active H level to the switch SW31 to turn off the switch SW31 when a count value is a target value, which is a value (<vx) corresponding to a case in which the potential level VND31 of the first node ND31 is lower than the reference voltage vref (does not reach the reference voltage) in this example. Upon reaching a value (vx) corresponding to a case in which the potential level VND31 of the first node ND31 reaches the reference voltage vref, the counter CNT31 outputs the first signal S31 at the inactive L level to the switch SW31 to turn off the switch SW31.

In the case of the second embodiment, also, in the second duration PSCD, while the first signal S31 and the second signal S32 are set to the inactive L level to turn off the first switch SW31 and the second switch SW32, the third signal S33 is switched to the active H level. In this way, the third switch SW33 is turned on, the second node ND32 is connected to the first power-source potential line Lvaa, and the first node ND31 is boosted to a potential (vaa+vx (for example, vref)) by capacitive coupling of the external capacitor Cext31. The boosted voltage (vaa+vx (vref)) is supplied from the first node ND31 to a first power-source voltage terminal TVAA of the row driver 310A as a voltage to be supplied higher than the positive power-source voltage (first power-source voltage).

In the row driver 310A, upon reception of the control signal TG21, the drive control signal DTG21 at a level of the voltage (vaa+vx) higher than the first power-source voltage (positive power-source voltage) vaa supplied from the voltage supply part 320 is applied to the corresponding drive control line LTG21.

In the second embodiment, when the count value, that is, the number of clocks CLK0 changes, the potential level VND31 (vaa+vx) of the first node ND31 can be adjusted.

The other configurations are similar to those of the first embodiment. According to the second embodiment, a similar effect to that of the first embodiment described above can be obtained.

Third Embodiment

Figure 9:
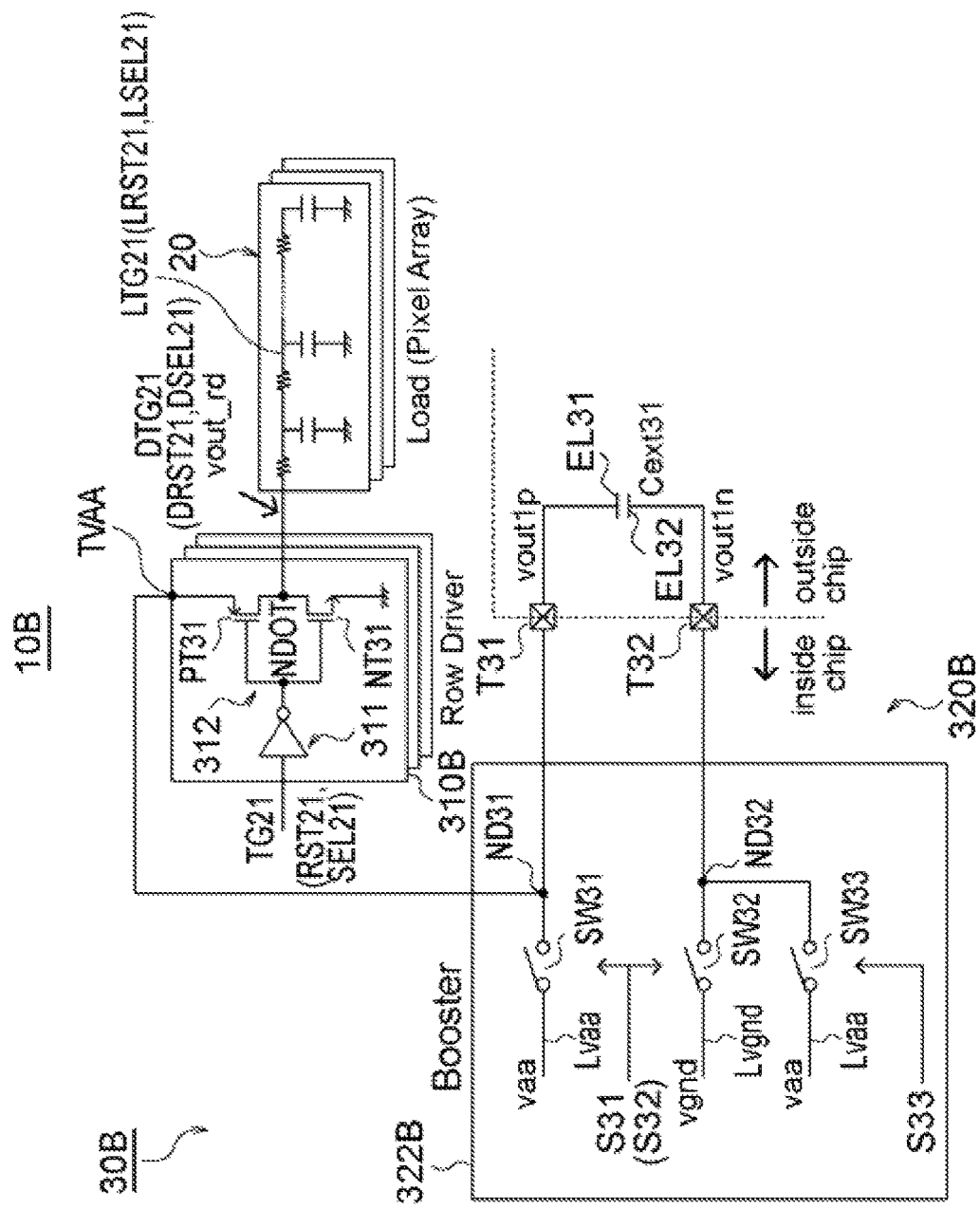
FIG. 9 is a diagram illustrating a configuration example of a pixel part and a vertical scanning circuit of a solid-state imaging device according to a third embodiment of the invention.
Figure 10:
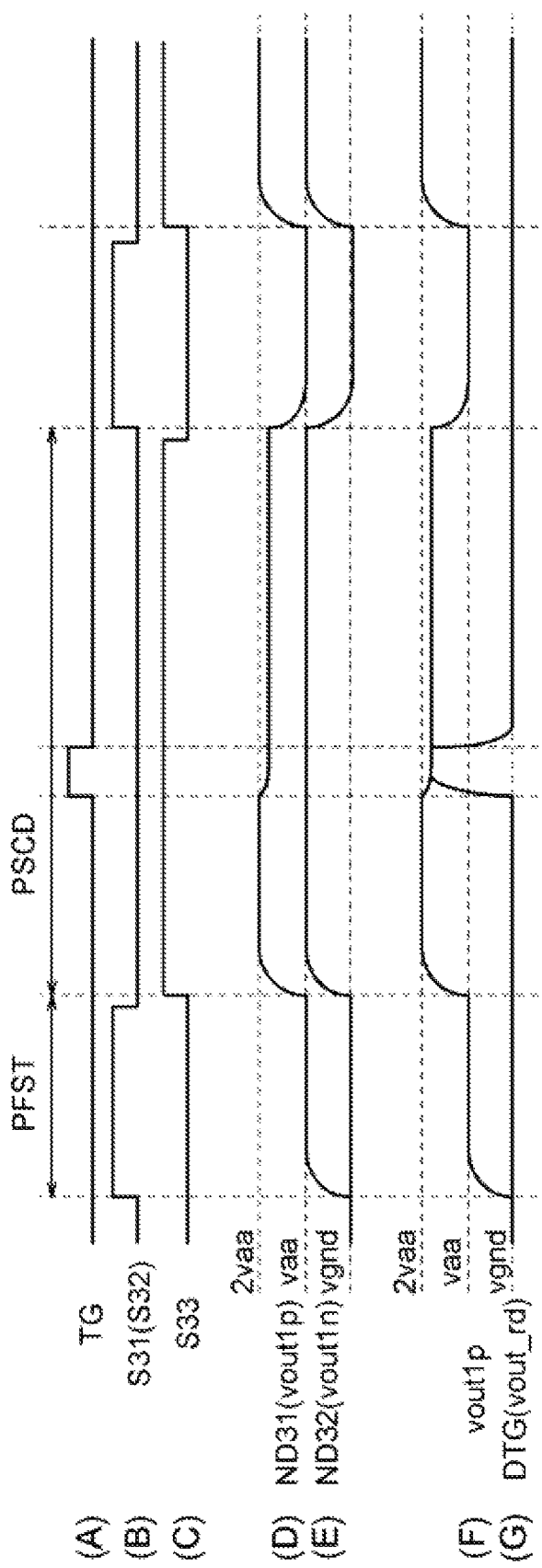
FIG. 10 is a timing chart of a voltage generation operation, etc. of a voltage supply part and a row driver in the vertical scanning circuit of the solid-state imaging device according to the third embodiment.

FIG. 9 is a diagram illustrating a configuration example of a pixel part and a vertical scanning circuit of a solid-state imaging device according to a third embodiment of the invention. FIG. 10 is a timing chart of a voltage generation operation, etc. of a voltage supply part 320B and a row driver 310B in the vertical scanning circuit 30B of the solid-state imaging device 10B according to the third embodiment.

A difference between the solid-state imaging device 10B according to the third embodiment and the solid-state imaging devices 10 and 10A according to the first and second embodiments described above is as follows. In the solid-state imaging device 10B according to the third embodiment, the level determination parts 321 and 321A and the fifth switch SW35 are not provided, and the voltage supplied to the row driver 310B is boosted up to 2vaa, which is twice the first power-source voltage vaa.

In the solid-state imaging device 10B according to the third embodiment, processing in the reset duration is not performed, and a boosting operation is performed in processing in the first duration PFST and the second duration PSCD. In this example, the first signal S31 and the second signal S32 are shared by the first switch SW31 and the second switch SW32, and the shared signal and the third signal S33 for the third switch SW33 are in reverse phase.

As the first signal S31 is switched to the H level and the first switch SW31 is switched to the on state, the first node ND31 is connected to the first power-source potential line Lvaa and is at a positive power-source voltage vaa level, and the second node ND32 is connected to the second power-source potential line Lvgnd and is at a negative power-source voltage vgnd level. Subsequently, the first signal S31 is switched to the inactive L level, and the third signal S33 is switched to the active H level. In this way, the second node ND32 is at the positive power-source voltage vaa level, and the first node ND31 is boosted up to a voltage (2 vaa) level, which is twice the power-source voltage vaa. The boosted voltage (2 vaa) is supplied from the first node ND31 to the first power-source voltage terminal TVAA of the row driver 310B as a voltage to be supplied higher than the positive power-source voltage (first power-source voltage).

In the row driver 310B, upon reception of the control signal TG21, the drive control signal DTG21 at a level of a voltage (2 vaa) higher than the first power-source voltage (positive power-source voltage) vaa supplied from the voltage supply part 320B is applied to the corresponding drive control line LTG21.

In the solid-state imaging device 10B according to the third embodiment, electric charges of the external capacitor Cext31 are divided by the capacitor Cext31 and the load capacity of the pixel array of the pixel part 20, and a voltage of the drive control signal DTG21 (vout1p) becomes slightly lower than the boosted voltage (2 vaa).

According to the third embodiment, the voltage supply part 320B basically includes the first power-source potential Vaa, the second power-source potential Vgnd, the three switches SW31, SW32, and SW33, and the external capacitor Cext31 in the semiconductor substrate (chip), can achieve low power consumption with a simpler circuit and a smaller area, can realize high-speed charging, and can be applied to the CMOS image sensor having the rolling shutter function and the global shutter function.

Fourth Embodiment

Figure 11:
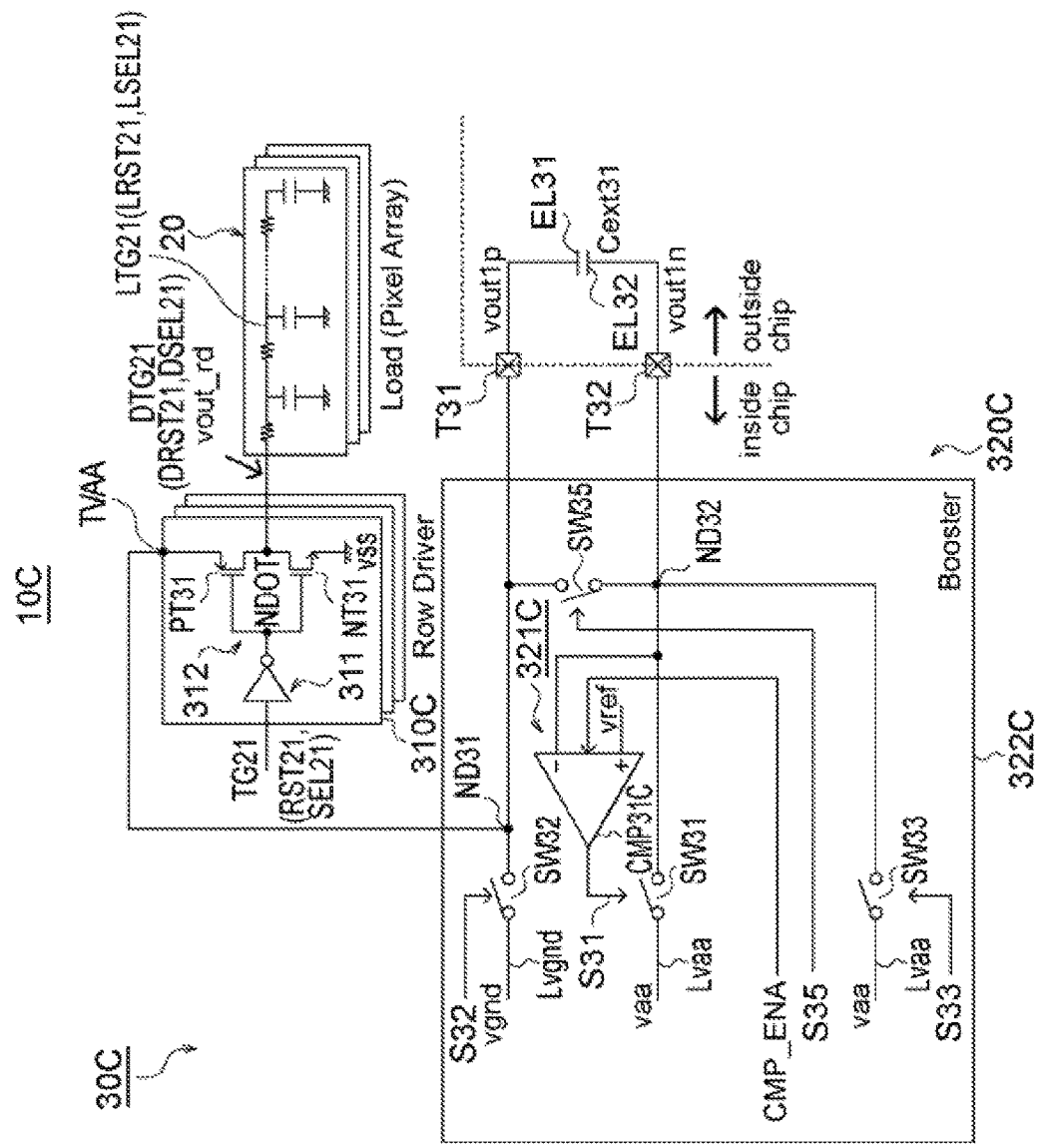
FIG. 11 is a diagram illustrating a configuration example of a pixel part and a vertical scanning circuit of a solid-state imaging device according to a fourth embodiment of the invention.
Figure 12:
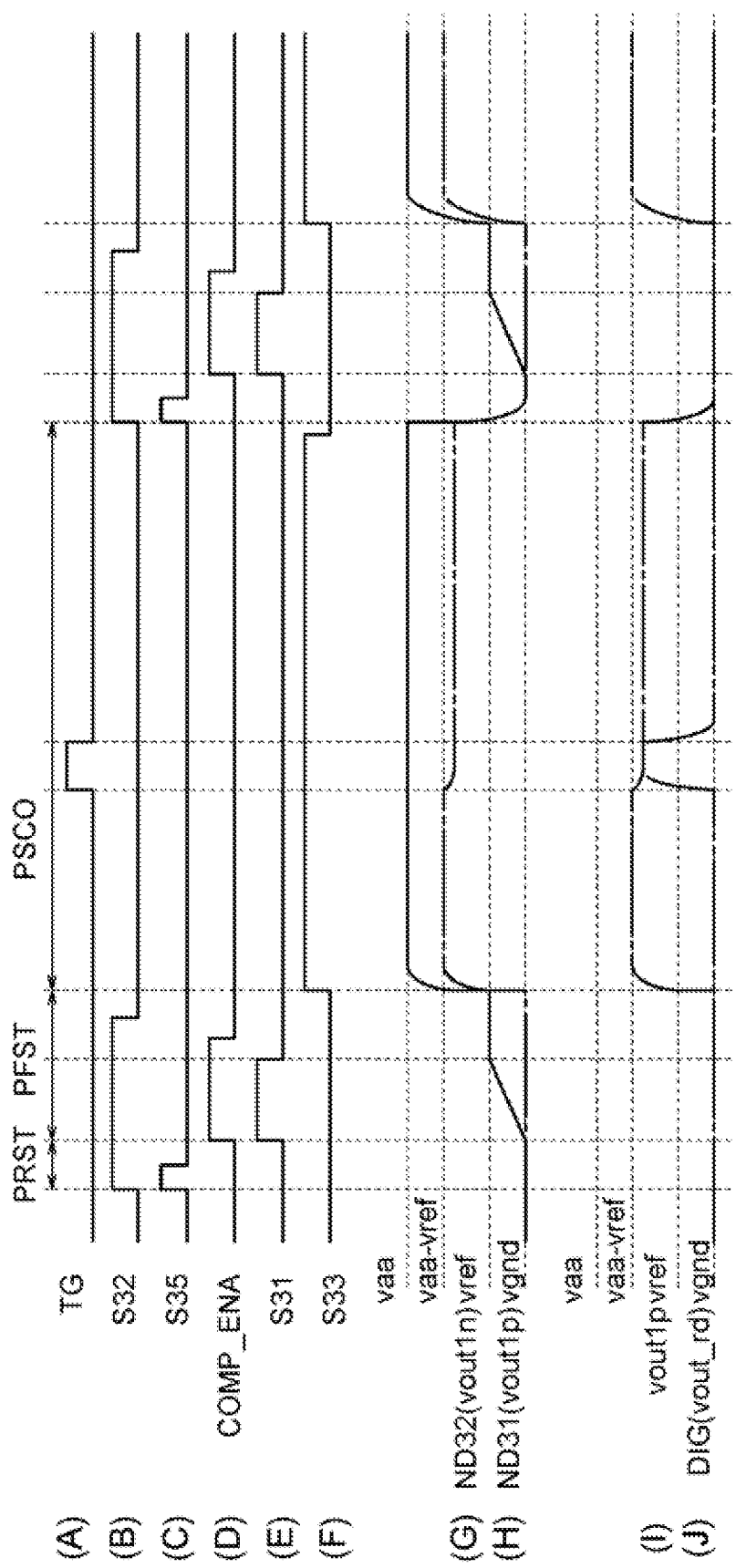
FIG. 12 is a timing chart of a voltage generation operation, etc. of a voltage supply part and a row driver in the vertical scanning circuit of the solid-state imaging device according to the fourth embodiment.

FIG. 11 is a diagram illustrating a configuration example of a pixel part and a vertical scanning circuit of a solid-state imaging device according to a fourth embodiment of the invention. FIG. 12 is a timing chart of a voltage generation operation, etc. of a voltage supply part 320C and a row driver 310C in the vertical scanning circuit 30C of the solid-state imaging device 10C according to the fourth embodiment.

A difference between the solid-state imaging device 10C according to the fourth embodiment and the solid-state imaging device 10 according to the first embodiment described above is as follows. The voltage supply part 320C of the solid-state imaging device 10C according to the fourth embodiment is configured to generate a voltage lower than the positive power-source voltage vaa instead of generating a voltage higher than the positive power-source voltage vaa and supply the generated voltage to the first power-source voltage terminal TVAA of the row driver 310C. The solid-state imaging device 10C according to the fourth embodiment is different from the solid-state imaging device 10 according to the first embodiment in the configuration of the voltage supply part 320C.

The voltage supply part 320C generates a voltage lower than the first power-source voltage (positive power-source voltage) vaa, for example, (vaa−vref), and supplies the generated voltage to the row driver 310C.

The voltage supply part 320C includes the external capacitor Cext31 in which the first node ND31, the second node ND32, and the first electrode EL31 are connected to the first node ND31 via the first connection terminal T31, and the second electrode EL32 is connected to the second node ND32 via the second connection terminal T32. The voltage supply part 320C includes a first power-source potential line Lvaa of the first power-source potential (positive power-source potential) vaa, a second power-source potential line Lvgnd of the second power-source potential (negative power-source potential) vgnd, a first switch SW31, a second switch SW32, a third switch SW33, a fifth switch SW35, and a level determination part 321C.

The first switch SW31 selectively connects between the first power-source potential line Lvaa and the second node ND32 in accordance with a first signal S31. The second switch SW32 selectively connects between the second power-source potential line Lvgnd and the first node ND31 in accordance with a second signal S32. The third switch SW33 selectively connects between the first power-source potential line Lvaa and the second node ND32 in accordance with a third signal S33. As described above, in the voltage supply part 320C including the third switch SW33, the first node ND31 is connected to the first power-source voltage terminal TVAA of the row driver 310. Further, the fifth switch SW35 is formed of, for example, an NMOS transistor, and selectively connects between the first node ND31 and the second node ND32 in accordance with a fifth signal S35.

In the case of determining that a potential level VND32 of the second node ND32 is lower than a reference voltage vref set arbitrarily, the level determination part 321C outputs the first signal S31 that is active, for example, at the high (H) level to the first switch SW31 to turn on the first switch SW31. In the case of determining that the potential level VND32 of the second node ND32 has reached the reference voltage vref, the level determination part 321C outputs the first signal S31 that is inactive, in this example, at the low level to the first switch SW31 to turn off the first switch SW31.

The level determination part 321C of the fourth embodiment includes a comparator CMP31C whose non-inverted input (+) is connected to a supply line of the reference voltage vref and whose inverted input terminal (−) is connected to the second node ND32.

The comparator CMP31C compares the potential level VND32 of the second node ND32 with the reference voltage vref, and outputs the first signal S31 at the active H level to the first switch SW31 to turn on the first switch SW31 when the potential level VND32 of the second node ND32 is lower than the reference voltage vref. In a case in which the potential level VND32 of the second node ND32 has reached the reference voltage vref, the comparator CMP31C outputs the first signal S31 at the inactive L level to the first switch SW31 to turn off the first switch SW31.

Further, in the fourth embodiment, similarly to the first embodiment, etc., when an enable signal CMP_ENA is at the active H level, the comparator CMP31C as the level determination part 321C is in an operational state and performs level determination processing.

In the voltage supply part 320C having the above-mentioned configuration, a booster 322C includes the first node ND31, the second node ND32, the first power-source potential line Lvaa of the first power-source potential (positive power-source potential) vaa, the second power-source potential line Lvgnd of the second power-source potential (negative power-source potential) vgnd, the first switch SW31, the second switch SW32, the third switch SW33, the fifth switch SW35, and the comparator CMP31C as the level determination part 321C except for the external capacitor Cext31.

At the time of generating a voltage (vaa−vref) higher than the positive power-source voltage supplied to the row driver 310C, the voltage supply part 320C in the fourth embodiment generates the voltage (vaa−vref) lower than the positive power-source voltage vaa at a desired level and supplies the generated voltage to the row driver 310C through the reset duration PRST, the first duration PFST, and the second duration PSCD.

When the reference voltage vref changes, the potential level VND32 (vaa−vref) of the second node ND32 can be adjusted.

(Operation such as Voltage Generation of Vertical Scanning Circuit 30C)

Next, a description will be given of a voltage generation operation, etc. of the voltage supply part 320C and the row driver 310C in the vertical scanning circuit 30C of the solid-state imaging device 10C according to the fourth embodiment. Here, similarly to the case of the first embodiment, to facilitate understanding, a case in which the transfer transistor TG21-Tr of the pixel PXL20 is driven to read the pixel will be described as an example.

FIG. 12 is a timing chart of the voltage generation operation, etc. of the voltage supply part 320C and the row driver 310C in the vertical scanning circuit 30C of the solid-state imaging device 10C according to the fourth embodiment.

Line (A) of FIG. 12 illustrates the control signal TG of the transfer transistor TG21-Tr of the pixel PXL20. Line (B) of FIG. 12 illustrates the second signal S32 for turning on and off the second switch SW32 of the voltage supply part 320C. Line (C) of FIG. 12 illustrates the fifth signal S35 for turning on and off the fifth switch SW35 of the voltage supply part 320C. Line (D) of FIG. 12 illustrates the enable signal CMP_ENA for the comparator CMP31C of the voltage supply part 320C. Line (E) of FIG. 12 illustrates the first signal S31 for turning on and off the first switch SW31 of the voltage supply part 320C. Line (F) of FIG. 12 illustrates the third signal S33 for turning on and off the third switch SW33 of the voltage supply part 320C. Line (G) of FIG. 12 illustrates level transition of the second node ND32 of the voltage supply part 320C. Line (H) of FIG. 12 illustrates level transition of the first node ND31 of the voltage supply part 320. Line (I) of FIG. 12 illustrates level transition of the first node ND31 of the voltage supply part 320C. Line (J) of FIG. 12 illustrates the drive control signal DTG applied from the row driver 310C of the voltage supply part 320C to the drive control line LTG21.

(Operation in Reset Duration PRST)

In the voltage supply part 320C, the reset duration PRST is set before the first duration PFST for generating a voltage. In the reset duration PRST, the enable signal CMP_ENA is set to the inactive L level and the comparator CMP31C is held in the non-operational state. Since the comparator CMP31C is in the non-operational state, the first signal S31 corresponding to an output thereof is held at the inactive L level, and the first switch SW31 is held in the off state accordingly. In addition, in the reset duration PRST, the third signal S33 is set to the inactive L level, and the third switch SW33 is held in the off state.

In this way, in the reset duration PRST, in a state in which the first switch SW31 and the third switch SW33 are turned off, the second signal S32 is set to the active H level, the second switch SW32 is held in the on state, and the first node ND31 is connected to the power-source potential line Lvgnd. At the same time, the fifth signal S35 is set to the active H level, the fifth switch SW35 is held in the on state, and the first node ND31 and the second node ND32 are connected. In this way, the first node ND31 and the second node ND32 are set to the second power-source potential vgnd and reset (discharged).

In the reset duration PRST, when the first node ND31 and the second node ND32 are reset to the second power-source potential vgnd, the fifth signal S35 is set to the inactive L level, the fifth switch SW35 is switched to the off state, and the first node ND31 and the second node ND32 are disconnected Even when the reset duration PRST ends, the second signal S32 is held at the active H level until immediately before the end of the subsequent first duration PFST. Accordingly, the second switch SW32 is held in the on state immediately before the start of the second duration PSCD, and is held in a state where the first node ND31 is connected to the second power-source potential line Lvgnd Therefore, the first node ND31 is held at the second power-source potential vgnd until immediately before the second duration PSCD is started.

(Operation in First Duration PFST)

When processing in the reset duration PRST ends, processing in the first duration PFST is subsequently performed. In the first duration PFST, the enable signal CMP_ENA is switched to the active H level, and the comparator CMP31C is switched to the operational state. When the comparator CMP31C is switched to the operational state, comparison processing of the potential level VND32 of the second node ND32 and the reference voltage vref is started. At the start of comparison, since the potential level VND32 of the second node ND32 is lower than the reference voltage vref, the first signal S31 at the active H level is output to the first switch SW31 to turn on the first switch SW31.

As the first switch SW31 is switched to the on state, the second node ND32 is connected to the first power-source potential line Lvaa, the second node ND32 is charged, and the potential level VND32 thereof rises from the second power-source potential vgnd to the reference voltage vref. When the potential level VND32 of the second node ND32 rises and reaches the reference voltage vref, the comparator CMP31C detects that the potential level VND32 of the second node ND32 has reached the reference voltage vref, the first signal S31 is switched to the inactive L level and output to the first switch SW31, and the first switch SW31 is turned off. In this way, the second node ND32 is disconnected from the first power-source potential line Lvaa.

Subsequently, in the first duration PFST, the enable signal CMP_ENA is set to the inactive L level, and the comparator CMP31C is switched to the non-operational state. Subsequently, the second signal S32 is switched to the L level, the second switch SW32 is switched to the off state, and the first node ND31 is disconnected from the second power-source potential line Lvgnd.

(Operation in Second Duration PSCD)

When processing in the first duration PFST ends, processing in the second duration PSCD is subsequently performed. In the second duration PSCD, while the first signal S31 and the second signal S32 are set to the inactive L level to turn off the first switch SW31 and the second switch SW32, the third signal S33 is switched to the active H level. In this way, the third switch SW33 is turned on, the second node ND32 is connected to the first power-source potential line Lvaa, and the first node ND31 is stepped downed to a potential (vaa−vref) by capacitive coupling of the external capacitor Cext31. The step-down voltage (vaa−vref) is supplied from the first node ND31 to the first power-source voltage terminal TVAA of the row driver 310C as a voltage to be supplied lower than the positive power-source voltage (first power-source voltage).

In the row driver 310C, upon reception of the control signal TG21, the drive control signal DTG21 at a level of the voltage (vaa−vref) lower than the first power-source voltage (positive power-source voltage) vaa supplied from the voltage supply part 320 is applied to the corresponding drive control line LTG21.

Electric charges of the external capacitor Cext31 are divided by the capacitor Cext31 and the load capacity of the pixel array of the pixel part 20, and a voltage of the drive control signal DTG21 (vout1p) becomes slightly lower than the step-down voltage (vaa−vref).

According to the fourth embodiment, a similar effect to that of the first embodiment described above can be obtained That is, according to the fourth embodiment, the vertical scanning circuit 30 includes the voltage supply part 320C that generates the voltage different from the first power-source voltage (positive power-source voltage) vaa, for example, the voltage lower than the positive power-source voltage vaa (for example, vaa−vref) and supplies the generated voltage to the row driver 310C. Further, the voltage supply part 320C includes the external capacitor Cext31 in which the first node ND31, the second node ND32, and the first electrode EL31 are connected to the first node ND31 via the first connection terminal T31, and the second electrode EL32 is connected to the second node ND32 via the second connection terminal T32. Furthermore, the voltage supply part 320C includes the first power-source potential line Lvaa of the first power-source potential (positive power-source potential) vaa, the second power-source potential line Lvgnd of the second power-source potential (negative power-source potential) vgnd, the first switch SW31, the second switch SW32, the third switch SW33, the fifth switch SW35, and the comparator CMP31 as the level determination part 321. The comparator CMP31C compares the potential level VND32 of the second node ND32 with the reference voltage vref, outputs the first signal S31 at the active H level to the first switch SW31 to turn on the first switch SW31 when the potential level VND32 of the second node ND32 is lower than the reference voltage vref, and outputs the first signal S31 at the inactive L level to the first switch SW31 to turn off the first switch SW31 when the potential level VND32 of the second node ND32 reaches the reference voltage vref.

That is, the voltage supply part 320C that supplies a voltage lower than the positive power-source voltage to the row driver in the vertical scanning circuit 30C of the fourth embodiment basically includes the first power-source potential vaa, the second power-source potential vgnd, the three switches SW31, SW32, and SW33, and the external capacitor Cext31 in the semiconductor substrate (chip), can achieve low power consumption with a simpler circuit and a smaller area, can realize high-speed charging, and can be applied to the CMOS image sensor having the rolling shutter function and the global shutter function. The voltage supply part of the fourth embodiment basically requires only a switch of silicon and one external capacitor, does not require an internal operational amplifier for charging and discharging a capacitor, and does not require an internal capacitor that consumes area and power. A high-speed operation as an external capacitor is charged by an external power supply having significantly small output impedance, and an output voltage of the voltage supply part can be adjusted when the comparator CMP31C corresponding to the level determination part (voltage detection circuit) is used or when a charging time is controlled.

Fifth Embodiment

Figure 13:
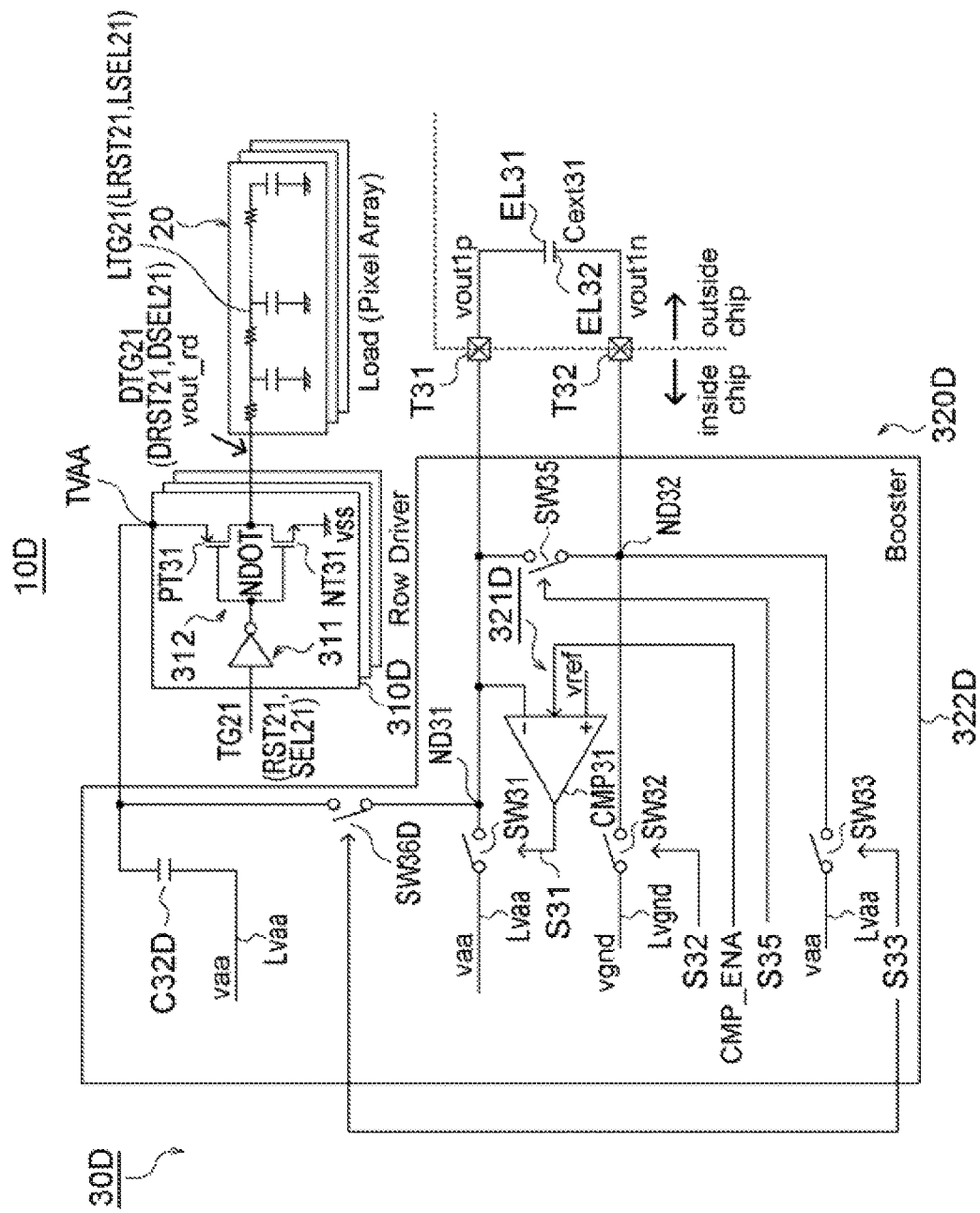
FIG. 13 is a diagram illustrating a configuration example of a pixel part and a vertical scanning circuit of a solid-state imaging device according to a fifth embodiment of the invention.
Figure 14:
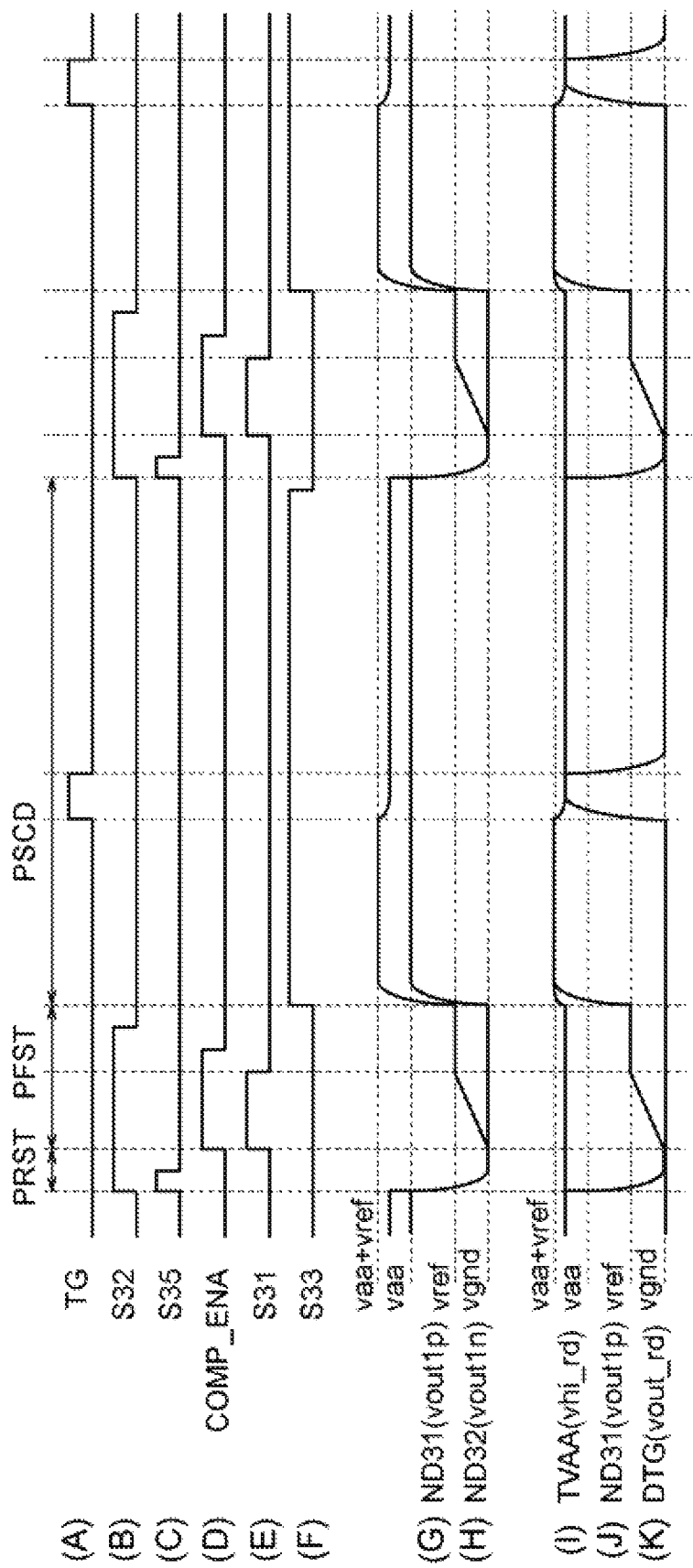
FIG. 14 is a timing chart of a voltage generation operation, etc. of a voltage supply part and a row driver in the vertical scanning circuit of the solid-state imaging device according to the fifth embodiment.

FIG. 13 is a diagram illustrating a configuration example of a pixel part and a vertical scanning circuit of a solid-state imaging device according to a fifth embodiment of the invention. FIG. 14 is a timing chart of a voltage generation operation, etc. of a voltage supply part 320D and a row driver 310D in the vertical scanning circuit 30D of the solid-state imaging device 10D according to the fifth embodiment.

A difference between the solid-state imaging device 10D according to the fifth embodiment and the solid-state imaging device 10 according to the first embodiment described above is as follows. In the voltage supply part 320D of the solid-state imaging device 10D according to the fifth embodiment, a switch SW36D is connected between the first node ND31 and the first power-source voltage terminal TVAA of the row driver 310D, and a capacitor C32D is connected between the first power-source voltage terminal TVAA and the first power-source potential line Lvaa of the positive power-source potential vaa. Similarly to the third switch SW33, the switch SW36D is on/off controlled by the third signal S33, and selectively connects between the first node ND31 and the first power-source voltage terminal TVAA in accordance with the third signal S33.

That is, in the fifth embodiment, in the second duration PSCD, the third switch SW33 is turned on, the second node ND32 is connected to the first power-source potential line Lvaa, and the first node ND31 is boosted up to a potential (vaa+vref) by capacitive coupling of the external capacitor Cext31. At the same time, the switch SW36D is turned on. While the switch SW36D is turned on, the boosted voltage (vaa+vref) is supplied from the first node ND31 to the first power-source voltage terminal TVAA of the row driver 310D as a voltage to be supplied higher than the positive power-source voltage (first power-source voltage). In addition, the voltage level of the first power-source voltage terminal TVAA is held at a stable level by the capacitor C32D.

Other configurations are similar to those of the first embodiment described above. According to the fifth embodiment, not only a similar effect to that of the first embodiment described above can be obtained, but it is also possible to realize more excellent boosted voltage supply operation.

Sixth Embodiment

Figure 15:
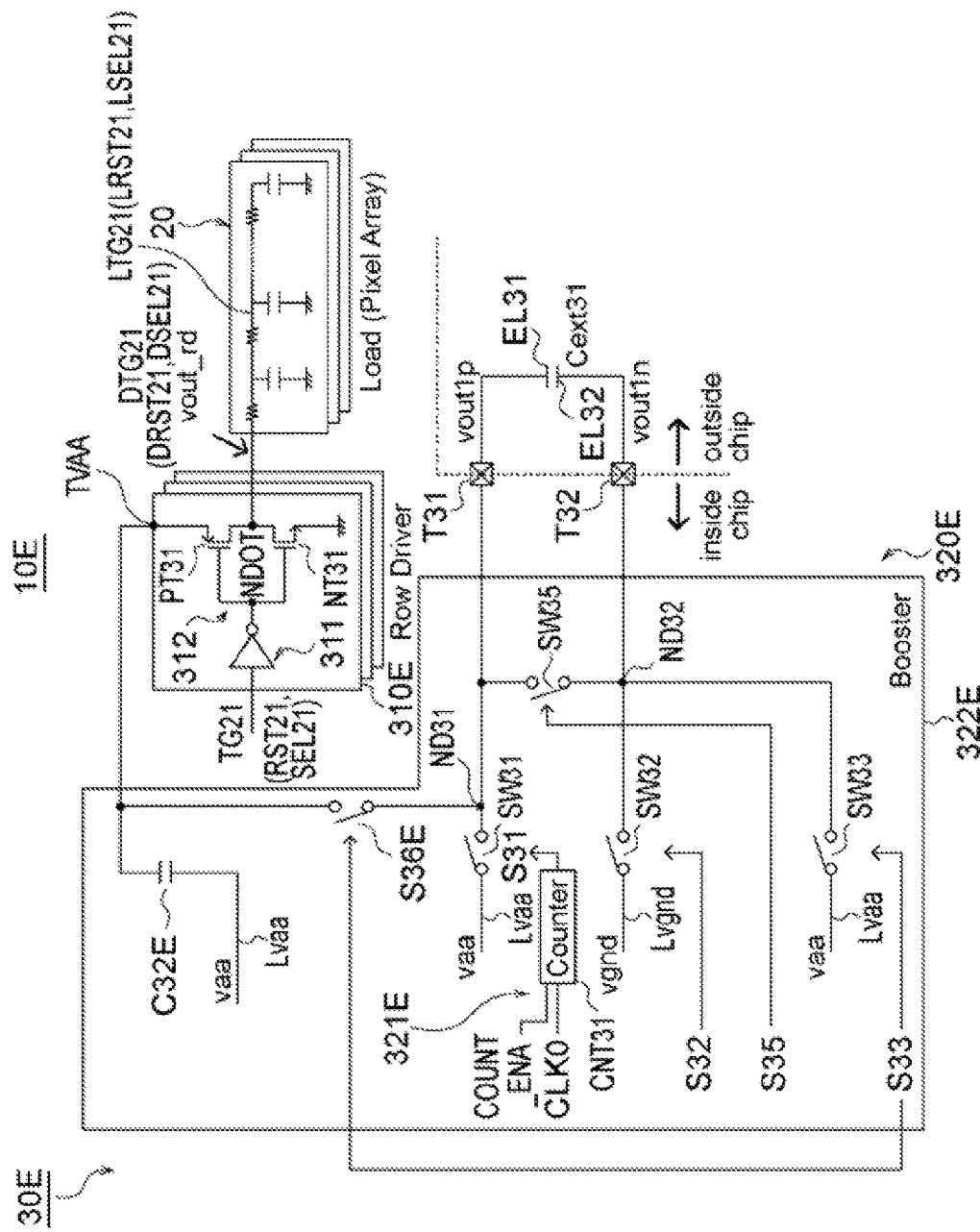
FIG. 15 is a diagram illustrating a configuration example of a pixel part and a vertical scanning circuit of a solid-state imaging device according to a sixth embodiment of the invention.
Figure 16:
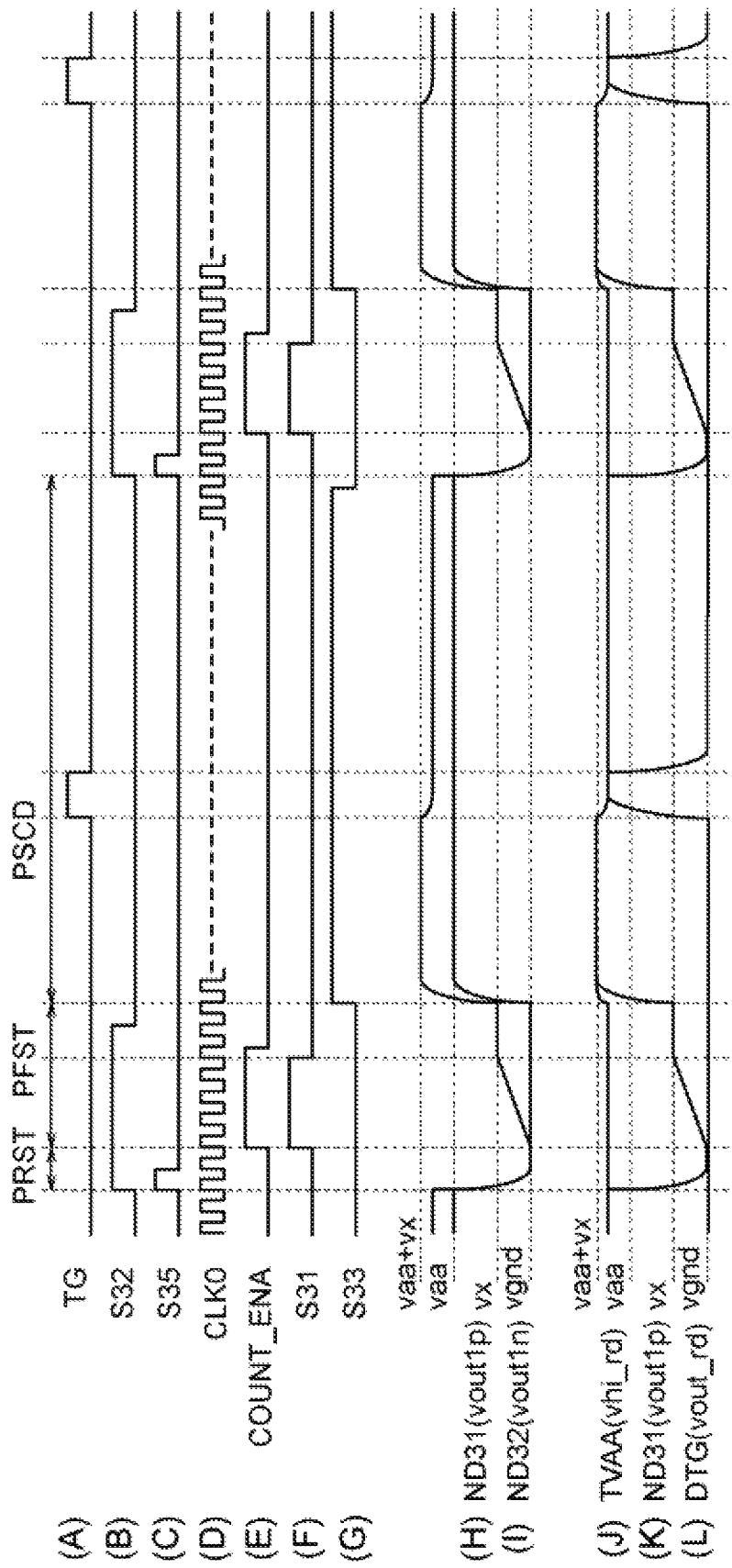
FIG. 16 is a timing chart of a voltage generation operation, etc. of a voltage supply part and a row driver in the vertical scanning circuit of the solid-state imaging device according to the sixth embodiment.

FIG. 15 is a diagram illustrating a configuration example of a pixel part and a vertical scanning circuit of a solid-state imaging device according to a sixth embodiment of the invention. FIG. 16 is a timing chart of a voltage generation operation, etc. of a voltage supply part 320E and a row driver 310E in the vertical scanning circuit 30E of the solid-state imaging device 10E according to the sixth embodiment.

A difference between the solid-state imaging device 10E according to the sixth embodiment and the solid-state imaging device 10A according to the second embodiment described above is as follows. In the voltage supply part 320E of the solid-state imaging device 10E according to the sixth embodiment, a switch SW36E is connected between the first node ND31 and the first power-source voltage terminal TVAA of the row driver 310E, and a capacitor C32E is connected between the first power-source voltage terminal TVAA and the first power-source potential line Lvaa of the positive power-source potential vaa. Similarly to the third switch SW33, the switch SW36E is on/off controlled by the third signal S33, and selectively connects between the first node ND31 and the first power-source voltage terminal TVAA in accordance with the third signal S33.

That is, in the sixth embodiment, in the second duration PSCD, the third switch SW33 is turned on, the second node ND32 is connected to the first power-source potential line Lvaa, and the first node ND31 is boosted up to a potential (vaa+vx (for example, vref)) by capacitive coupling of the external capacitor Cext31. At the same time, the switch SW36E is turned on. While the switch SW36E is turned on, the boosted voltage (vaa+vx (vref)) is supplied from the first node ND31 to the first power-source voltage terminal TVAA of the row driver 310E as a voltage to be supplied higher than the positive power-source voltage (first power-source voltage). In addition, the voltage level of the first power-source voltage terminal TVAA is held at a stable level by the capacitor C32E.

Other configurations are similar to those of the second embodiment described above. According to the sixth embodiment, not only a similar effect to that of the second embodiment described above can be obtained, but it is also possible to realize more excellent boosted voltage supply operation.

Seventh Embodiment

Figure 17:
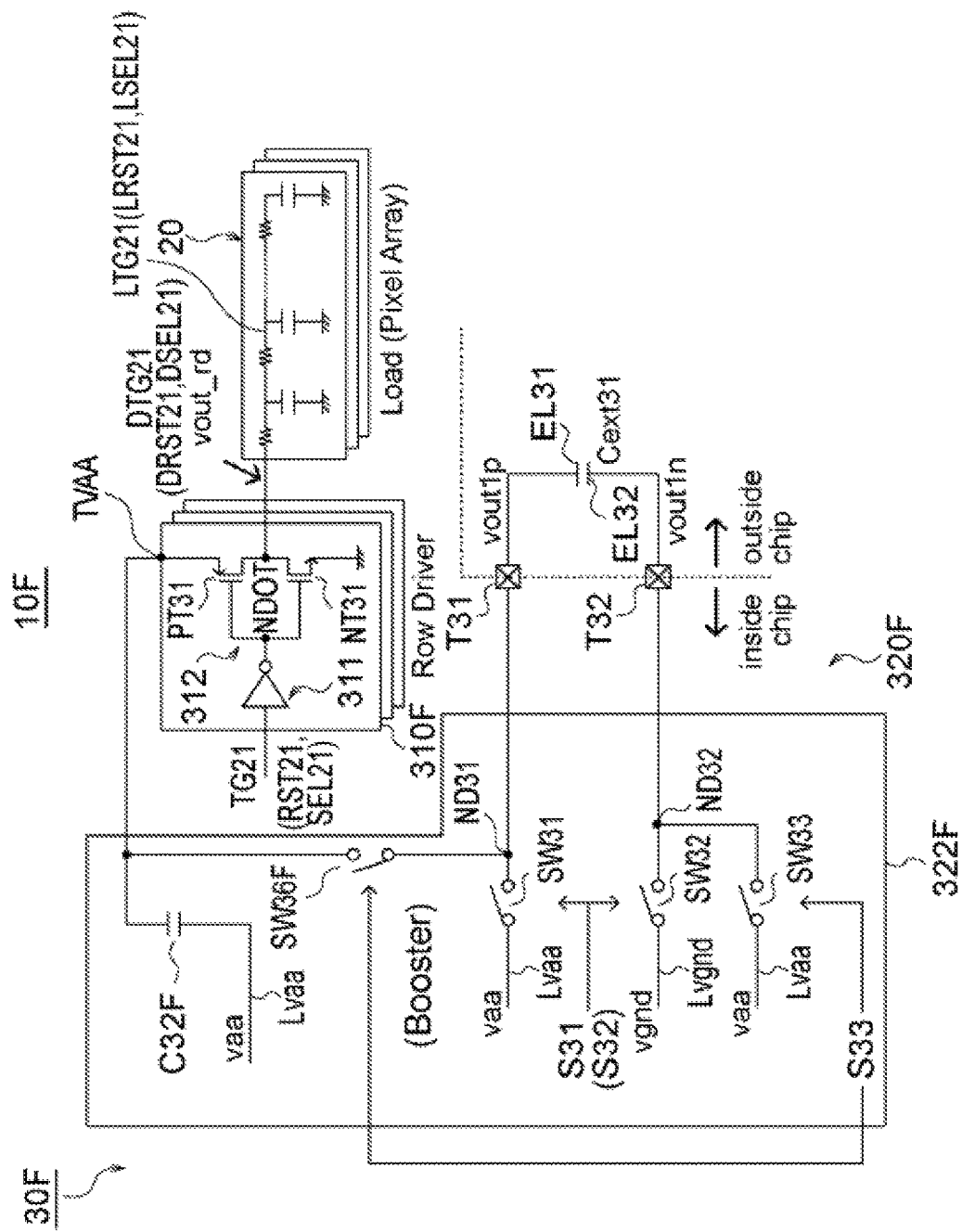
FIG. 17 is a diagram illustrating a configuration example of a pixel part and a vertical scanning circuit of a solid-state imaging device according to a seventh embodiment of the invention.
Figure 18:
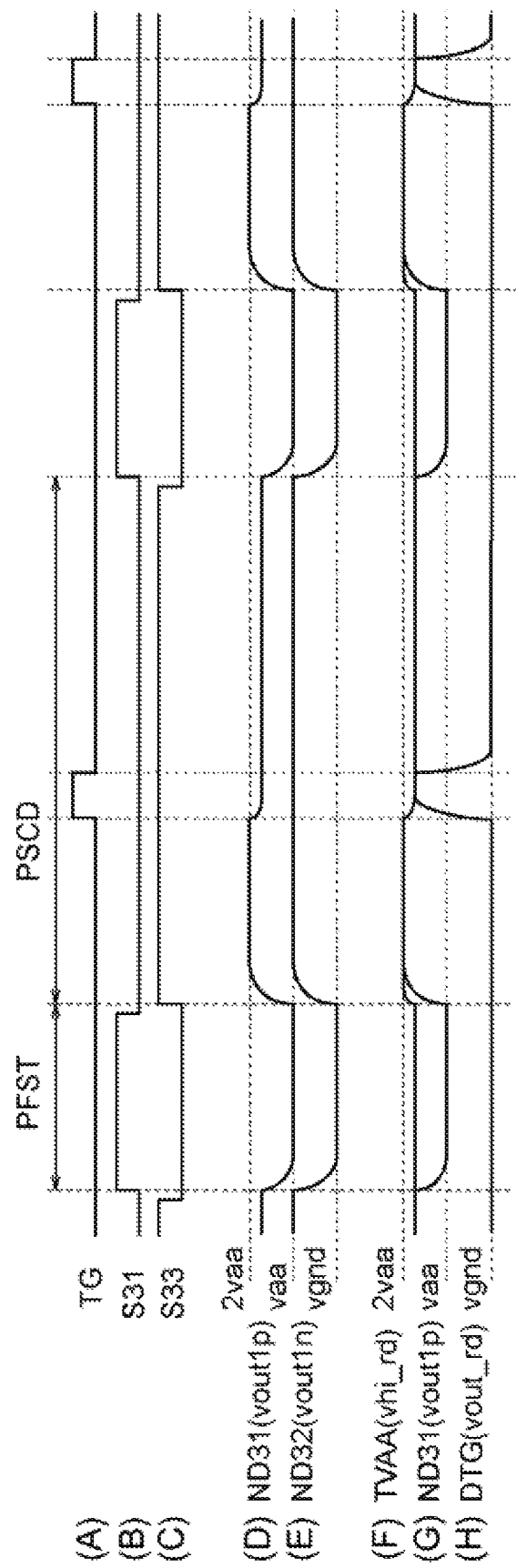
FIG. 18 is a timing chart of a voltage generation operation, etc. of a voltage supply part and a row driver in the vertical scanning circuit of the solid-state imaging device according to the seventh embodiment.

FIG. 17 is a diagram illustrating a configuration example of a pixel part and a vertical scanning circuit of a solid-state imaging device according to a seventh embodiment of the invention. FIG. 18 is a timing chart of a voltage generation operation, etc. of a voltage supply part 320F and a row driver 310F in the vertical scanning circuit 30F of the solid-state imaging device 10F according to the seventh embodiment.

A difference between the solid-state imaging device 10F according to the seventh embodiment and the solid-state imaging device 10B according to the third embodiment described above is as follows. In the voltage supply part 320F of the solid-state imaging device 10F according to the seventh embodiment, a switch SW36F is connected between the first node ND31 and the first power-source voltage terminal TVAA of the row driver 310F, and a capacitor C32F is connected between the first power-source voltage terminal TVAA and the first power-source potential line Lvaa of the positive power-source potential vaa. Similar to the third switch SW33, the switch SW36F is on/off controlled by the third signal S33, and selectively connects between the first node ND31 and the first power-source voltage terminal TVAA in accordance with the third signal S33.

That is, in the seventh embodiment, in the second duration PSCD, the third switch SW33 is turned on, the second node ND32 is connected to the first power-source potential line Lvaa, and the first node ND31 is boosted up to a potential (2 vaa) by capacitive coupling of the external capacitor Cext31. At the same time, the switch SW36F is turned on. While the switch SW36F is turned on, the boosted voltage (2 vaa) is supplied from the first node ND31 to the first power-source voltage terminal TVAA of the row driver 310F as a voltage to be supplied higher than the positive power-source voltage (first power-source voltage). In addition, the voltage level of the first power-source voltage terminal TVAA is held at a stable level by the capacitor C32F.

Electric charges of the external capacitor Cext31 are divided by the capacitor Cext31 and the load capacity of the pixel array of the pixel part 20, and a voltage of the drive control signal DTG21 (vout1p) becomes slightly lower than the boosted voltage (2 vaa). Thereafter, the third signal S33 is at a low level, and the first signal S31 is at a low level again. In this instance, while the voltage level of the first node ND31 is vaa, a node vhi rd (TVAA) is maintained at about 2 vaa.

Other configurations are similar to those of the third embodiment described above. According to the seventh embodiment, not only a similar effect to that of the third embodiment described above can be obtained, but it is also possible to realize more excellent step-down voltage supply operation.

Eighth Embodiment

Figure 19:
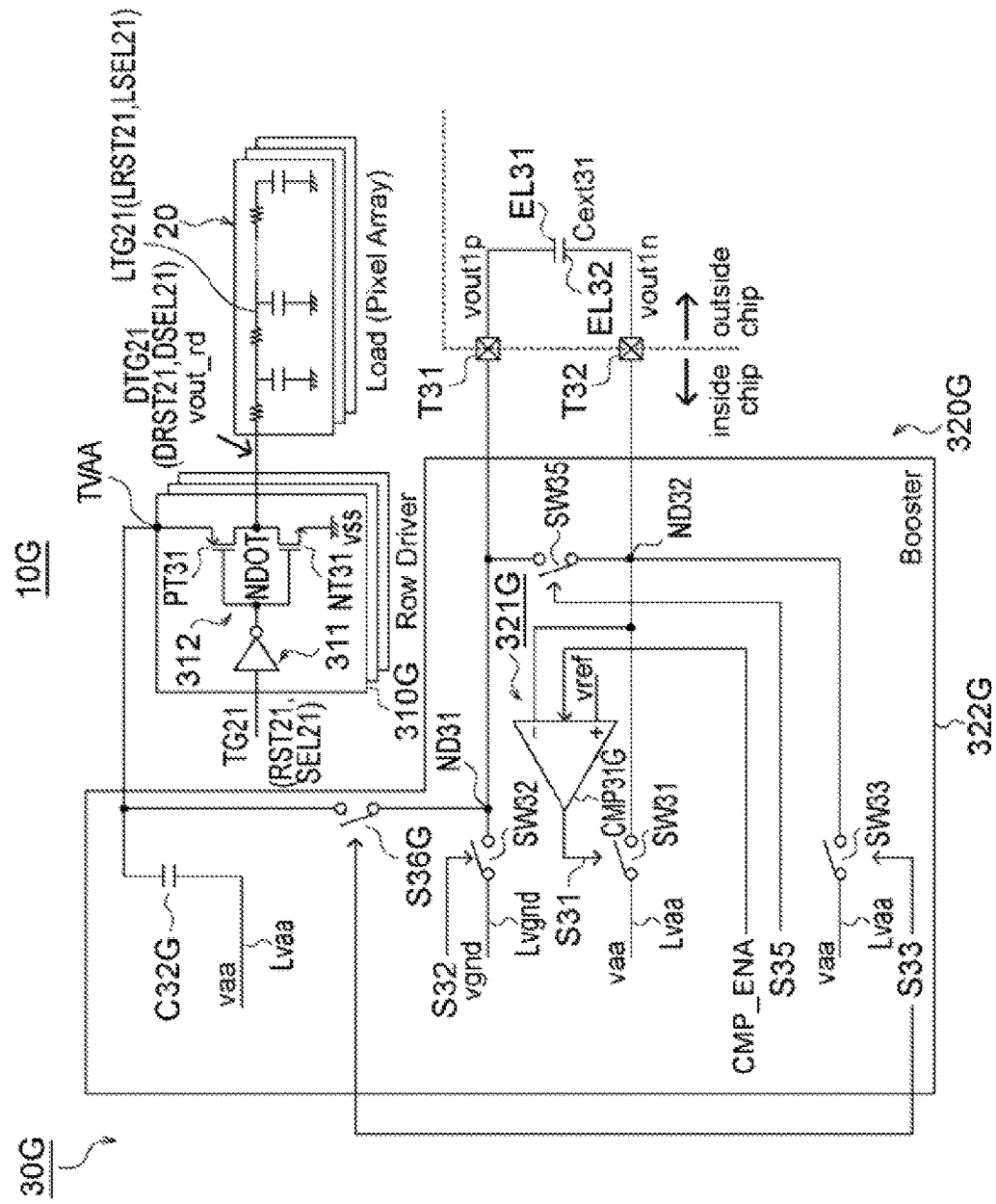
FIG. 19 is a diagram illustrating a configuration example of a pixel part and a vertical scanning circuit of a solid-state imaging device according to an eighth embodiment of the invention.
Figure 20:
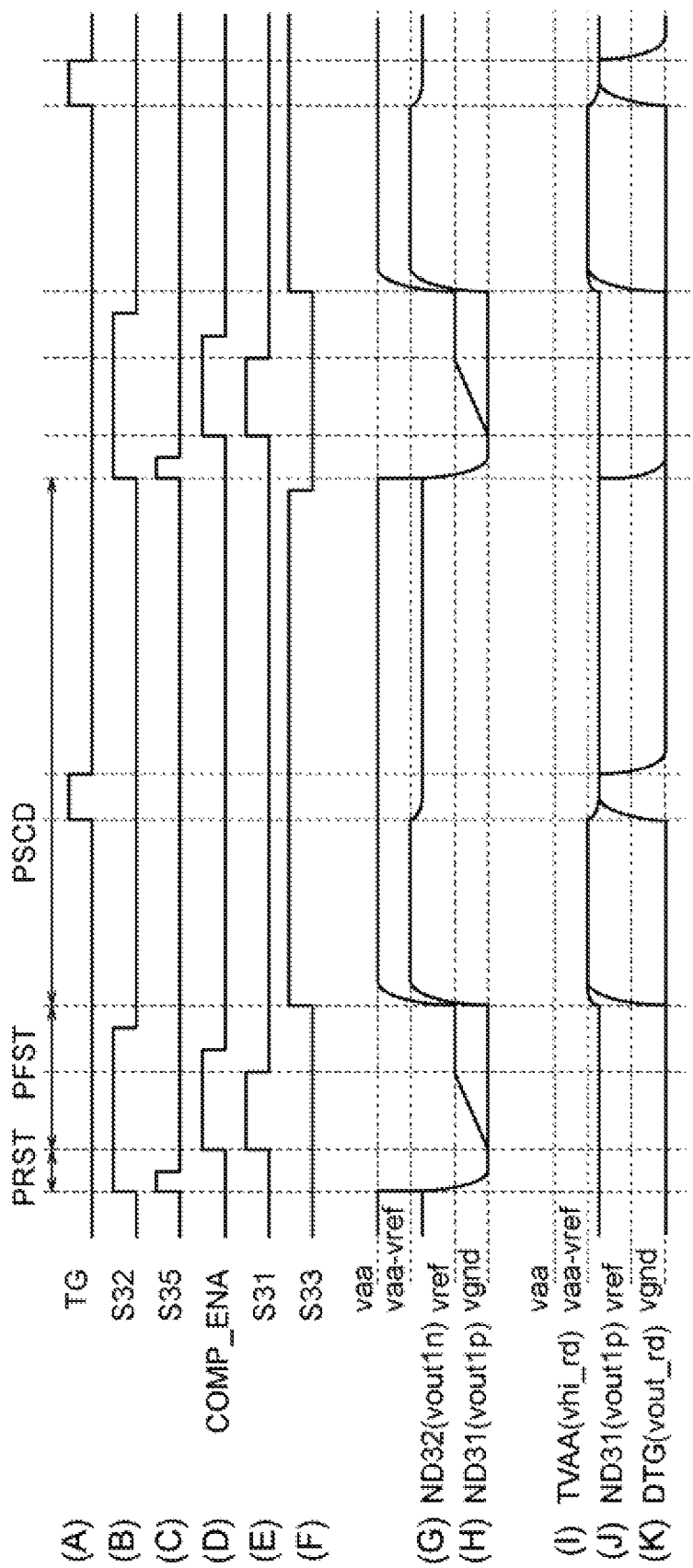
FIG. 20 is a timing chart of a voltage generation operation, etc. of a voltage supply part and a row driver in the vertical scanning circuit of the solid-state imaging device according to the eighth embodiment.

FIG. 19 is a diagram illustrating a configuration example of a pixel part and a vertical scanning circuit of a solid-state imaging device according to an eighth embodiment of the invention. FIG. 20 is a timing chart of a voltage generation operation, etc. of a voltage supply part 320G and a row driver 310G in the vertical scanning circuit 30G of the solid-state imaging device 10G according to the eighth embodiment.

A difference between the solid-state imaging device 10G according to the eighth embodiment and the solid-state imaging device 10C according to the fourth embodiment described above is as follows. In the voltage supply part 320G of the solid-state imaging device 10G according to the eighth embodiment, a switch SW36G is connected between the first node ND31 and the first power-source voltage terminal TVAA of the row driver 310G, and a capacitor C32G is connected between the first power-source voltage terminal TVAA and the first power-source potential line Lvaa of the positive power-source potential vaa. Similar to the third switch SW33, the switch SW36G is on/off controlled by the third signal S33, and selectively connects between the first node ND31 and the first power-source voltage terminal TVAA in accordance with the third signal S33.

That is, in the eighth embodiment, in the second duration PSCD, the third switch SW33 is turned on, the second node ND32 is connected to the first power-source potential line Lvaa, and the first node ND31 is stepped down up to the potential (vaa−vref) by capacitive coupling of the external capacitor Cext31. At the same time, the switch SW36G is turned on. While the switch SW36G is turned on, the step-down voltage (vaa−vref) is supplied from the first node ND31 to the first power-source voltage terminal TVAA of the row driver 310G as a voltage to be supplied lower than the positive power-source voltage (first power-source voltage). In addition, the voltage level of the first power-source voltage terminal TVAA is held at a stable level by the capacitor C32G.

Other configurations are similar to those of the fourth embodiment described above. According to the eighth embodiment, not only a similar effect to that of the fourth embodiment described above can be obtained, but it is also possible to realize more excellent step-down voltage supply operation.

Ninth Embodiment

Figure 21:
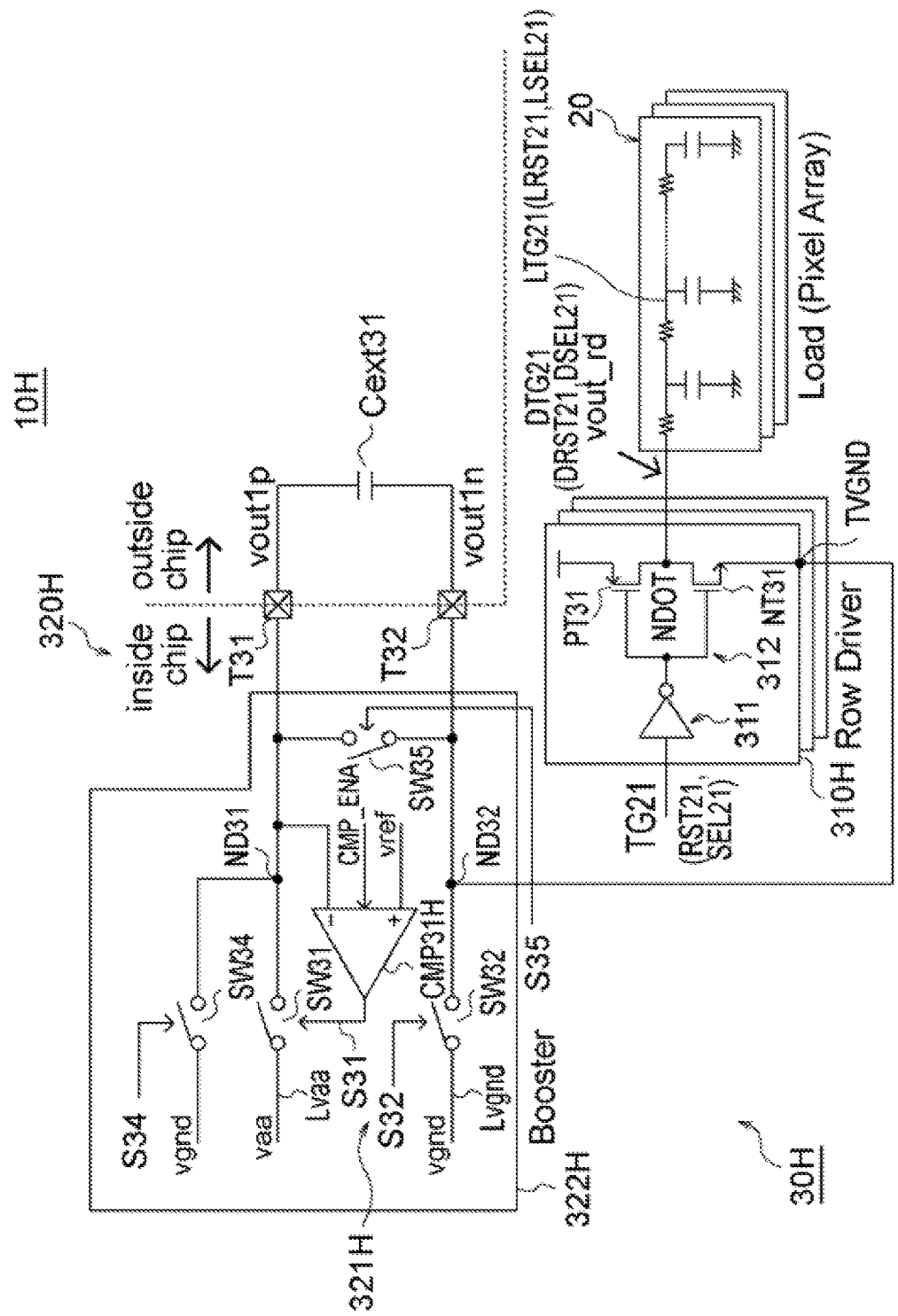
FIG. 21 is a diagram illustrating a configuration example of a pixel part and a vertical scanning circuit of a solid-state imaging device according to a ninth embodiment of the invention.
Figure 22:
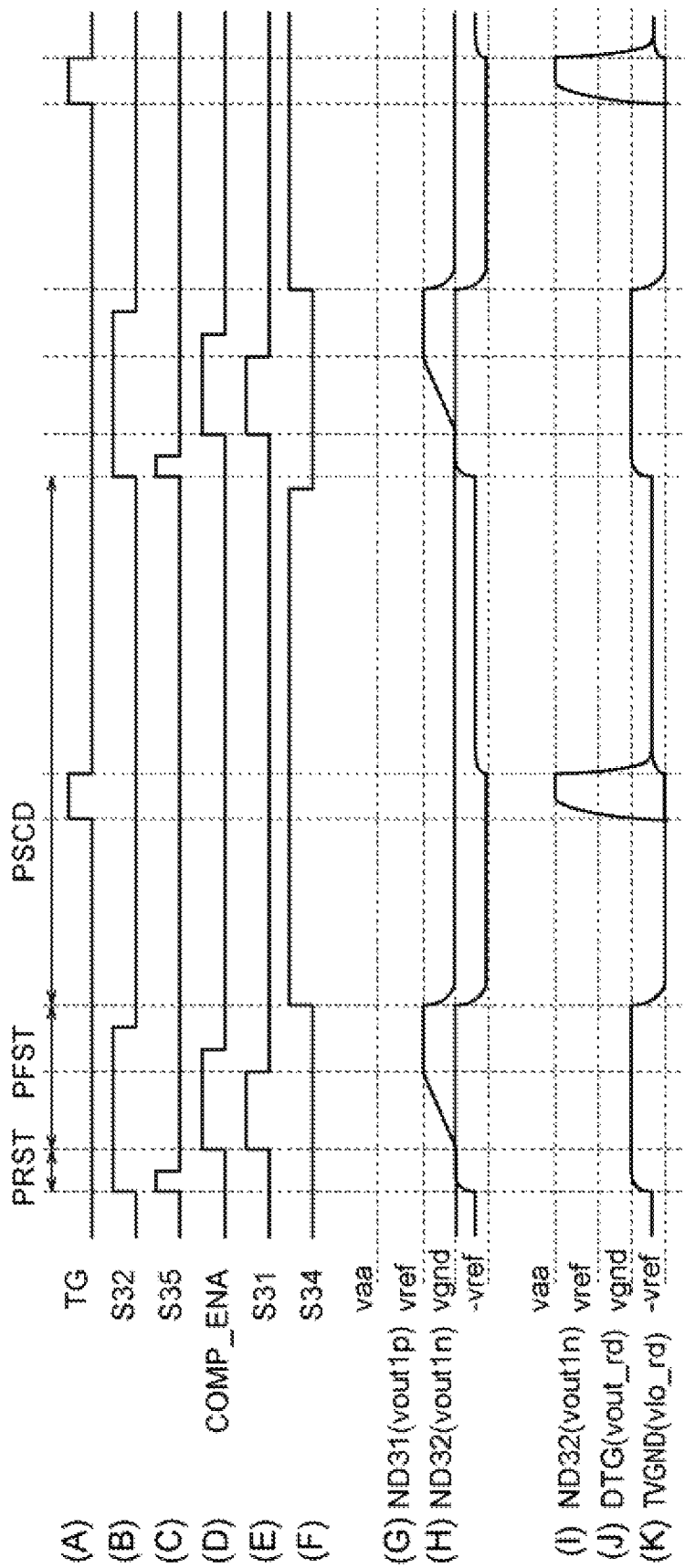
FIG. 22 is a timing chart of a voltage generation operation, etc. of a voltage supply part and a row driver in the vertical scanning circuit of the solid-state imaging device according to the ninth embodiment.

FIG. 21 is a diagram illustrating a configuration example of a pixel part and a vertical scanning circuit of a solid-state imaging device according to a ninth embodiment of the invention. FIG. 22 is a timing chart of a voltage generation operation, etc. of a voltage supply part 320H and a row driver 310H in the vertical scanning circuit 30H of the solid-state imaging device 10H according to the ninth embodiment.

A difference between the solid-state imaging device 10H according to the ninth embodiment and the solid-state imaging device 10 according to the first embodiment described above is as follows. The voltage supply part 320H of the solid-state imaging device 10H according to the ninth embodiment is configured to generate a voltage lower than the negative power-source voltage vgnd instead of generating a voltage higher than the positive power-source voltage vaa and supply the generated voltage to the second power-source voltage terminal TVGND of the row driver 310H. In the voltage supply part 320H of the solid-state imaging device 10H according to the ninth embodiment, similarly to the first embodiment, a comparator CMP31H as a level determination part 321H and the fifth switch SW35 are provided, and a voltage supplied to the row driver 310H can be adjusted to a voltage lower than the second power-source voltage (negative power-source voltage) vgnd.

In the solid-state imaging device 10H according to the ninth embodiment, similarly to the first embodiment, processing in the reset duration is performed, and then the boosting operation is performed in processing in the first duration PFST and the second duration PSCD. A basic operation is similar to that of the first embodiment, and thus a detailed description thereof is omitted here. The comparator CMP31H compares the potential level of the first node ND31 with the reference voltage vref2, outputs the first signal S31 at the active H level to the first switch SW31 to turn on the first switch SW31 when the potential level of the first node ND31 has not reached the reference voltage vref, and outputs the first signal S31 at the inactive L level to the first switch SW31 to turn off the first switch SW31 when the potential level of the first node ND31 has reached the reference voltage vref.

Further, in the ninth embodiment, instead of providing the third switch SW33, a fourth switch SW34 that selectively connects between the second power-source potential line Lvgnd of the second power-source potential vgnd and the first node ND31 in accordance with the fourth signal S34 is provided. In the case of including the fourth switch SW34, the second node ND32 is connected to the second power-source voltage terminal TVGND of the row driver 310H.

In the voltage supply part 320H of the ninth embodiment, in the first duration PFST after the reset duration PRST, the first switch SW31 and the second switch SW32 are turned on by the first signal S31 and the second signal S32 at the active H level, and the fourth switch SW34 is turned off by the fourth signal S34 at the inactive L level, so that the potential of the first node ND31 is set to the first power-source potential vaa, and the potential of the second node ND32 is set to the second power-source potential vgnd corresponding to the reference potential.

Subsequently, in the second duration PSCD, the first signal S31 and the second signal S32 are switched to the inactive L level to turn off the first switch SW31 and the second switch SW32, and the fourth signal S34 is switches to the active H level and turns on the fourth switch SW34. In this way, the potential of the second node ND32 is lower than the second power-source potential vgnd, and is set to a potential −vref corresponding to the potential of the reference potential vref on the negative side.

In the row driver 310H, upon reception of the control signal TG21, the drive control signal DTG21 at a level of a voltage −vaa supplied from the voltage supply part 320H is applied to the corresponding drive control line LTG21.

Electric charges of the external capacitor Cext31 are divided by the capacitor Cext31 and the load capacity of the pixel array of the pixel part 20, and a voltage of the drive control signal DTG21 (vout1p) becomes slightly higher than the supplied voltage (−vref).

According to the ninth embodiment, a similar effect to that of the first embodiment described above can be obtained.

Tenth Embodiment

Figure 23:
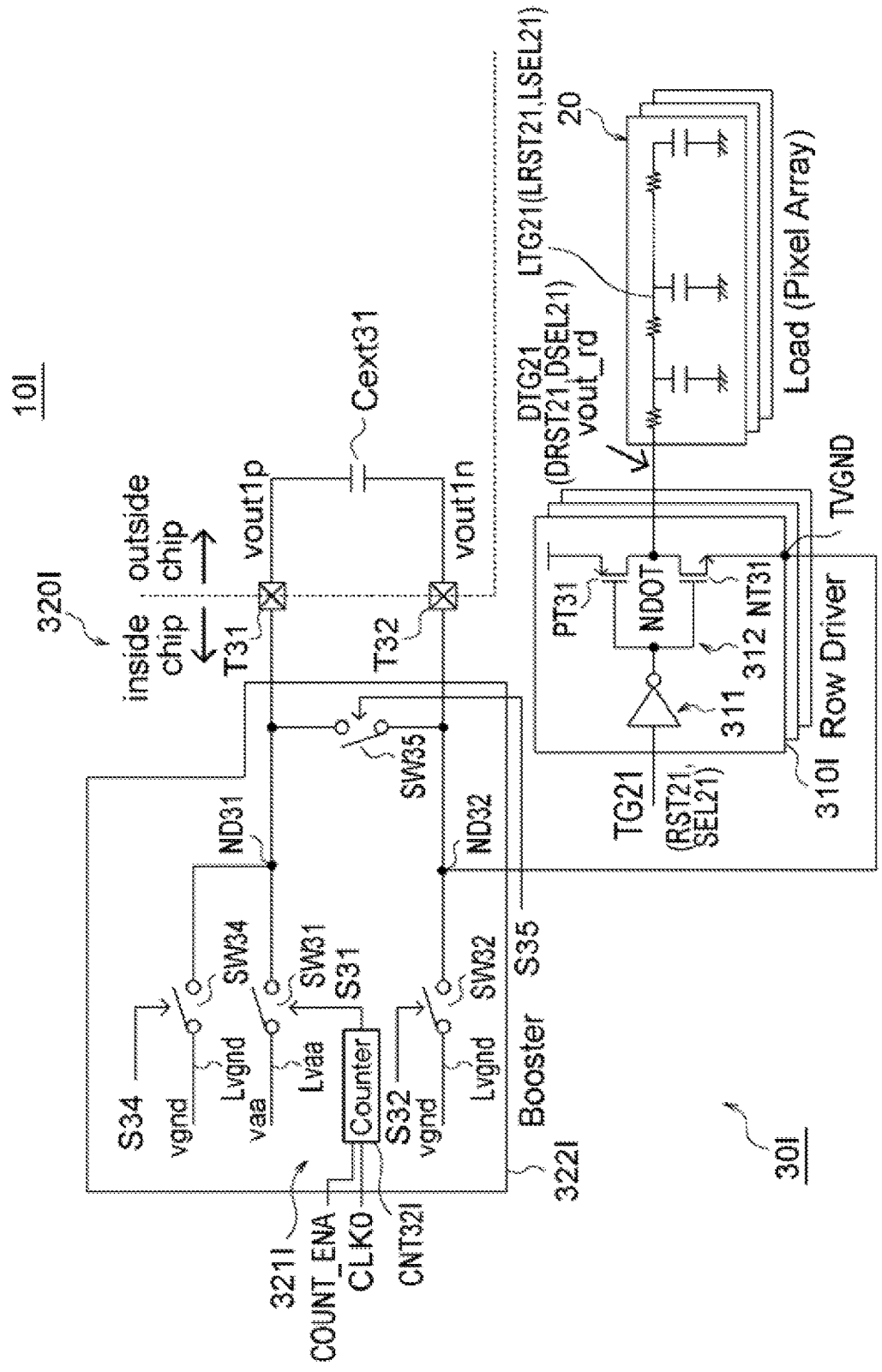
FIG. 23 is a diagram illustrating a configuration example of a pixel part and a vertical scanning circuit of a solid-state imaging device according to a tenth embodiment of the invention.
Figure 24:
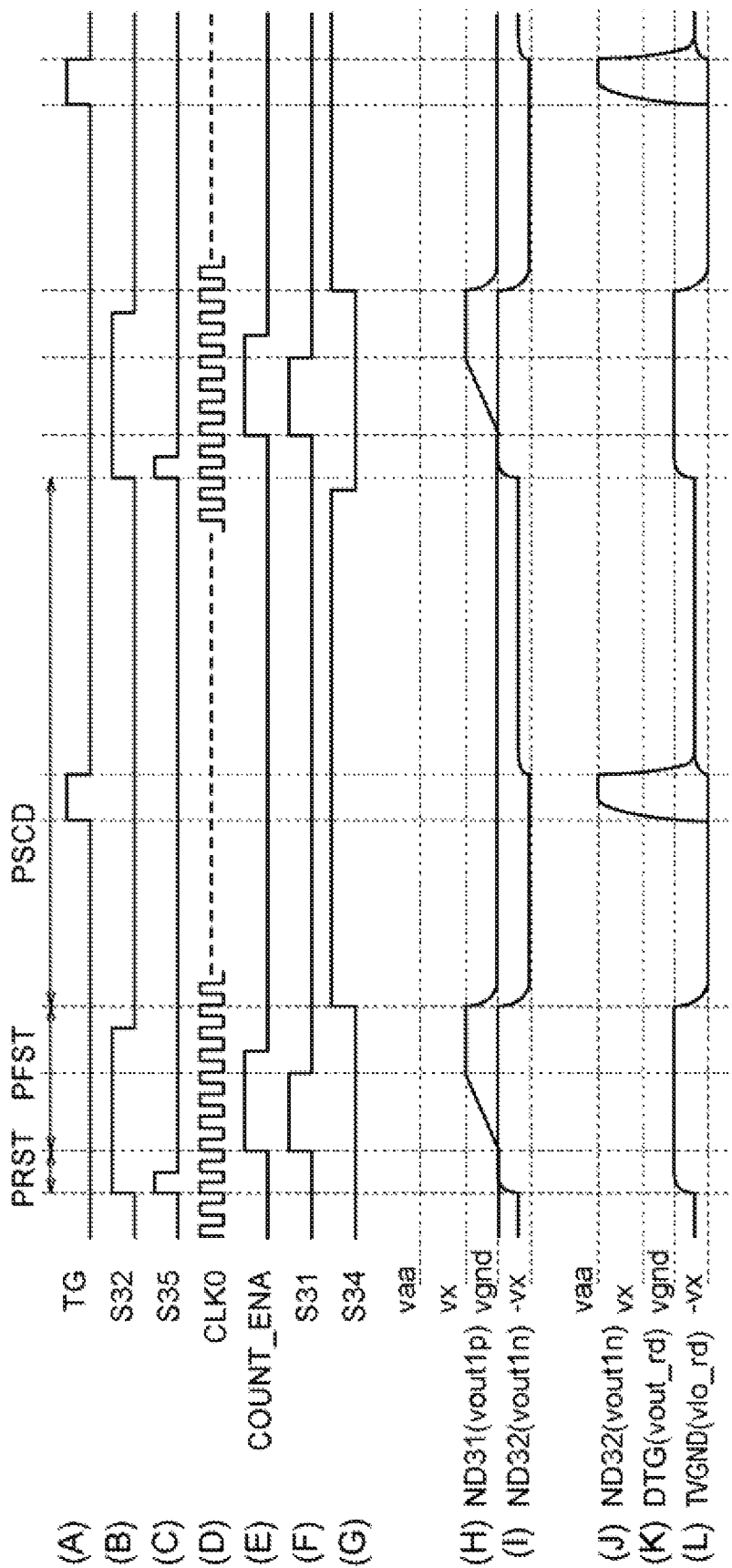
FIG. 24 is a timing chart of a voltage generation operation, etc. of a voltage supply part and a row driver in the vertical scanning circuit of the solid-state imaging device according to the tenth embodiment.

FIG. 23 is a diagram illustrating a configuration example of a pixel part and a vertical scanning circuit of a solid-state imaging device according to a tenth embodiment of the invention. FIG. 24 is a timing chart of a voltage generation operation, etc. of a voltage supply part 320I and a row driver 310I in the vertical scanning circuit 30I of the solid-state imaging device 10I according to the tenth embodiment.

A difference between the solid-state imaging device 10I according to the tenth embodiment and the solid-state imaging device 10H according to the ninth embodiment described above is as follows. In the solid-state imaging device 10I according to the tenth embodiment, similar to a relationship between the first embodiment and the ninth embodiment, the level determination part 321I includes a counter CNT31I instead of the comparator.

In the tenth embodiment, similarly to the second embodiment described above, in the second duration PSCD, while the first signal S31 and the second signal S32 are set to the inactive L level to turn off the first signal S31 and the second signal S32, the third signal S33 is switched to the active H level. In this way, the third switch SW33 is turned on, the second node ND32 is connected to the second power-source potential line Lvgnd, and the second node ND32 is stepped down up to a potential (vgnd−vx (for example, vref)) by capacitive coupling of the external capacitor Cext31. The step-down voltage (vgnd−vx (vref)) is supplied from the second node ND32 to the second power-source voltage terminal TVGND of the row driver 310J as a voltage to be supplied lower than the negative power-source voltage (second power-source voltage).

In the tenth embodiment, when the count value, that is, the number of clocks CLK0 changes, the potential level VND32 (vgnd−vx) of the second node ND32 can be adjusted.

Other configurations are similar to those of the ninth embodiment. According to the tenth embodiment, a similar effect to that of the first and ninth embodiments described above can be obtained.

Eleventh Embodiment

Figure 25:
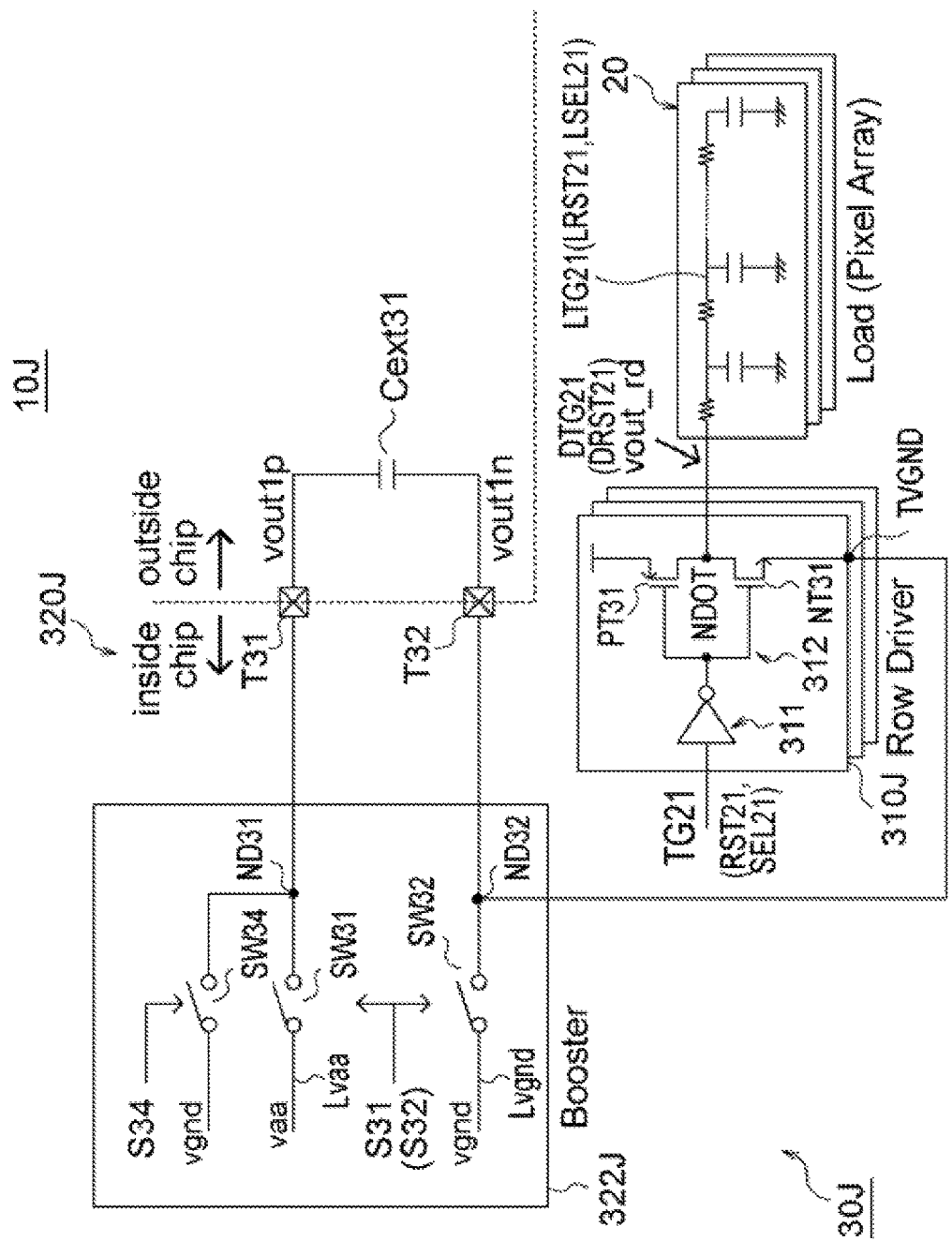
FIG. 25 is a diagram illustrating a configuration example of a pixel part and a vertical scanning circuit of a solid-state imaging device according to an eleventh embodiment of the invention.
Figure 26:
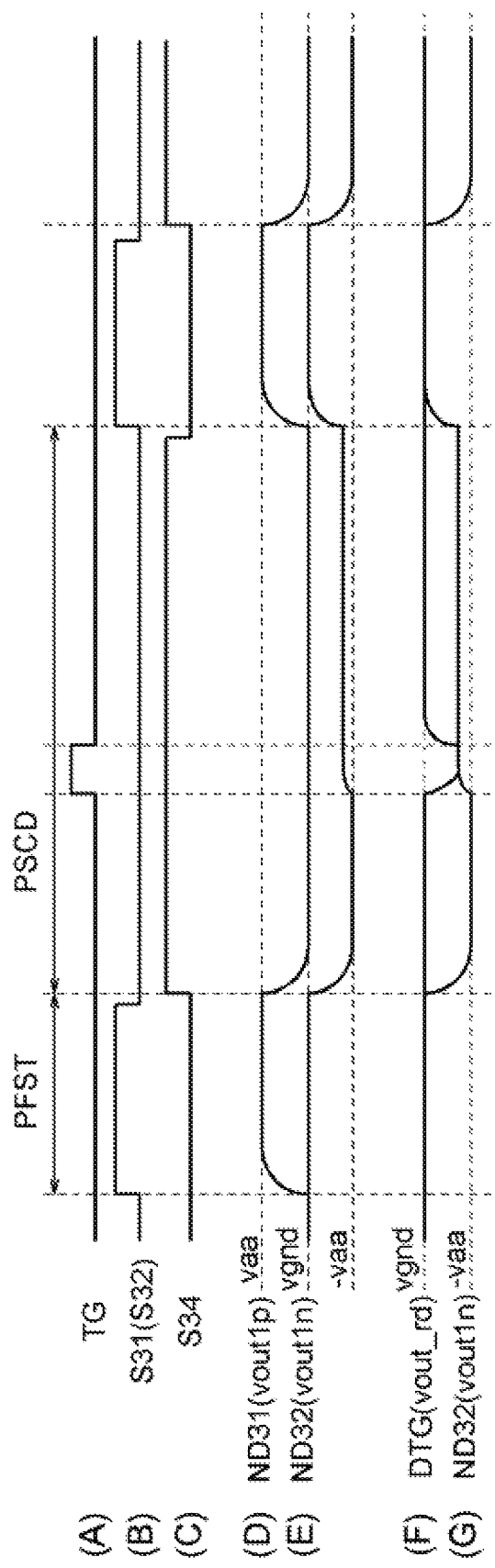
FIG. 26 is a timing chart of a voltage generation operation, etc. of a voltage supply part and a row driver in the vertical scanning circuit of the solid-state imaging device according to the eleventh embodiment.

FIG. 25 is a diagram illustrating a configuration example of a pixel part and a vertical scanning circuit of a solid-state imaging device according to an eleventh embodiment of the invention. FIG. 26 is a timing chart of a voltage generation operation, etc. of a voltage supply part 320J and a row driver 310J in the vertical scanning circuit 30J of the solid-state imaging device 10J according to the eleventh embodiment.

A difference between the solid-state imaging device 10J according to the eleventh embodiment and the solid-state imaging device 10B according to the third embodiment described above is as follows. In the voltage supply part 320J of the solid-state imaging device 10J according to the eleventh embodiment, instead of generating a voltage higher than the positive power-source voltage vaa, a voltage lower than the negative power-source voltage vgnd is generated and supplied to the second power-source voltage terminal TVGND of the row driver 310J.

Specifically, instead of providing the third switch SW33, the fourth switch SW34 that selectively connects between the second power-source potential line Lvgnd of the second power supply potential vgnd and the first node ND31 in accordance with the fourth signal S34 is provided. In the case of including the fourth switch SW34, the second node ND32 is connected to the second power-source voltage terminal TVGND of the row driver 310J.

In the voltage supply part 320J of the eleventh embodiment, in the first duration PFST, the first switch SW31 and the second switch SW32 are turned on by the first signal S31 and the second signal S32 at the active H level, and the fourth switch SW34 is turned off by the fourth signal S34 at the inactive L level, so that the potential of the first node ND31 is set to the first power-source potential vaa, and the potential of the second node ND32 is set to the second power-source potential vgnd corresponding to the reference potential.

Subsequently, in the second duration PSCD, the first signal S31 and the second signal S32 are switched to the inactive L level to turn off the first switch SW31 and the second switch SW32, and the fourth signal S34 is switches to the active H level and turns on the fourth switch SW34. In this way, the potential of the second node ND32 is lower than the second power-source potential vgnd, and is set to a potential −vaa corresponding to the potential of the first power-source potential vaa on the negative side.

In the row driver 310J, upon reception of the control signal TG21, the drive control signal DTG21 at a level of a voltage −vaa supplied from the voltage supply part 320C is applied to the corresponding drive control line LTG21.

Electric charges of the external capacitor Cext31 are divided by the capacitor Cext31 and the load capacity of the pixel array of the pixel part 20, and a voltage of the drive control signal DTG21 (vout1p) becomes slightly higher than the supplied voltage (−vaa).

According to the eleventh embodiment, a similar effect to that of the third embodiment described above can be obtained.

Twelfth Embodiment

Figure 27:
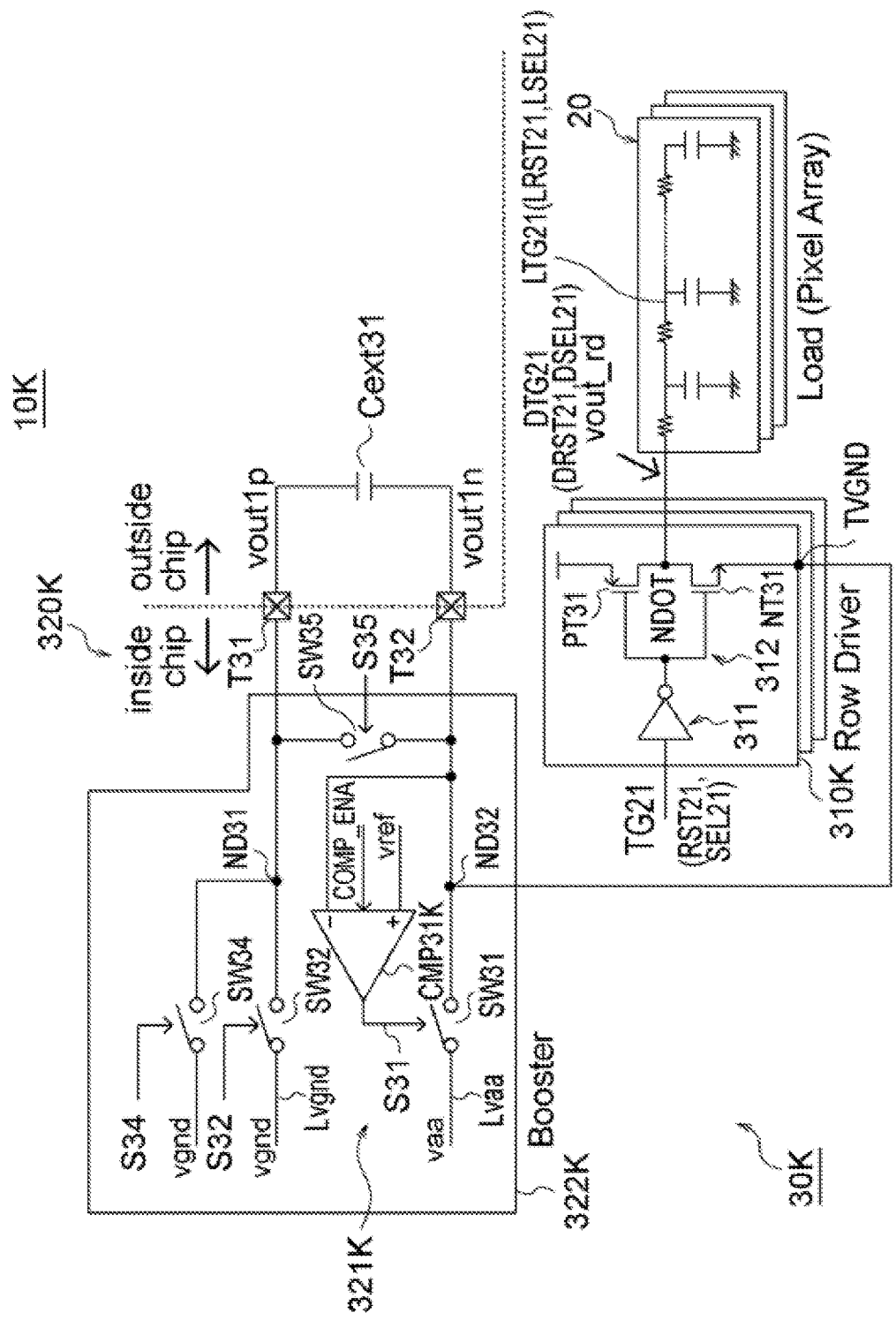
FIG. 27 is a diagram illustrating a configuration example of a pixel part and a vertical scanning circuit of a solid-state imaging device according to a twelfth embodiment of the invention.
Figure 28:
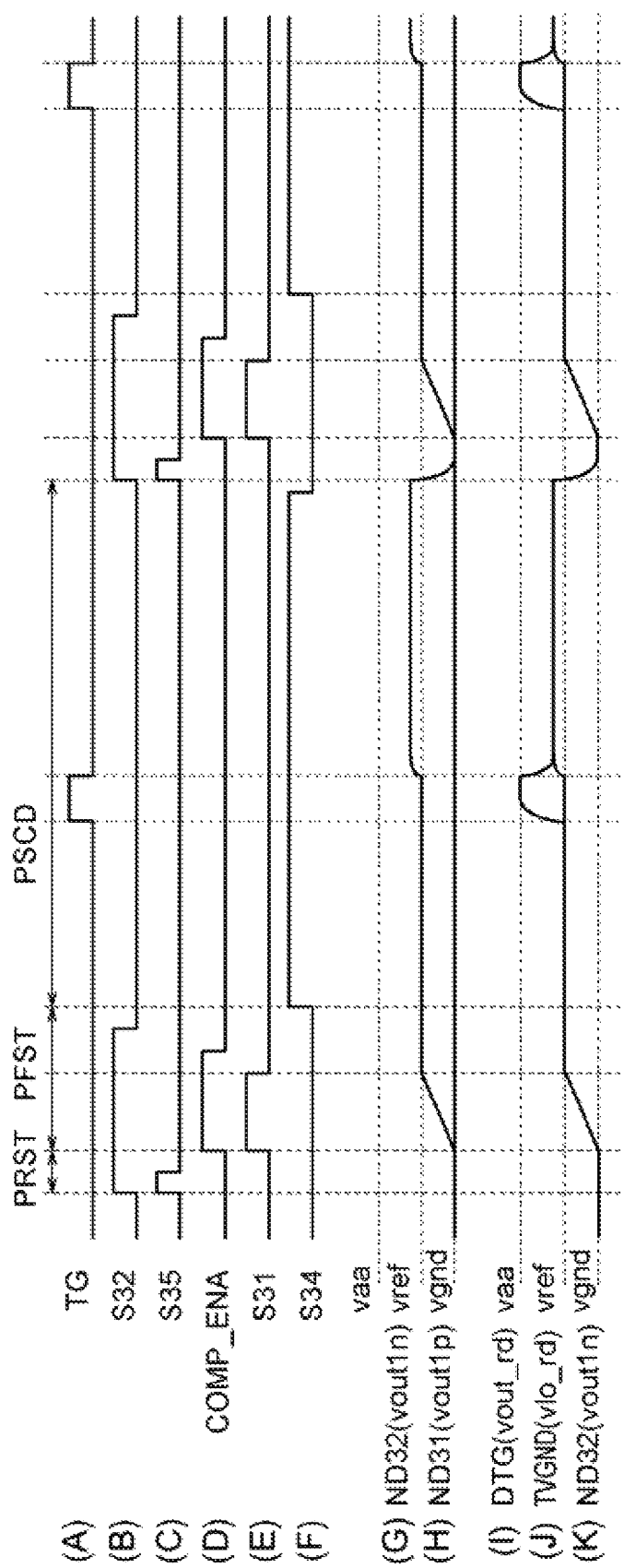
FIG. 28 is a timing chart of a voltage generation operation, etc. of a voltage supply part and a row driver in the vertical scanning circuit of the solid-state imaging device according to the twelfth embodiment.

FIG. 27 is a diagram illustrating a configuration example of a pixel part and a vertical scanning circuit of a solid-state imaging device according to a twelfth embodiment of the invention. FIG. 28 is a timing chart of a voltage generation operation, etc. of a voltage supply part 320K and a row driver 310K in the vertical scanning circuit 30K of the solid-state imaging device 10K according to the twelfth embodiment.

A difference between the solid-state imaging device 10K according to the twelfth embodiment and the solid-state imaging device 10H according to the ninth embodiment described above is as follows. In the voltage supply part 320K of the solid-state imaging device 10K according to the twelfth embodiment, instead of generating a voltage lower than the negative power-source voltage vgnd, a voltage higher than the negative power-source voltage vgnd is generated and supplied to the second power-source voltage terminal TVGND of the row driver 310K. The solid-state imaging device 10K according to the twelfth embodiment is different from the solid-state imaging device 10H according to the ninth embodiment in a configuration of the voltage supply part 320K.

The voltage supply part 320K generates a voltage higher than the second power-source voltage (negative power-source voltage) vgnd, for example, (vgnd+vref), and supplies the generated voltage to the row driver 310K.

The first switch SW31 selectively connects between the first power-source potential line Lvaa and the second node ND32 in accordance with the first signal S31. The second switch SW32 selectively connects between the second power-source potential line Lvgnd and the first node ND31 in accordance with the second signal S32. The fourth switch SW34 selectively connects between the second power-source potential line Lvgnd and the first node ND31 in accordance with the fourth signal S34. As described above, in the voltage supply part 320K including the fourth switch SW34, the second node ND32 is connected to the second power-source voltage terminal TVGND of the row driver 310K. Further, the fifth switch SW35 is formed of, for example, an NMOS transistor, and selectively connects between the first node ND31 and the second node ND32 in accordance with the fifth signal S35.

The level determination part 321K of the twelfth embodiment includes a comparator CMP31K whose non-inverted input (+) is connected to a supply line of the reference voltage vref and whose inverted input terminal (−) is connected to the second node ND32.

The comparator CMP31K compares the potential level VND32 of the second node ND32 with the reference voltage vref, and outputs the first signal S31 at the active H level to the first switch SW31 to turn on the first switch SW31 when the potential level VND32 of the second node ND32 is lower than the reference voltage vref. In a case in which the potential level VND32 of the second node ND32 has reached the reference voltage vref, the comparator CMP31C outputs the first signal S31 at the inactive L level to the first switch SW31 to turn off the first switch SW31.

At the time of generating a voltage (vgnd+vref) higher than the negative power-source voltage supplied to the row driver 310K, the voltage supply part 320K in the twelfth embodiment generates the voltage (vgnd+vref) higher than the negative power-source voltage vgnd at a desired level and supplies the generated voltage to the row driver 310K through the reset duration PRST, the first duration PFST, and the second duration PSCD.

Specific control timing is similar to that in a case in which the boosted voltage is −vref. However, since the first node ND31 is connected to the second power-source potential line Lvgnd when the voltage level of the second node ND32 becomes +vref, it can be considered that this operation is not pump-up. The boost voltage +vref is adjustable when the reference voltage vref changes.

According to the twelfth embodiment, a similar effect to that of the ninth embodiment described above can be obtained.

Thirteenth Embodiment

Figure 29:
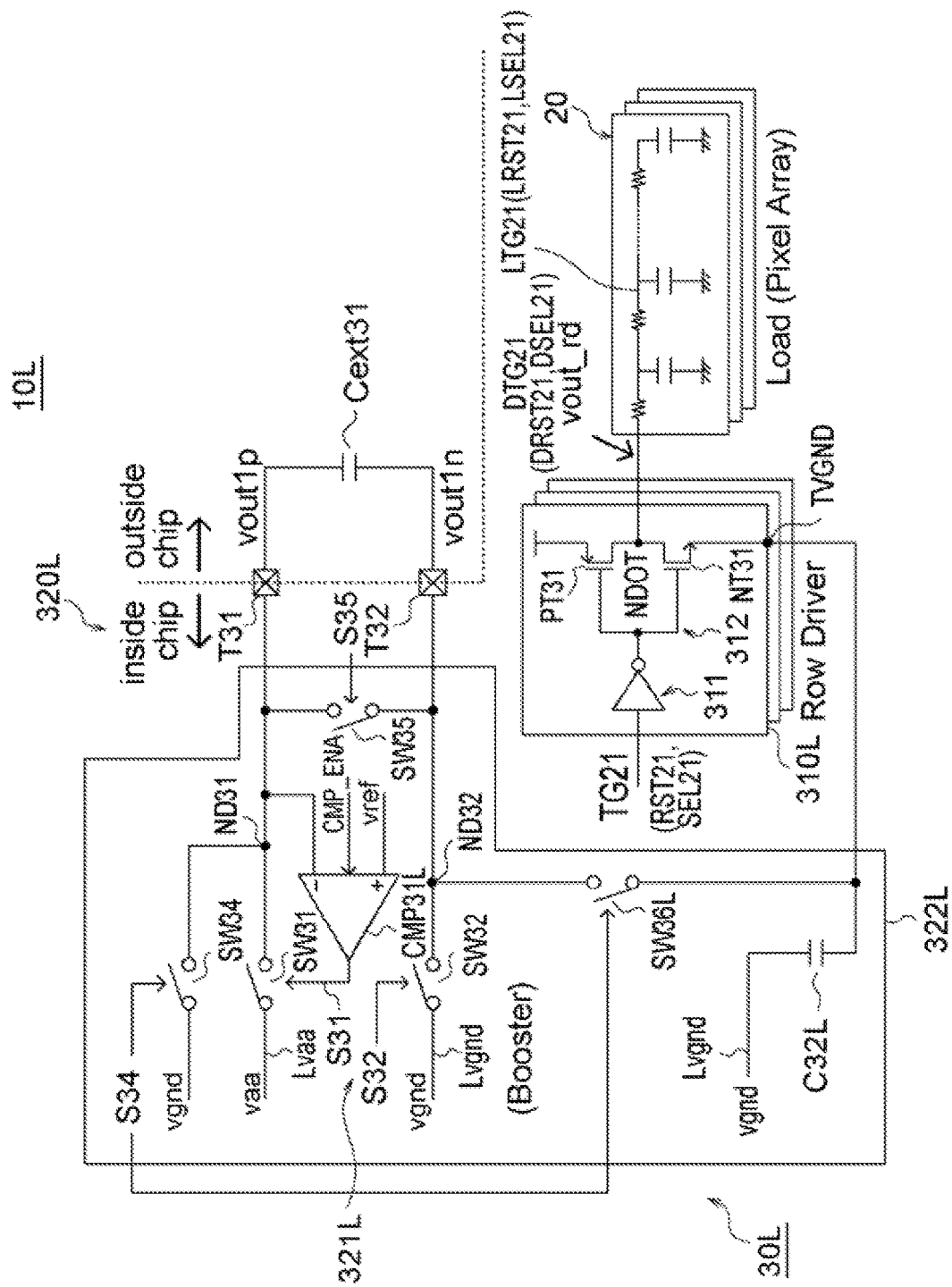
FIG. 29 is a diagram illustrating a configuration example of a pixel part and a vertical scanning circuit of a solid-state imaging device according to a thirteenth embodiment of the invention.
Figure 30:
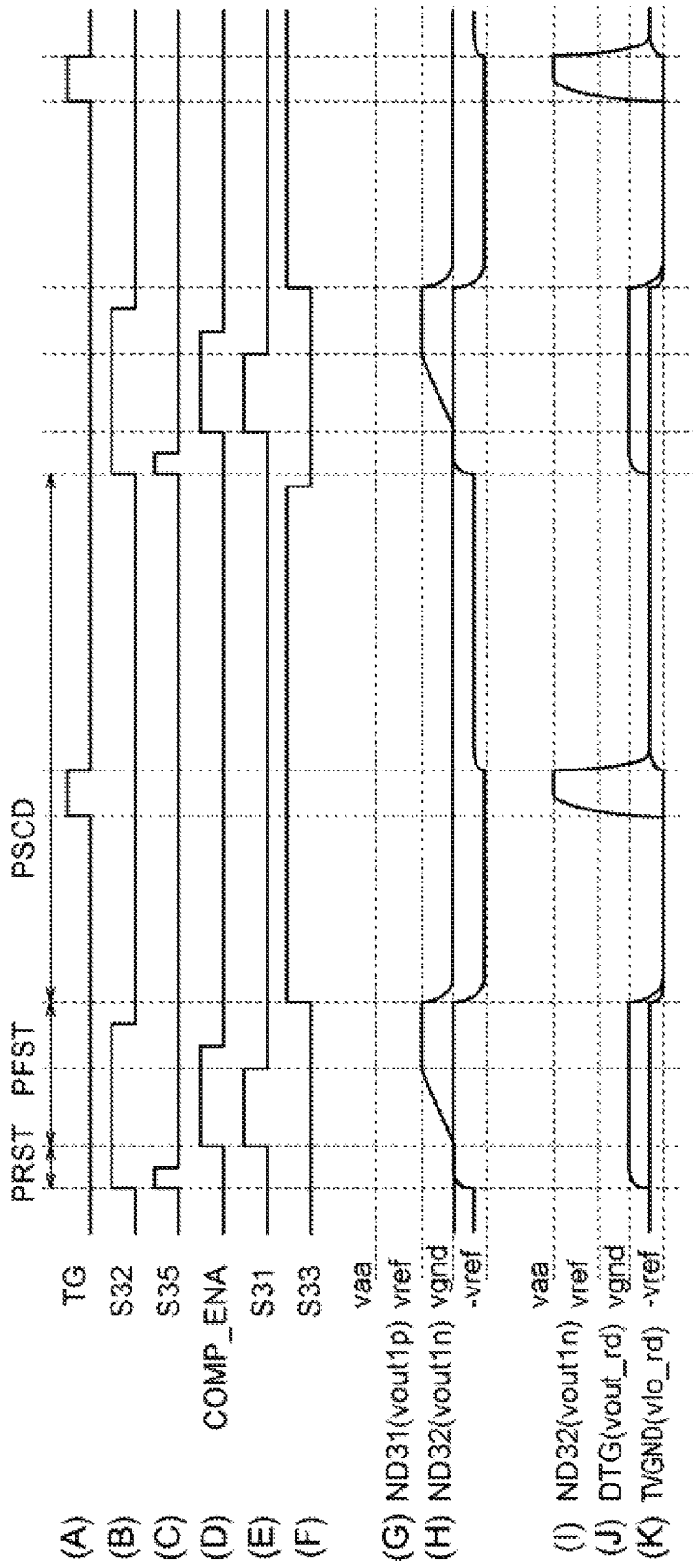
FIG. 30 is a timing chart of a voltage generation operation, etc. of a voltage supply part and a row driver in the vertical scanning circuit of the solid-state imaging device according to the thirteenth embodiment.

FIG. 29 is a diagram illustrating a configuration example of a pixel part and a vertical scanning circuit of a solid-state imaging device according to a thirteenth embodiment of the invention. FIG. 30 is a timing chart of a voltage generation operation, etc. of a voltage supply part 320L and a row driver 310L in the vertical scanning circuit 30L of the solid-state imaging device 10L according to the thirteenth embodiment.

A difference between the solid-state imaging device 10L according to the thirteenth embodiment and the solid-state imaging device 10H according to the ninth embodiment described above is as follows. In the voltage supply part 320L of the solid-state imaging device 10L according to the thirteenth embodiment, a switch SW36L is connected between the second node ND32 and the second power-source voltage terminal TVGND of the row driver 310L, and a capacitor C32L is connected between the second power-source voltage terminal TVGND and the second power-source potential line Lvgnd of the negative power-source potential vgnd. Similarly to the fourth switch SW34, the switch SW36L is on/off controlled by the fourth signal S34, and selectively connects between the second node ND32 and the second power-source voltage terminal TVGND in accordance with the fourth signal S34.

That is, in the thirteenth embodiment, in the second duration PSCD, the fourth switch SW34 is turned on, the first node ND31 is connected to the second power-source potential line Lvgnd, and the second node ND32 is stepped down to the potential (−vref) on the negative side by capacitive coupling of the external capacitor Cext31. At the same time, the switch SW36L is turned on. While the switch SW36L is turned on, the step-down voltage (−vref) is supplied from the second node ND32 to the second power-source voltage terminal TVGND of the row driver 310L as a voltage to be supplied lower than the negative power-source voltage (second power-source voltage). In addition, the voltage level of the second power-source voltage terminal TVGND is held at a stable level by the capacitor C32L.

Other configurations are similar to those of the ninth embodiment described above. According to the thirteenth embodiment, not only a similar effect to that of the ninth embodiment described above can be obtained, but it is also possible to realize more excellent step-down voltage supply operation.

Fourteenth Embodiment

Figure 31:
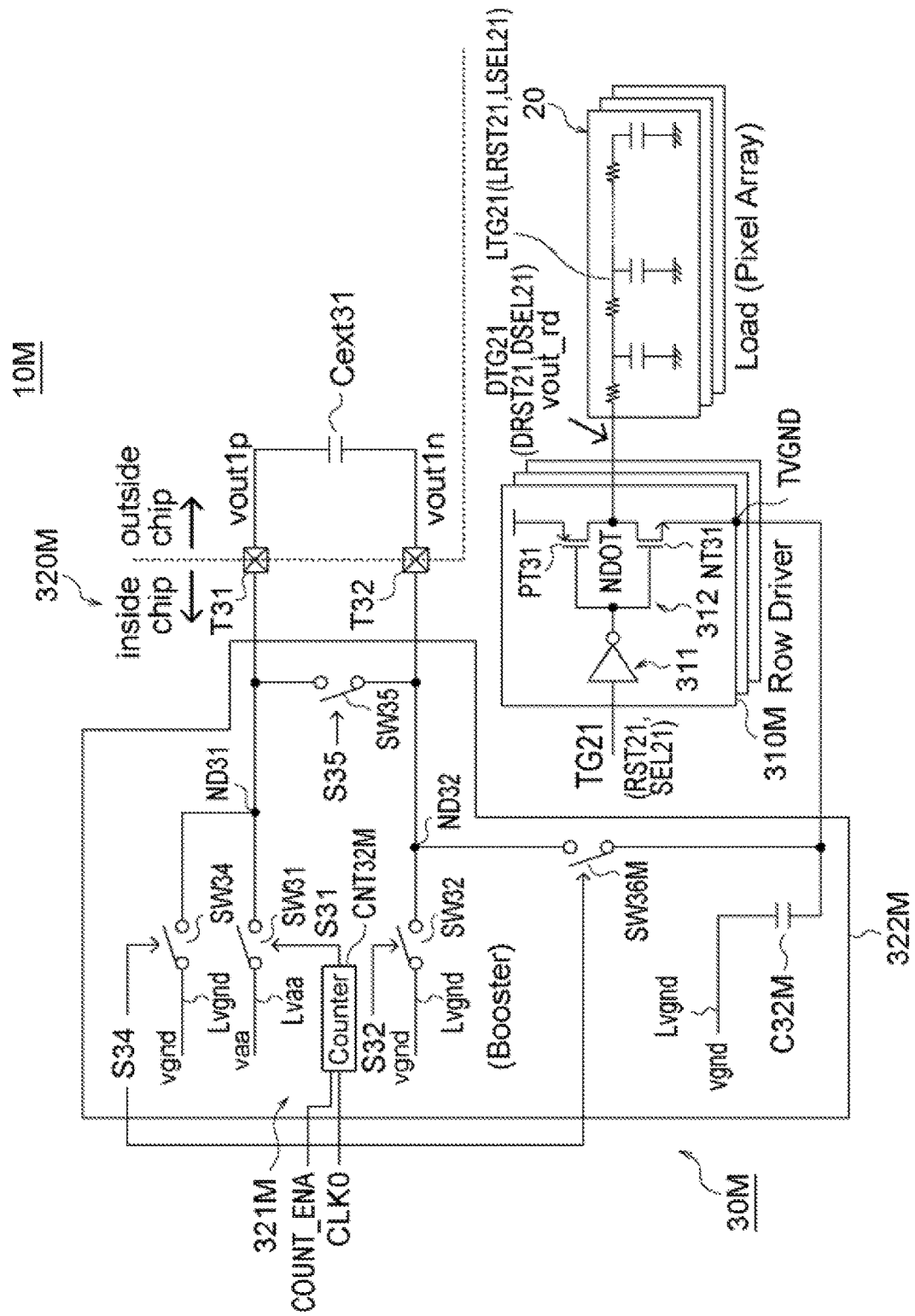
FIG. 31 is a diagram illustrating a configuration example of a pixel part and a vertical scanning circuit of a solid-state imaging device according to a fourteenth embodiment of the invention.
Figure 32:
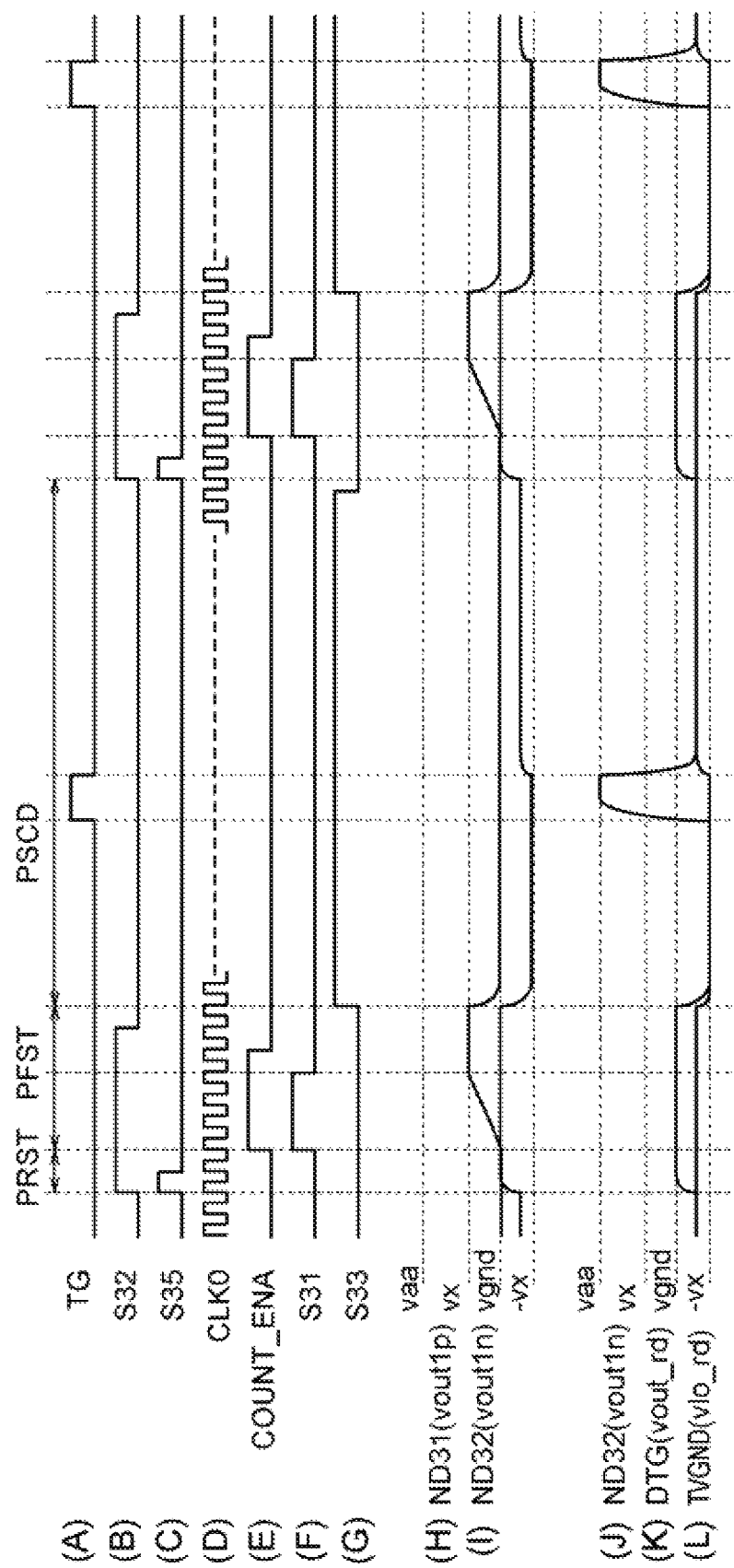
FIG. 32 is a timing chart of a voltage generation operation, etc. of a voltage supply part and a row driver in the vertical scanning circuit of the solid-state imaging device according to the fourteenth embodiment.

FIG. 31 is a diagram illustrating a configuration example of a pixel part and a vertical scanning circuit of a solid-state imaging device according to a fourteenth embodiment of the invention. FIG. 32 is a timing chart of a voltage generation operation, etc. of a voltage supply part 320M and a row driver 310M in the vertical scanning circuit 30M of the solid-state imaging device 10M according to the fourteenth embodiment.

A difference between the solid-state imaging device 10M according to the fourteenth embodiment and the solid-state imaging device 10I according to the tenth embodiment described above is as follows. In the voltage supply part 320M of the solid-state imaging device 10M according to the fourteenth embodiment, a switch SW36M is connected between the second node ND32 and the second power-source voltage terminal TVGND of the row driver 310M, and a capacitor C32M is connected between the second power-source voltage terminal TVGND and the second power-source potential line Lvgnd of the negative power-source potential vgnd. Similarly to the fourth switch SW34, the switch SW36M is on/off controlled by the fourth signal S34, and selectively connects between the second node ND32 and the second power-source voltage terminal TVGND in accordance with the fourth signal S34.

That is, in the fourteenth embodiment, in the second duration PSCD, the fourth switch SW34 is turned on, the first node ND31 is connected to the second power-source potential line Lvgnd, and the second node ND32 is stepped down to the potential (−vx (for example, vref)) on the negative side by capacitive coupling of the external capacitor Cext31. At the same time, the switch SW36M is turned on. While the switch SW36M is turned on, the step-down voltage (−vx (vref)) is supplied from the second node ND32 to the second power-source voltage terminal TVGND of the row driver 310M as a voltage to be supplied lower than the negative power-source voltage (second power-source voltage). In addition, the voltage level of the second power-source voltage terminal TVGND is held at a stable level by the capacitor C32M.

Other configurations are similar to those of the tenth embodiment described above. According to the fourteenth embodiment, not only a similar effect to that of the tenth embodiment described above can be obtained, but it is also possible to realize more excellent step-down voltage supply operation.

Fifteenth Embodiment

Figure 33:
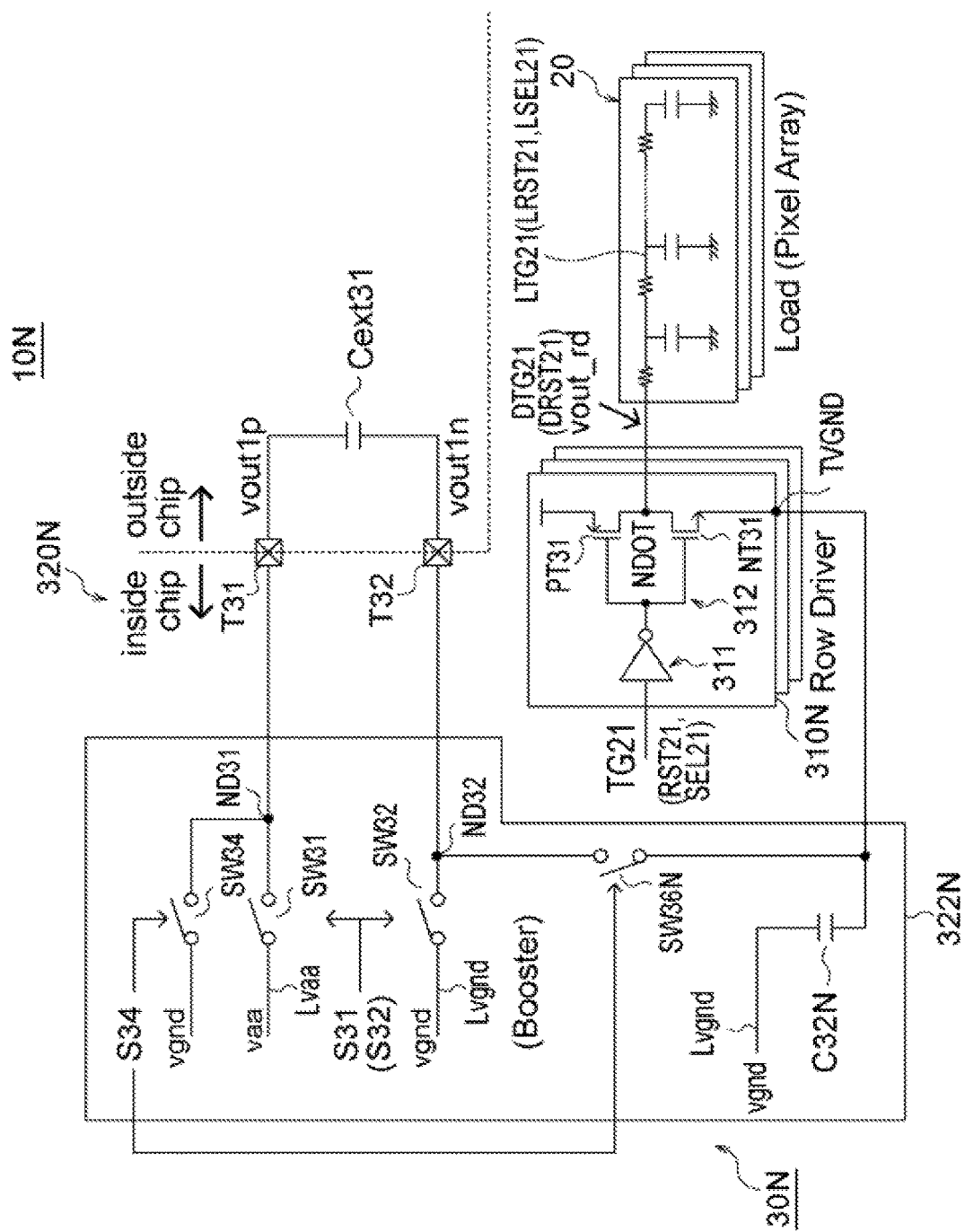
FIG. 33 is a diagram illustrating a configuration example of a pixel part and a vertical scanning circuit of a solid-state imaging device according to a fifteenth embodiment of the invention.
Figure 34:
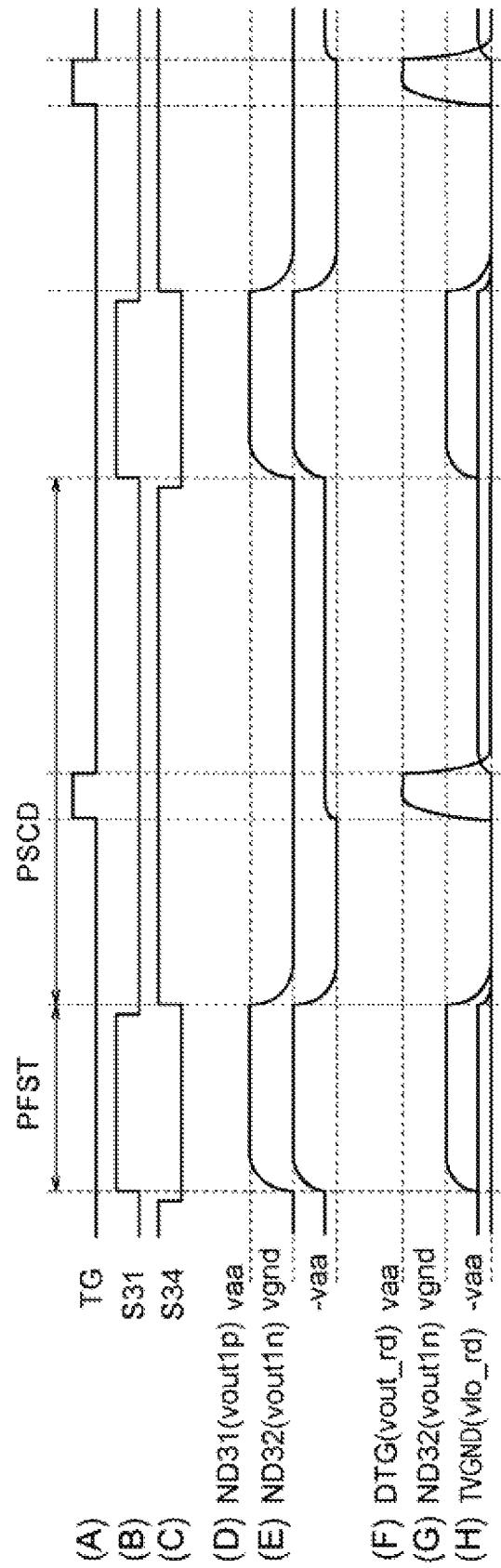
FIG. 34 is a timing chart of a voltage generation operation, etc. of a voltage supply part and a row driver in the vertical scanning circuit of the solid-state imaging device according to the fifteenth embodiment.

FIG. 33 is a diagram illustrating a configuration example of a pixel part and a vertical scanning circuit of a solid-state imaging device according to a fifteenth embodiment of the invention. FIG. 34 is a timing chart of a voltage generation operation, etc. of a voltage supply part 320N and a row driver 310N in the vertical scanning circuit 30N of the solid-state imaging device 10N according to the fifteenth embodiment.

A difference between the solid-state imaging device 10N according to the fifteenth embodiment and the solid-state imaging device 10M according to the eleventh embodiment described above is as follows. In the voltage supply part 320N of the solid-state imaging device 10N according to the fifteenth embodiment, a switch SW36N is connected between the second node ND32 and the second power-source voltage terminal TVGND of the row driver 310N, and a capacitor C32N is connected between the second power-source voltage terminal TVGND and the second power-source potential line Lvgnd of the negative power-source potential vgnd. Similarly to the fourth switch SW34, the switch SW36N is on/off controlled by the fourth signal S34, and selectively connects between the second node ND32 and the second power-source voltage terminal TVGND in accordance with the fourth signal S34.

That is, in the fifteenth embodiment, in the second duration PSCD, the fourth switch SW34 is turned on, the first node ND31 is connected to the second power-source potential line Lvgnd, and the second node ND32 is stepped down to the potential (−vaa) on the negative side by capacitive coupling of the external capacitor Cext31. At the same time, the switch SW36N is turned on. While the switch SW36N is turned on, the step-down voltage (−vaa) is supplied from the second node ND32 to the second power-source voltage terminal TVGND of the row driver 310N as a voltage to be supplied lower than the negative power-source voltage (second power-source voltage). In addition, the voltage level of the second power-source voltage terminal TVGND is held at a stable level by the capacitor C32N.

Other configurations are similar to those of the eleventh embodiment described above. According to the fifteenth embodiment, not only a similar effect to that of the eleventh embodiment described above can be obtained, but it is also possible to realize more excellent step-down voltage supply operation.

Sixteenth Embodiment

Figure 35:
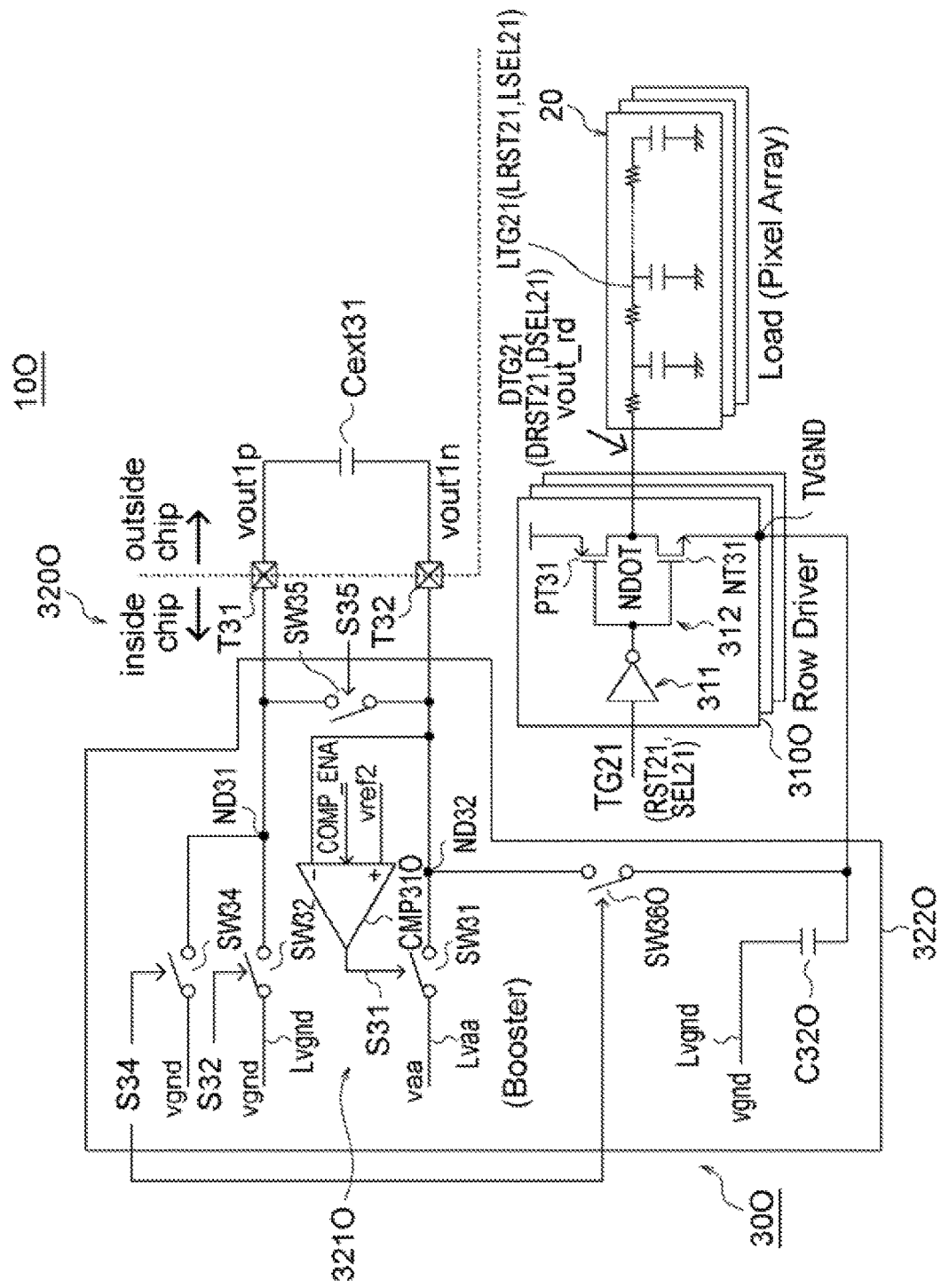
FIG. 35 is a diagram illustrating a configuration example of a pixel part and a vertical scanning circuit of a solid-state imaging device according to a sixteenth embodiment of the invention.
Figure 36:
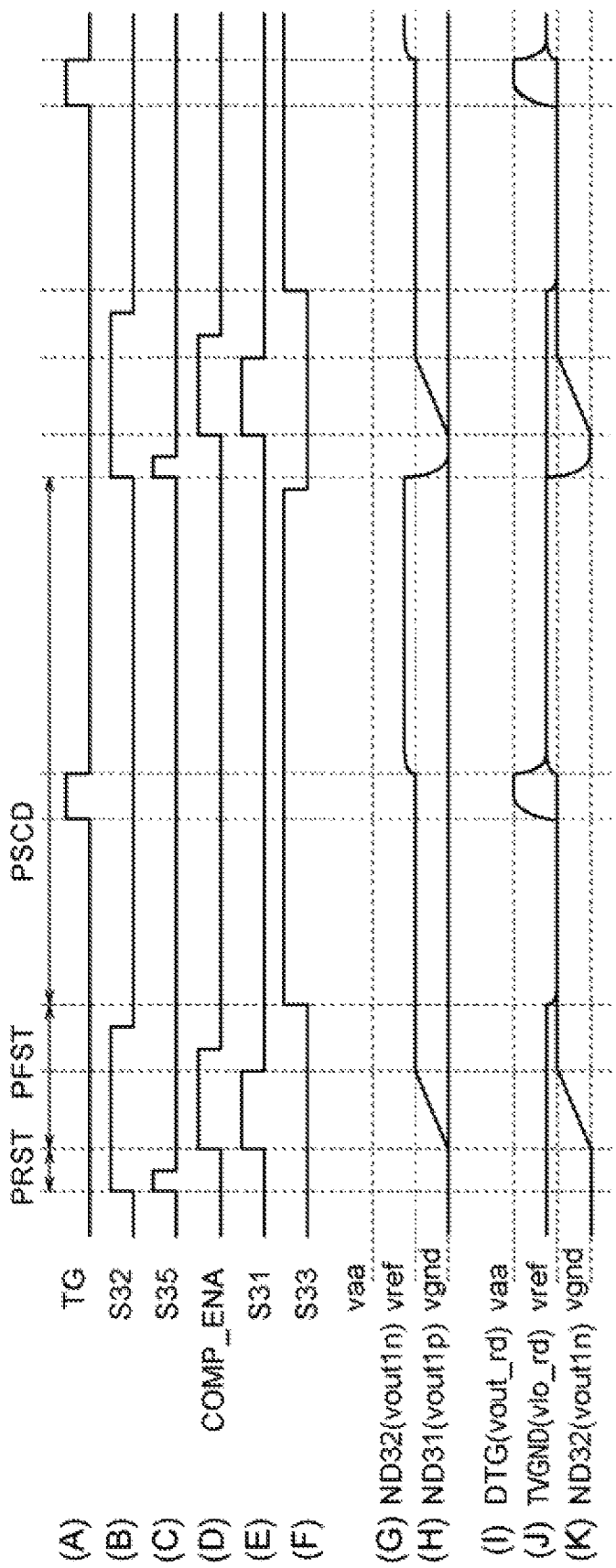
FIG. 36 is a timing chart of a voltage generation operation, etc. of a voltage supply part and a row driver in the vertical scanning circuit of the solid-state imaging device according to the sixteenth embodiment.

FIG. 35 is a diagram illustrating a configuration example of a pixel part and a vertical scanning circuit of a solid-state imaging device according to a sixteenth embodiment of the invention. FIG. 36 is a timing chart of a voltage generation operation, etc. of a voltage supply part 320O and a row driver 310O in the vertical scanning circuit 30O of the solid-state imaging device 10O according to the sixteenth embodiment.

A difference between the solid-state imaging device 10O according to the sixteenth embodiment and the solid-state imaging device 10K according to the twelfth embodiment described above is as follows. In the voltage supply part 320O of the solid-state imaging device 10O according to the sixteenth embodiment, a switch SW36O is connected between the second node ND32 and the second power-source voltage terminal TVGND of the row driver 310O, and a capacitor C32O is connected between the second power-source voltage terminal TVGND and the second power-source potential line Lvgnd of the negative power-source potential vgnd. Similarly to the fourth switch SW34, the switch SW36O is on/off controlled by the fourth signal S34, and selectively connects between the second node ND32 and the second power-source voltage terminal TVGND in accordance with the fourth signal S34.

That is, in the sixteenth embodiment, in the second duration PSCD, the fourth switch SW34 is turned on, the first node ND31 is connected to the second power-source potential line Lvgnd, and the second node ND32 is boosted to the potential (vref) on the positive side by capacitive coupling of the external capacitor Cext31. At the same time, the switch SW36O is turned on. While the switch SW36O is turned on, the boosted voltage (vref) is supplied from the second node ND32 to the second power-source voltage terminal TVGND of the row driver 310O as a voltage to be supplied higher than the negative power-source voltage (second power-source voltage). In addition, the voltage level of the second power-source voltage terminal TVGND is held at a stable level by the capacitor C32O.

Other configurations are similar to those of the twelfth embodiment described above. According to the sixteenth embodiment, not only a similar effect to that of the twelfth embodiment described above can be obtained, but it is also possible to realize more excellent boosted voltage supply operation.

The solid-state imaging devices 10 and 10A to 10O described above can be applied as imaging devices to electronic apparatuses such as a digital camera, a video camera, a portable terminal, a surveillance camera, a medical endoscope camera, etc.

Figure 37:
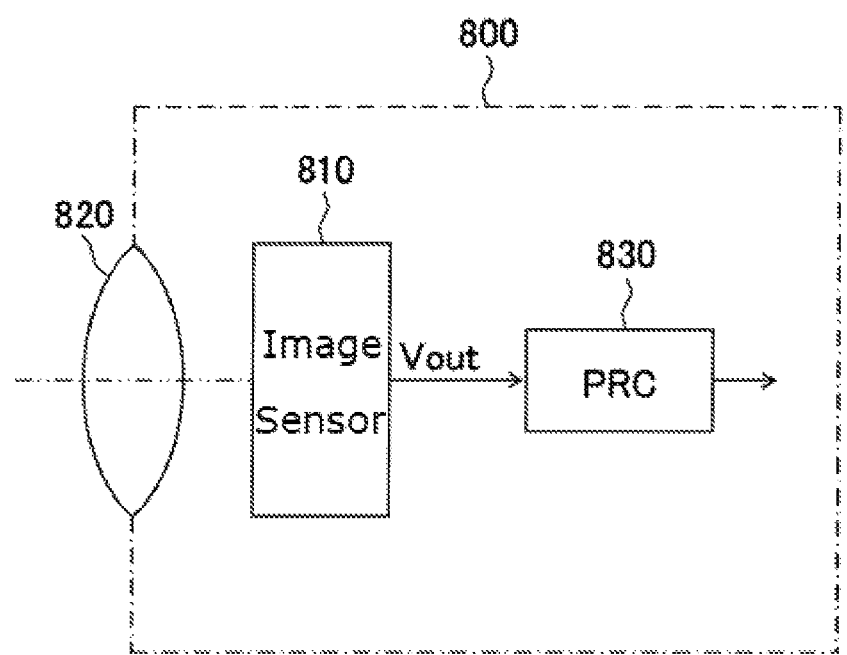
FIG. 37 is a diagram illustrating an example of a configuration of an electronic apparatus to which a solid-state imaging device according to an embodiment of the invention is applied.

FIG. 37 is a diagram illustrating an example of a configuration of an electronic apparatus to which a solid-state imaging device according to an embodiment of the invention is applied.

As illustrated in FIG. 37, the electronic apparatus 800 includes a CMOS image sensor 810 to which the solid-state imaging devices 10 and 10A to 10O according to the present embodiments are applicable. Further, the electronic apparatus 800 includes an optical system (lens, etc.) 820 that guides incident light to a pixel area of the CMOS image sensor 810. The electronic apparatus 800 includes a signal processing circuit (PRC) 830 that processes an output signal of the CMOS image sensor 810.

The signal processing circuit 830 performs predetermine signal processing on an output signal of the CMOS image sensor 810. Various modes can be adopted for an image signal processed by the signal processing circuit 830. For example, the image signal can be displayed as a moving image on a monitor including a liquid crystal display, etc., output to a printer, or directly recorded on a recording medium such as a memory card.

As described above, by mounting the solid-state imaging devices 10 and 10A to 10O described above as the CMOS image sensor 810, it is possible to provide a high-performance, small-sized, and low-cost camera system. Further, it is possible to realize an electronic apparatus such as a surveillance camera, a medical endoscope camera, etc. used for applications having restrictions on camera installation requirements such as a mounting size, the number of connectable cables, a cable length, an installation height, etc.

What is claimed is:

1. A solid-state imaging device comprising:
a pixel part in which a plurality of pixels are disposed in a matrix; and
a reading part configured to read pixel signals from the pixel part in units of one or more rows by applying, to a control signal line, a drive control signal at a predetermined level in accordance with a control signal,
wherein the reading part includes:
a driver configured to apply the drive control signal at a voltage level supplied upon reception of the control signal to the control signal line corresponding to the driver; and
a voltage supply part configured to supply a voltage different from a first power-source voltage or a voltage different from a second power-source voltage to the driver, and
wherein the voltage supply part includes:
a first node;
a second node;
a capacitor including a first electrode and a second electrode, the first electrode being connected with the first node, the second electrode being connected with the second node;
a first power-source potential;
a second power-source potential;
a first switch configured to selectively connect between the first power-source potential and the first node or the second node in accordance with a first signal;
a second switch configured to selectively connect between the second power-source potential and the second node or the first node in accordance with a second signal; and at least one of a third switch and a fourth switch, the third switch being configured to selectively connect between the first power-source potential and the second node in accordance with a third signal, the fourth switch being configured to selectively connect between the second power-source potential and the first node in accordance with a fourth signal, wherein when the voltage supply part includes the third switch, the first node is connected with a first power-source voltage terminal of the driver, and wherein when the voltage supply part includes the fourth switch, the second node is connected with a second power-source voltage terminal of the driver.

2. The solid-state imaging device according to claim 1, wherein when including the third switch configured to selectively connect between the first power-source potential and the second node in accordance with the third signal so as to supply a voltage higher than the first power-source voltage on a positive side to driver:

in a first duration, the voltage supply part sets a potential of the first node to be the first power-source potential and sets a potential of the second node to be the second power-source potential as a reference potential by turning on the first and second switches through the first and second signals that are active and turning off the third switch through the third signal that is inactive; and in a second duration, the voltage supply part sets the potential of the first node to be a potential up to a potential higher than the first power-source potential by a predetermined potential by setting the first and second signals to be inactive to turn off the first and second switches and setting the third signal to be active to turn on the third switch, and wherein while receiving supply of a voltage higher than the first power-source voltage generated in the second duration, the driver receives the control signal and applies the drive control signal at a voltage level higher than the first power-source voltage to the control signal line corresponding to the driver.

3. The solid-state imaging device according to claim 1, wherein when including the third switch configured to selectively connect between the first power-source potential and the second node in accordance with the third signal so as to supply a voltage lower than the first power-source voltage on a positive side to the driver:

in a first duration, the voltage supply part sets a potential of the first node to be the second power-source potential as a reference potential and sets a potential of the second node to be the first power-source potential by turning on the first and second switches through the first and second signals that are active and turning off the third switch through the third signal that is inactive; and in a second duration, the voltage supply part sets the potential of the first node to be a potential up to a potential lower than the first power-source potential by a predetermined potential by setting the first and second signals to be inactive to turn off the first and second switches and setting the third signal to be active to turn on the third switch, and while receiving supply of a voltage lower than the first power-source voltage generated in the second duration, the driver receives the control signal and applies the drive control signal at a voltage level lower than the first power-source voltage to the control signal line corresponding to the driver.

4. The solid-state imaging device according to claim 1, further comprising a switch configured to selectively connect between the first power-source voltage terminal of the driver on a positive side and the first node.

5. The solid-state imaging device according to claim 4, further comprising a capacitor connected with the first power-source voltage terminal of the driver on the positive side.

6. The solid-state imaging device according to claim 1, wherein when including the fourth switch configured to selectively connect between the second power-source potential and the first node in accordance with the fourth signal so as to supply a voltage lower than the second power-source voltage on a negative side to the driver:

in a first duration, the voltage supply part sets a potential of the first node to be the first power-source potential and sets a potential of the second node to be the second power-source potential as a reference potential by turning on the first and second switches through the first and second signals that are active and turning off the fourth switch through the fourth signal that is inactive; and in a second duration, the voltage supply part sets the potential of the second node to be a potential lower than the second power-source potential and up to a predetermined potential on the negative side by setting the first and second signals to be inactive to turn off the first and second switches and setting the fourth signal to be active to turn on the fourth switch, and while receiving supply of a voltage lower than the second power-source voltage generated in the second duration, the driver receives the control signal and applies the drive control signal at a voltage level lower than the second power-source voltage to the control signal line corresponding to the driver.

7. The solid-state imaging device according to claim 1, wherein when including the fourth switch configured to selectively connect between the second power-source potential and the first node in accordance with the fourth signal so as to supply a voltage higher than the second power-source voltage on the negative side to the driver:

in a first duration, the voltage supply part sets a potential of the first node to be the second power-source potential as a reference potential and sets a potential of the second node to be the first power-source potential by turning on the first and second switches through the first and second signals that are active and turning off the fourth switch through the fourth signal that is inactive; and in a second duration, the voltage supply part sets the potential of the second node to be a potential higher than the second power-source potential and up to a predetermined potential on the positive side by setting the first and second signals to be inactive to turn off the first and second switches and setting the fourth signal to be active to turn on the fourth switch, and while receiving supply of a voltage higher than the second power-source voltage generated in the second duration, the driver receives the control signal and applies the drive control signal at a voltage level higher than the second power-source voltage to the control signal line corresponding to the driver.

8. The solid-state imaging device according to claim 1, further comprising a switch configured to selectively connect between the second power-source voltage terminal of the driver on a negative side and the second node.

9. The solid-state imaging device according to claim 8, further comprising a capacitor connected with the second power-source voltage terminal of the driver on the negative side.

10. The solid-state imaging device according to claim 2, wherein the voltage supply part includes a level determination part configured to turn on the first switch by outputting the first signal that is active to the first switch when determining that a potential level of the first node or the second node has not reached a reference voltage and turn off the first switch by outputting the first signal that is inactive to the first switch when determining that the potential level of the first node or the second node has reached the reference voltage.

11. The solid-state imaging device according to claim 10, wherein the level determination part includes a comparator configured to compare the potential level of the first node or the second node with the reference voltage, turn on the first switch by outputting the first signal that is active to the first switch when the potential level of the first node or the second node has not reached the reference voltage, and turn off the first switch by outputting the first signal that is inactive to the first switch when the potential level of the first node or the second node has reached the reference voltage.

12. The solid-state imaging device according to claim 10, wherein the level determination part includes a counter configured to count a clock, turn on the first switch by outputting the first signal that is active to the first switch when a count value is equal to a value corresponding to a case in which the potential level of the first node or the second node has not reached the reference voltage, and turn off the first switch by outputting the first signal that is inactive to the first switch when the count value has reached a value corresponding to a case in which the potential level of the first node or the second node has reached the reference voltage.

13. The solid-state imaging device according to claim 10, wherein
   the level determination part performs level determination processing when an enable signal is active,
   the voltage supply part includes a fifth switch configured to selectively connect between the first node and the second node in accordance with a fifth signal, and
   when including the third switch configured to selectively connect between the first power-source potential and the second node in accordance with the third signal so as to supply a voltage higher or lower than the first power-source voltage on the positive side to the driver:
      in a reset duration before the first duration, while setting the enable signal to be inactive to hold the level determination part in a non-operational state and turning off the first switch through the first signal that is inactive, the voltage supply part sets the first and second nodes to be the second power-source potential for resetting by turning on the second and fifth switches through the second and fifth signals that are active and turning off the third switch through the third signal that is inactive; and
      in the first duration, the voltage supply part sets the enable signal to be active to hold the level determination part in an operational state and turns on the first switch through the first signal that is active.

14. The solid-state imaging device according to claim 10, wherein
   the level determination part performs level determination processing when an enable signal is active,
   the voltage supply part includes a fifth switch configured to selectively connect between the first node and the second node in accordance with a fifth signal, and
   when including the fourth switch configured to selectively connect between the second power-source potential and the first node in accordance with the fourth signal so as to supply a voltage lower or higher than the second power-source voltage on the negative side to the driver:
      in a reset duration before the first duration, while setting the enable signal to be inactive to hold the level determination part in a non-operational state and turning off the first switch through the first signal that is inactive, the voltage supply part sets the first and second nodes to be the second power-source potential for resetting by turning on the second and fifth switches through the second and fifth signals that are active and turning off the fourth switch through the fourth signal that is inactive; and
      in the first duration, the voltage supply part sets the enable signal to be active to hold the level determination part in an operational state and turns on the first switch through the first signal that is active.

15. The solid-state imaging device according to claim 1, wherein each of the plurality of pixels includes:
   a photoelectric conversion element configured to store electric charge generated through photoelectric conversion in a storage duration;
   a transfer element capable of transferring the electric charge stored at the photoelectric conversion element, in a transfer duration in which a transfer drive control signal is applied to a first drive control line;
   a floating diffusion to which the electric charge stored at the photoelectric conversion element is transferred through the transfer element;
   a source follower element configured to convert the electric charge at the floating diffusion into a voltage signal in accordance with the amount of the electric charge and output the converted signal to an output node; and
   a reset element configured to reset the floating diffusion to a predetermined potential in a reset duration in which a reset drive control signal is applied to a second drive control line.

16. A method for driving a solid-state imaging device including:
   a pixel part in which a plurality of pixels are disposed in a matrix; and
   a reading part configured to read pixel signals from the pixel part in units of one or more rows by applying, to a control signal line, a drive control signal at a predetermined level in accordance with a control signal,
   the reading part including:
      a driver configured to apply the drive control signal at a voltage level supplied upon reception of the control signal to the control signal line corresponding to the driver; and
      a voltage supply part configured to supply a voltage different from a first power-source voltage or a voltage different from a second power-source voltage to the driver,
   the voltage supply part including:

a first node;
a second node;
a capacitor including a first electrode and a second electrode, the first electrode being connected with the first node, the second electrode being connected with the second node;
a first power-source potential;
a second power-source potential;
a first switch configured to selectively connect between the first power-source potential and the first node or the second node in accordance with a first signal;
a second switch configured to selectively connect between the second power-source potential and the second node or the first node in accordance with a second signal; and
a third switch configured to selectively connect between the first power-source potential and the second node in accordance with a third signal, the first node being connected with a first power-source voltage terminal of the driver,
the method comprising:
in a first duration, setting a potential of the first node to be the first power-source potential and setting a potential of the second node to be the second power-source potential as a reference potential, or setting the potential of the first node to be the second power-source potential as a reference potential and setting the potential of the second node to be the first power-source potential, by turning on the first and second switches through the first and second signals that are active and turning off the third switch through the third signal that is inactive;
in a second duration, setting the potential of the first node to be a potential up to a potential higher than the first power-source potential by a predetermined potential, or setting the potential of the first node to be a potential up to a potential lower than the first power-source potential by a predetermined potential, by setting the first and second signals to be inactive to turn off the first and second switches and setting the third signal to be active to turn on the third switch; and
receiving, by the driver, the control signal while receiving supply of a voltage higher than the first power-source voltage generated in the second duration, and applying the drive control signal at a voltage level higher than the first power-source voltage to the control signal line corresponding to the driver, or
receiving, by the driver, the control signal while receiving supply of a voltage lower than the first power-source voltage generated in the second duration, and applying the drive control signal at a voltage level lower than the first power-source voltage to the control signal line corresponding to the driver.

17. A method for driving a solid-state imaging device including:
a pixel part in which a plurality of pixels are disposed in a matrix; and
a reading part configured to read pixel signals from the pixel part in units of one or more rows by applying, to a control signal line, a drive control signal at a predetermined level in accordance with a control signal,
the reading part including:
a driver configured to apply the drive control signal at a voltage level supplied upon reception of the control signal to the control signal line corresponding to the driver; and
a voltage supply part configured to supply a voltage different from a first power-source voltage or a voltage different from a second power-source voltage to the driver,
the voltage supply part including:
a first node;
a second node;
a capacitor including a first electrode and a second electrode, the first electrode being connected with the first node, the second electrode being connected with the second node;
a first power-source potential;
a second power-source potential;
a first switch configured to selectively connect between the first power-source potential and the first node or the second node in accordance with a first signal;
a second switch configured to selectively connect between the second power-source potential and the second node or the first node in accordance with a second signal; and
a fourth switch configured to selectively connect between the second power-source potential and the first node in accordance with a fourth signal, the second node being connected with a second power-source voltage terminal of the driver,
the method comprising:
in a first duration, setting a potential of the first node to be the first power-source potential and setting a potential of the second node to be the second power-source potential as a reference potential, or setting the potential of the first node to be the second power-source potential as a reference potential and setting the potential of the second node to be the first power-source potential, by turning on the first and second switches through the first and second signals that are active and turning off the fourth switch through the fourth signal that is inactive;
in a second duration, setting the potential of the second node to be a potential lower than the second power-source potential and up to the first power-source potential level on a negative side, or setting the potential of the second node to be a potential higher than the second power-source potential and up to a predetermined potential on a positive side, by setting the first and second signals to be inactive to turn off the first and second switches and setting the fourth signal to be active to turn on the fourth switch; and
receiving, by the driver, the control signal while receiving supply of a voltage lower than the second power-source voltage generated in the second duration, and applying the drive control signal at a voltage level lower than the second power-source voltage to the control signal line corresponding to the driver, or
receiving, by the driver, the control signal while receiving supply of a voltage higher than the second power-source voltage generated in the second duration, and applying the drive control signal at a voltage level higher than the second power-source voltage to the control signal line corresponding to the driver.

18. The method for driving a solid-state imaging device according to claim 16, wherein
the voltage supply part includes a level determination part, and
the level determination part turns on the first switch by outputting the first signal that is active to the first switch when determining that a potential level of the first node or the second node has not reached a reference voltage, and turns off the first switch by outputting the first signal that is inactive to the first switch when determining that the potential level of the first node or the second node has reached the reference voltage.

19. The method for driving a solid-state imaging device according to claim 16, wherein
level determination processing is performed by the level determination part when an enable signal is active,
the voltage supply part includes a fifth switch configured to selectively connect between the first node and the second node in accordance with a fifth signal, and
when including the third switch configured to selectively connect between the first power-source potential and the second node in accordance with the third signal so as to supply a voltage higher than the first power-source voltage on a positive side to the driver:
in a reset duration before the first duration, while setting the enable signal to be inactive to hold the level determination part in a non-operational state and turning off the first switch through the first signal that is inactive, the voltage supply part sets the first and second nodes to be the second power-source potential or the first power-source potential for resetting by turning on the second and fifth switches through the second and fifth signals that are active and turning off the third switch through the third signal that is inactive; and
in the first duration, the voltage supply part sets the enable signal to be active to hold the level determination part in an operational state and turns on the first switch through the first signal that is active.

20. The method for driving a solid-state imaging device according to claim 18, wherein
level determination processing is performed by the level determination part when an enable signal is active,
the voltage supply part includes a fifth switch configured to selectively connect between the first node and the second node in accordance with a fifth signal, and
when including the fourth switch configured to selectively connect between the second power-source potential and the first node in accordance with the fourth signal so as to supply a voltage lower than the second power-source voltage on the negative side to the driver:
in a reset duration before the first duration, while setting the enable signal to be inactive to hold the level determination part in a non-operational state and turning off the first switch through the first signal that is inactive, the voltage supply part sets the first and second nodes to be the second power-source potential or the first power-source potential for resetting by turning on the second and fifth switches through the second and fifth signals that are active and turning off the fourth switch through the fourth signal that is inactive; and
in the first duration, the voltage supply part sets the enable signal to be active to hold the level determination part in an operational state and turns on the first switch through the first signal that is active.

21. An electronic apparatus comprising:
a solid-state imaging device; and
an optical system through which an object image is formed on the solid-state imaging device, wherein
the solid-state imaging device includes:
a pixel part in which a plurality of pixels are disposed in a matrix; and
a reading part configured to read pixel signals from the pixel part in units of one or more rows by applying, to a control signal line, a drive control signal at a predetermined level in accordance with a control signal,
wherein the reading part includes:
a driver configured to apply the drive control signal at a voltage level supplied upon reception of the control signal to the control signal line corresponding to the driver;
a voltage supply part configured to supply a voltage different from a first power-source voltage or a voltage different from a second power-source voltage to the driver,
wherein the voltage supply part includes:
a first node;
a second node;
a capacitor including a first electrode and a second electrode, the first electrode being connected with the first node, the second electrode being connected with the second node;
a first power-source potential;
a second power-source potential;
a first switch configured to selectively connect between the first power-source potential and the first node or the second node in accordance with a first signal;
a second switch configured to selectively connect between the second power-source potential and the second node or the first node in accordance with a second signal; and
at least one of a third switch and a fourth switch, the third switch being configured to selectively connect between the first power-source potential and the second node in accordance with a third signal, the fourth switch being configured to selectively connect between the second power-source potential and the first node in accordance with a fourth signal,
wherein when the voltage supply part includes the third switch, the first node is connected with a first power-source voltage terminal of the driver, and
wherein when the voltage supply part includes the fourth switch, the second node is connected with a second power-source voltage terminal of the driver.

* * * * *